United States Patent
Ghia et al.

(10) Patent No.: US 7,142,033 B2
(45) Date of Patent: *Nov. 28, 2006

(54) DIFFERENTIAL CLOCKING SCHEME IN AN INTEGRATED CIRCUIT HAVING DIGITAL MULTIPLEXERS

(75) Inventors: Atul V. Ghia, San Jose, CA (US); Adebabay M. Bekele, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 7 days.

This patent is subject to a terminal disclaimer.

(21) Appl. No.: 10/837,388

(22) Filed: Apr. 30, 2004

(65) Prior Publication Data

US 2005/0242867 A1 Nov. 3, 2005

(51) Int. Cl.
*G06F 1/04* (2006.01)
*H03K 3/00* (2006.01)

(52) U.S. Cl. ............... 327/293; 327/296; 327/298; 326/41

(58) Field of Classification Search ............... None
See application file for complete search history.

(56) References Cited

U.S. PATENT DOCUMENTS

| | | | |
|---|---|---|---|
| 5,124,571 A | 6/1992 | Gillingham et al. | 327/258 |
| 5,164,619 A | 11/1992 | Luebs | |
| 5,391,942 A | 2/1995 | El-Ayat et al. | 326/39 |
| 5,394,443 A | 2/1995 | Byers et al. | |
| 5,397,943 A | 3/1995 | West et al. | 326/39 |
| 5,467,040 A | 11/1995 | Nelson et al. | 327/276 |
| 5,565,816 A | 10/1996 | Coteus | 331/2 |
| 5,742,180 A | 4/1998 | DeHon et al. | 326/40 |
| 5,850,157 A | 12/1998 | Zhu et al. | 327/295 |
| 5,907,248 A | 5/1999 | Bauer et al. | 326/39 |
| 5,917,340 A * | 6/1999 | Manohar et al. | 326/82 |
| 5,999,039 A | 12/1999 | Holst et al. | |
| 6,066,972 A | 5/2000 | Strom | 327/175 |
| 6,232,806 B1 | 5/2001 | Woeste et al. | 327/149 |
| 6,289,068 B1 | 9/2001 | Hassoun et al. | 375/376 |
| 6,310,495 B1 | 10/2001 | Zhang | 327/152 |
| 6,380,788 B1 | 4/2002 | Fan et al. | 327/295 |
| 6,421,801 B1 * | 7/2002 | Maddux et al. | 714/744 |
| 6,433,606 B1 | 8/2002 | Arai | 327/291 |
| 6,489,820 B1 | 12/2002 | Humphrey et al. | |
| 6,510,549 B1 | 1/2003 | Okamura | 716/17 |
| 6,633,191 B1 | 10/2003 | Hu | 327/323 |

(Continued)

FOREIGN PATENT DOCUMENTS

EP 1 363 210 A1 11/2003

(Continued)

OTHER PUBLICATIONS

U.S. Appl. No. 10/351,033, filed Jan. 24, 2003, Morrison et al.

(Continued)

*Primary Examiner*—Tuan T. Lam
(74) *Attorney, Agent, or Firm*—T. Lester Wallace; Kim Kanzaki

(57) ABSTRACT

A system for distributing a small signal differential signal to a circuit element. The system includes: a first converter configured to convert a first small signal differential signal to a first two phase full CMOS differential signal for input into the differential multiplexer; and a programmable driver circuit configured to boost an output current of the programmable driver circuit at selected frequencies and to convert two phase full CMOS differential signal outputs of the differential multiplexer to a second small signal differential signal.

20 Claims, 32 Drawing Sheets

U.S. PATENT DOCUMENTS

| | | |
|---|---|---|
| 6,650,141 B1 | 11/2003 | Agrawal et al. ............... 326/41 |
| 6,651,237 B1 | 11/2003 | Cooke et al. ................. 716/13 |
| 6,657,474 B1 | 12/2003 | Varadarajan ................ 327/291 |
| 2001/0033188 A1 | 10/2001 | Aung et al. ................. 327/141 |
| 2003/0062949 A1 | 4/2003 | Suzuki ....................... 327/564 |

FOREIGN PATENT DOCUMENTS

| | | | |
|---|---|---|---|
| JP | | 2001 056721 A | 2/2001 |

OTHER PUBLICATIONS

U.S. Appl. No. 10/436,781, filed May 12, 2003, Kaviani et al.
U.S. Appl. No. 10/453,235, filed Jun. 12, 2003, Vadi et al.
U.S. Appl. No. 10/618,404, filed Jul. 11, 2003, Young.
U.S. Appl. No. 10/683,944, filed Oct. 10, 2003, Young.
U.S. Appl. No. 10/769,205, filed Jan. 29, 2004, Logue et al.
U.S. Appl. No. 10/792,055, filed Mar. 2, 2004, Wei.
U.S. Appl. No. 10/836,722, filed Apr. 30, 2004, Vadi et al.
U.S. Appl. No. 10/837,009, filed Apr. 30, 2004, Vadi et al.
U.S. Appl. No. 10/837,329, filed Apr. 30, 2004, Vadi et al.
Philips; "High-performance PECL Clock Distribution Family"; PCK111/PCK210/PCKEL14/PCKEP14; Oct. 2002; pp. 2.
Jim Lipman; "Growing Your Own IC Clock Tree"; EDN Access for Design, By Design; Mar. 14, 1997; downloaded from http://www.e-insite.net/ednmag/archives/1997/031497/06CS.htm; pp. 1-10.

* cited by examiner

DIFFERENTIAL CLOCKING SCHEME IN AN INTEGRATED CIRCUIT HAVING DIGITAL MULTIPLEXERS

FIELD OF THE INVENTION

The present invention relates generally to clock circuitry on an integrated circuit (IC) and more specifically, a clock network on an IC having, at least in part, a differential clock tree.

BACKGROUND

In the design of a clock-distribution network, or "clock tree," for an integrated circuit (IC) such as application specific integrated circuit (ASIC) or a Programmable Logic Device (PLD) some of the major considerations are skew, jitter, delay, duty cycle distortion and power consumption. Various clock tree geometries such as the balanced tree (e.g., the H clock tree) and grid have been used. The H clock tree, in some cases, can provide low clock skew.

In addition to clock tree geometry, a clock tree may be differential, i.e., provide a differential clock signal using differential circuits, or may be single-ended, i.e., a single clock signal using the conventional Complementary Metal Oxide Semiconductor (CMOS) circuits. A single-ended clock tree is typically noisy and prone to duty cycle distortion at high frequencies, but has only dynamic power consumption. On the other hand, while a differential clock tree has good noise immunity and low duty cycle distortion, it consumes static power due to a common mode.

Traditionally, a PLD has used a single ended clock tree. A PLD, for example, a Field Programmable Gate Array (FPGA) such as the Virtex™-II from Xilinx Inc. of San Jose, Calif., receives a single ended clock or differential signal via the ring of IOBs on the perimeter of the FPGA and transfers this clock signal to configurable logic blocks (CLBs) via the single ended clock tree.

As clock speeds for ICs increase, there is a need for a low noise clock such as a differential clock; however, the single ended clock still has advantages, such as lower static power consumption. Therefore there is a need for a better clock-distribution network for ICs and in particular PLDs that better balances low noise and low power consumption.

SUMMARY

The present invention relates generally to a method and system for an improved clock network for ICs and in particular to an IC having at least in part a differential clock tree. In an exemplary embodiment of the present invention, a hybrid clock tree includes a clock tree backbone and primary branches that are differential and clock tree leaf nodes that are single-ended or differential or both. The hybrid clock tree further includes switches that couple the clock tree backbone to the clock tree's primary branches.

In one embodiment of the present invention, the clock tree backbone and primary branches have small signal differential clock signals, where small signal differential signals have lower voltage swings than full voltage (rail-to-rail) swings. Small differential voltage swings typically have less sensitivity to supply voltage noise and consume less dynamic power than rail-to-rail differential voltage swings. However, small signal differential clock circuits are more costly than either rail-to-rail differential or single ended clock circuits. And also while small signal or rail-to-rail differential signals have less noise than single ended signals, they consume more static power.

Thus, in the above embodiment, the clock tree backbone and primary branches are small signal differential to provide for a low noise clock at high clock speeds, but the components at the leaf nodes of the clock tree are either rail-to-rail differential or single ended for cost and static power reasons. For a few select differential components on the IC that need a low skew and low jitter clock, the small signal differential clock signals from the primary branches of the clock tree are converted to rail-to-rail differential clock signals for use by these select differential components. And for the majority of components on the IC, single-ended CMOS clock signals derived from the small signal differential clock signals of the primary branches of the clock tree are provided to these majority components in order to conserve power and area.

In another embodiment of the present invention a columnar architecture including a plurality of homogeneous columns spanning the IC from edge to edge, no perimeter ring of IOBs, and having one centrally located heterogeneous column, includes the hybrid clock tree as its clock distribution network. The hybrid clock tree has a balanced tree geometry, with the clock tree backbone or main trunk being small signal differential, i.e., providing a small signal differential clock signal and positioned in parallel with the heterogeneous column. A plurality of horizontal clock rows branch off from the main trunk to provide a differential clock signal to the plurality of homogeneous columns. From one or more horizontal clock rows further branches lead to leaf nodes supplying one or more differential clock signals, one or more single-ended clock signals or both, to one or more circuit elements or blocks within one or more homogeneous columns. One or more external differential clock signals are supplied to the main trunk via a full connected or nearly fully connected cross bar switch. In one aspect of the present invention, the cross bar switch includes one or more multiplexers. In another aspect the one or more multiplexers are two phase full CMOS (i.e., rail-to-rail) differential multiplexers.

An embodiment of the present invention includes a system in an integrated circuit (IC) for distributing a small signal differential signal to a circuit element via a differential multiplexer that uses a two phase full complementary metal oxide semiconductor (CMOS) differential signal. The system includes: a first converter configured to convert a first small signal differential signal to a first two phase full CMOS differential signal for input into the differential multiplexer; and a programmable driver circuit configured to boost an output current of the programmable driver circuit at selected frequencies and to convert a two phase full CMOS differential signal output of the differential multiplexer to a second small signal differential signal.

Another embodiment of the present invention includes a clock distribution network in a program logic device (PLD) having: a first clock signal line having a first small signal differential clock signal; a converter circuit configured to convert the first small signal differential clock signal to a first rail-to-rail differential clock signal; a differential multiplexer inputting the first rail-to-rail differential clock signal and outputting a second rail-to-rail differential clock signal; and a programmable driver configured to convert the second rail-to-rail differential clock signal to a second small signal differential clock signal.

The present invention will be more full understood in view of the following description and drawings.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items, however, in alternative embodiments the items may be different.

Columnar Architecture

Figure 1:
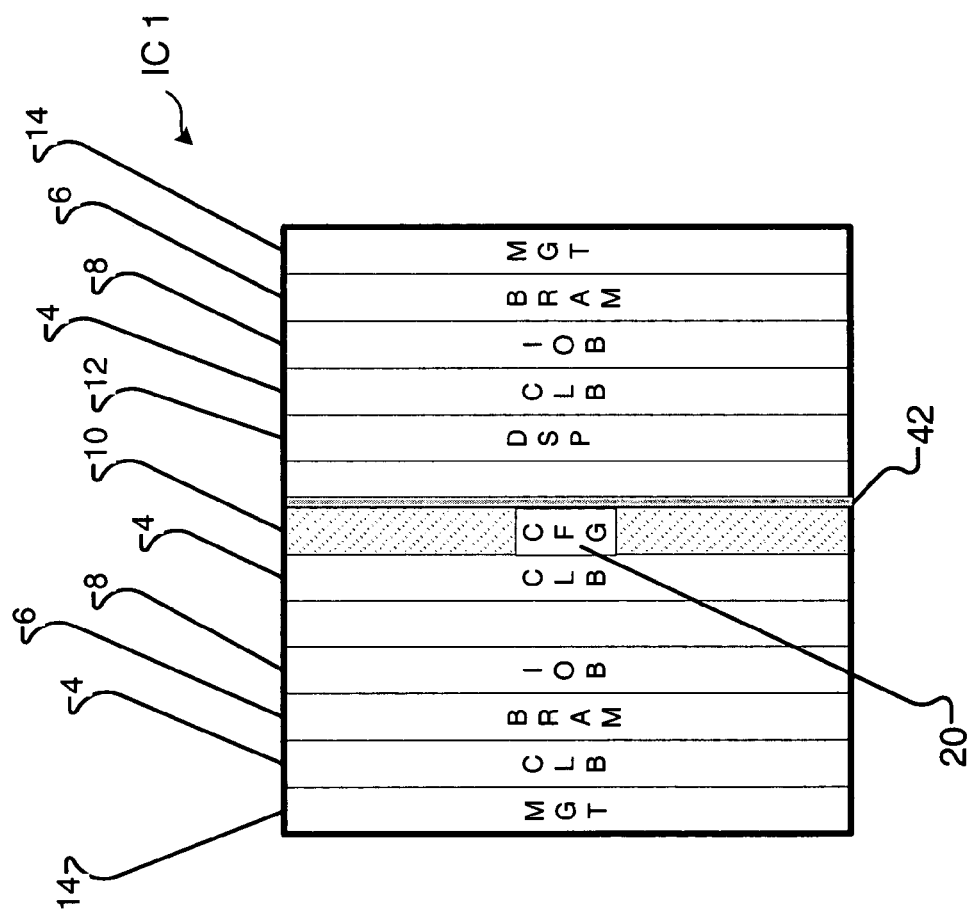
FIG. 1 is a simplified diagram of an IC in accordance with one embodiment of the present invention.

FIG. 1 is a simplified diagram of an IC 1 in accordance with one embodiment of the present invention. The IC 1 includes two or more homogeneous columns, wherein each of the homogeneous columns starts at one side of the IC 1 and ends at an opposite side of the IC 1. Each homogeneous column has substantially identical circuit blocks or elements substantially filling the column. The substantially identical circuit blocks or elements in a column are of a particular circuit type from a group of circuit types that includes a Configurable Logic Block (CLB) type, a Multi-Gigabit Transceiver (MGT) type, a Block Random Access Memory (BRAM) type, a processor type, a Digital Signal Processor (DSP) type, a multiplier circuit type, an arithmetic circuit type, an Input/Output Interconnect (IOI) circuit type, an Input/Output Block (IOB) type, an arithmetic logic unit (ALU) type, an image processing type, a graphic processing type, a video/audio processing type, a non-volatile memory type, and an application specific circuit type. For example, a Configurable Logic Block (CLB) circuit type, has identical circuit elements, in this example, CLB tiles, substantially filling the column (i.e., except for maybe, for example, a few spacer and clock tiles, substantially all of the layout area in the column is occupied by aligned CLB tiles). Examples of some of the circuit elements and circuit types may be found in the Virtex™-II Platform FPGA Handbook by Xilinx Inc. of San Jose Calif. (Dec. 3, 2001).

IC 1 includes homogeneous columns 4 of a CLB column type, homogeneous columns 6 of a BRAM column type, homogeneous columns 8 of an␣IOB column type, homogeneous column 12 of a DSP column type, and homogeneous columns 14 of a MGT column type. There is a heterogeneous column 10 (center column) that may have circuit elements or blocks of different circuit types. While the circuitry of the IC 1 may include circuits having programmable functions coupled together by programmable interconnects, the scope of the present invention is not so limited, but includes any IC having a plurality of homogeneous columns of a plurality of column types, where each column type is a column that is substantially filled with circuit elements of the same type. Thus, while an FPGA may be described in certain embodiments, this is for illustration purposes, and the present invention is not limited in scope to FPGAS.

Figure 2A:
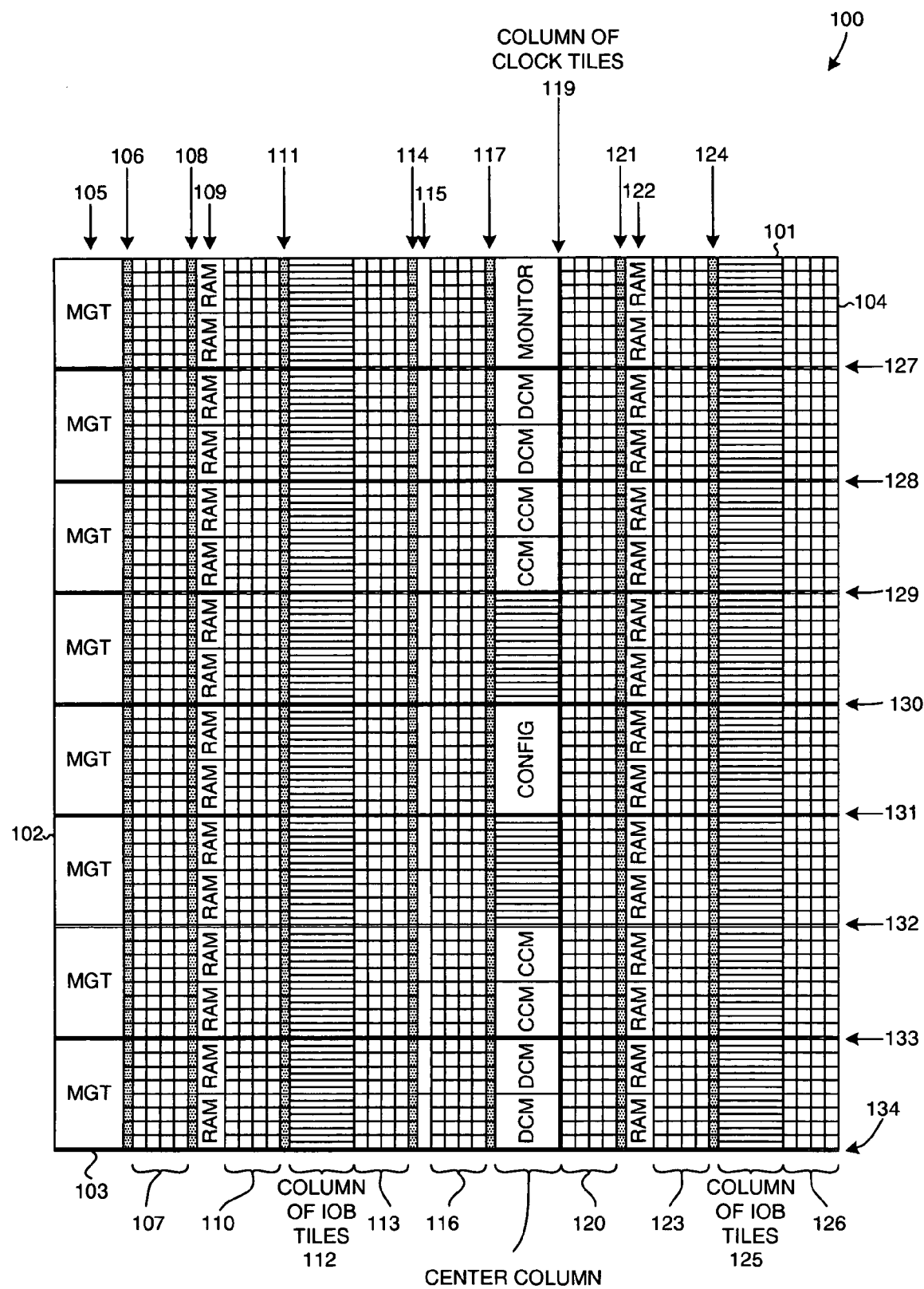
FIG. 2A is a simplified diagram of a field programmable gate array (FPGA) in accordance with an embodiment of the present invention.

FIG. 2A is a simplified diagram of a field programmable gate array (FPGA) 100 in accordance with an embodiment of the present invention. FPGA 100 is rectangular and has four sides 101–104. The circuitry of the FPGA 100 is laid out as a plurality of columns of repeatable circuit blocks. Proceeding from the left side 102 of FPGA 100 to the right side 104 of FPGA 100, there is a column of identical multi-gigabit transceiver (MGT) blocks 105, a column of input/output interconnect (IOI) blocks 106, four columns of configurable logic blocks (CLBs) 107, a column of IOI blocks 108, a column of block random access memory (BRAM) blocks 109, four columns of CLBs 110, a column of IOI blocks 111, a column of input/output blocks (IOBs) 112, four columns of CLBs 113, a column of IOI blocks 114, a column of digital signal processing (DSP) blocks 115, four columns of CLBs 116, a column of IOI blocks 117, a center column 118 made up of multiple different types of blocks, the differential clock tree backbone 119, four columns of CLBs 120, a column of IOI blocks 121, a column of BRAM blocks 122, four columns of CLBs 123, a column of IOI blocks 124, a column of IOB blocks 125, and four columns of CLBs 126.

Note that the area of each of the columns of blocks but for the center column 118 is occupied primarily by a single type of block. There are horizontally extending narrow clock distribution blocks.

The clock distribution blocks within each column line up with the clock distribution blocks in each of the other columns such that a horizontally extending clock distribution structure is formed that extends all the way across the die from left side 102 to right side 104. The horizontally extending clock distribution structures (i.e., HCLK rows) are indicated in FIG. 2A with reference numerals 127–134.

In one view of FIG. 2A there are 16 CLBs between each of the main horizontal branches of the clock tree, i.e., HCLK rows 127–134. In another view of the HCLK rows, there are 8 CLBs above and 8 CLBs below a HCLK row.

Further details concerning FIGS. 1 and 2A above are described in co-pending U.S. patent application Ser. No. 10/618,404 filed Jul. 11, 2003 titled "Columnar Floorplan", by Steven P. Young, and U.S. patent application Ser. No. 10/683,944 filed Oct. 10, 2003 titled "Columnar Architecture", by Steven P. Young, both of which are herein incorporated by reference.

Figure 2B:
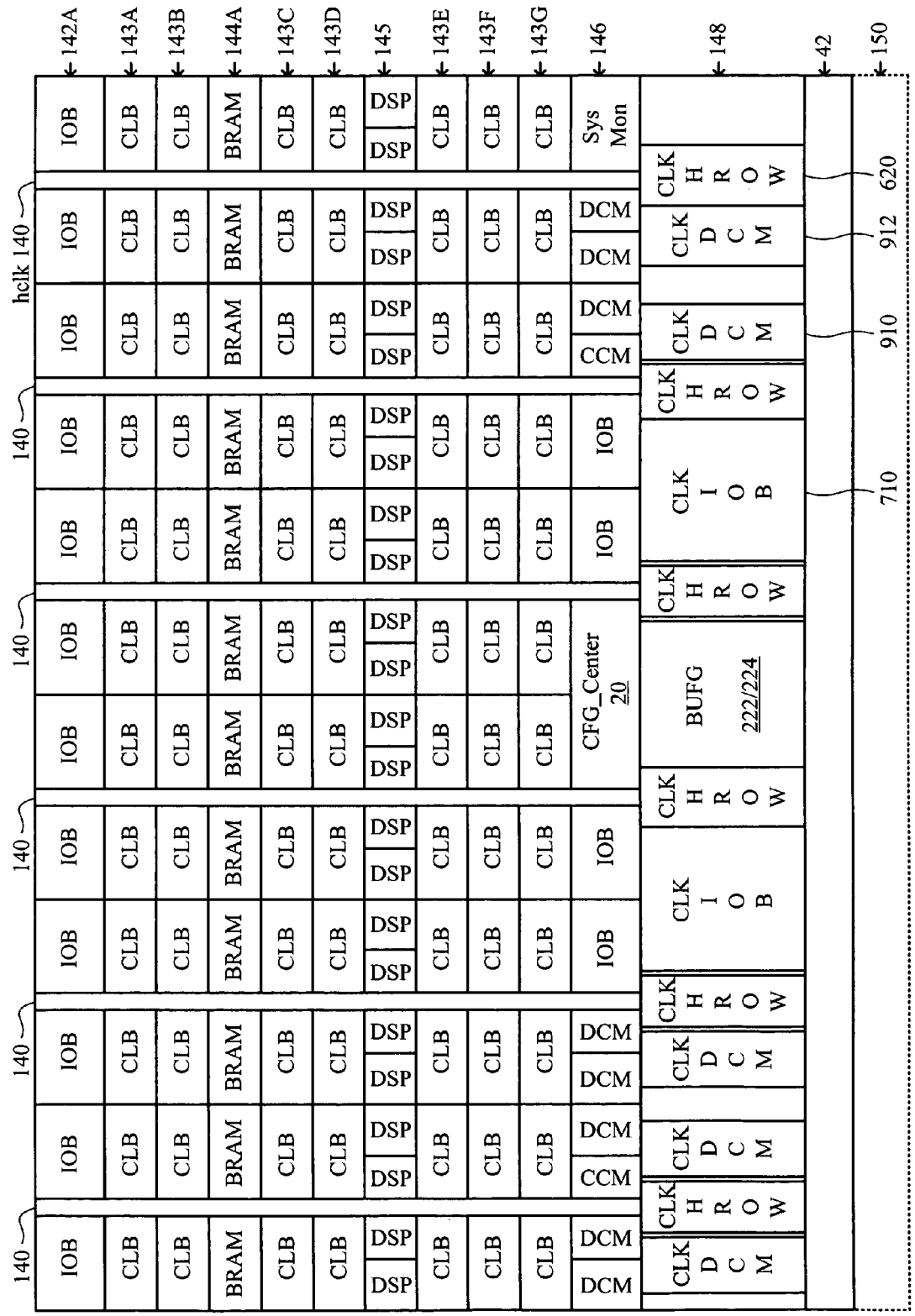
FIGS. 2B and 2C are simplified diagrams of a portion of a field programmable gate array in accordance with another embodiment of the present invention.
Figure 2C:
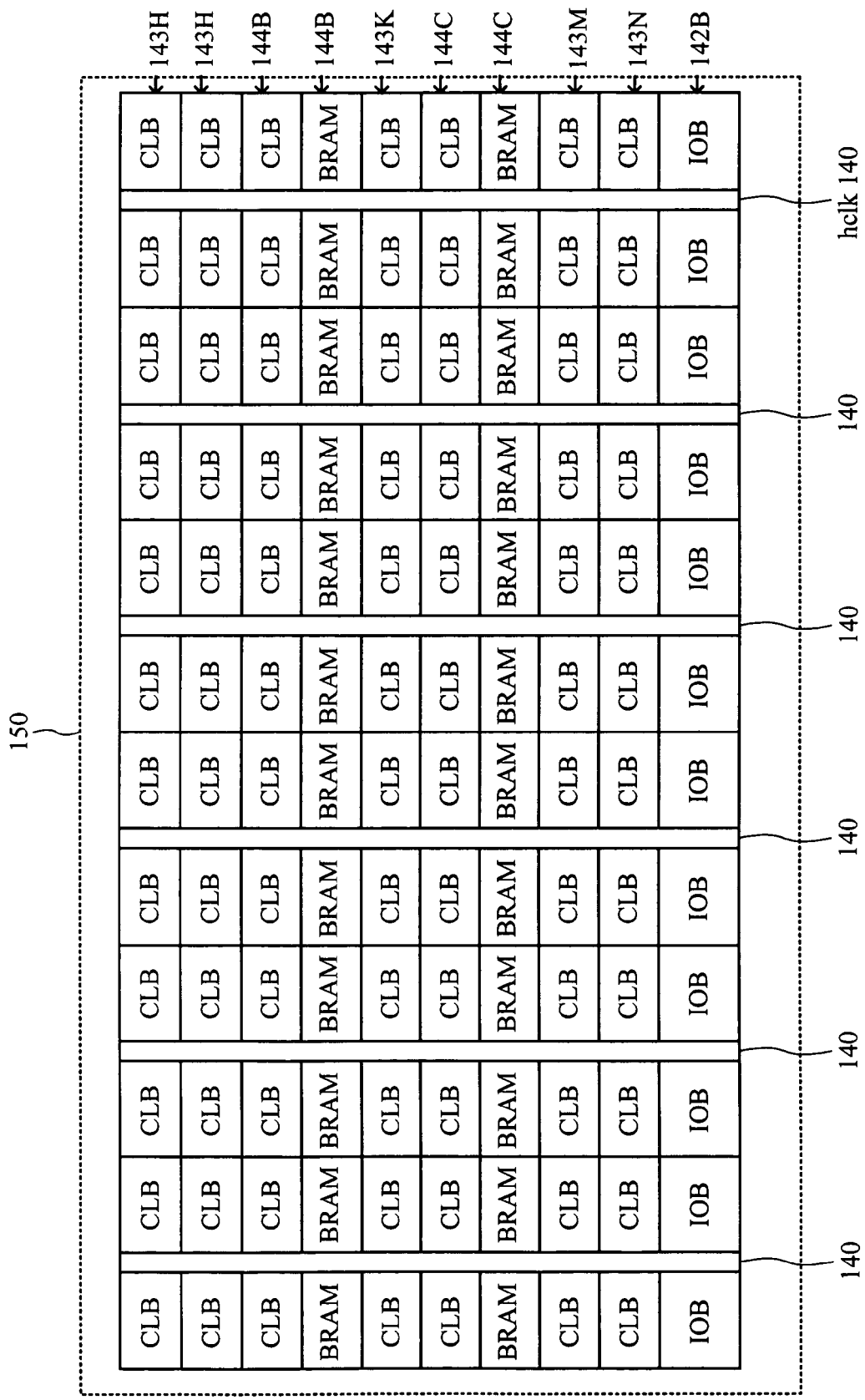

FIGS. 2B and 2C are simplified diagrams of a portion of a field programmable gate array in accordance with another embodiment of the present invention. FIG. 2B shows a block diagram of elements of the FPGA with block 150 being shown in further detail in FIG. 2C. Note that the diagrams in FIGS. 2B and 2C are not to scale and that column 148 has been expanded to show the details.

In FIGS. 2B and 2C the horizontal hclk rows of the Clock tree are shaded in gray and labeled by 140. Note that the term's row and column are for explanation purposes only and can be interchanged. The hclk rows are coupled to the backbone or main trunk 42 (gclk) of the clock tree (also shaded in gray). In one embodiment the clock tree is a balanced clock tree such as an H clock tree. In another embodiment the clock tree is a modified H-clock tree. In yet another embodiment any other clock tree geometry as commonly known in the art is used. There are 32 gclk signal lines in the backbone (gclk column 42) which are coupled to a plurality of 32×16 full crossbar switches (not shown). Each of these 32×16 full crossbar switches provides 16 (8 left and 8 right) signal lines for each hclk row 140. Columns 142A (FIG. 2B) and 142B (FIG. 2C) each have 12 IOB groups, where from FIG. 3 each IOB group has 8 IOB pairs (or 16 IOBs). Columns 143A–143N each have 12 CLB groups, where from FIG. 3 each CLB group has 8 CLBs. Columns 144A–144C each have 12 BRAM groups, where from FIG. 3 each BRAM group has 2 BRAMS.

Column 146 in FIG. 2B is the center column 10 of FIG. 1 and includes a plurality of heterogeneous elements, such as (from left to right) a System Monitor (Sys Mon) block, 3 DCM blocks, a CCM block, 2 IOBs, a CFG_center 20, 2 IOBs, a CCM block, and 5 DCM blocks. Column 148 is adjacent to column 146 and has the circuit blocks which interface the hclk rows 140 and the blocks in column 146 to the global clock tree backbone 42 (gclk). Some of the interface circuit block in column 148 are labeled with number that refer to other figures to give examples of those blocks. For example, CLK_HROW 620 refers to CLK_HROW 620 in FIG. 6A, CLK_IOB 710 refers to CLK_IOB 710 in FIG. 7A, CLK_DCM 912 and 910 refer to CLK_DCM 912 and 910 in FIG. 9, and BUFG_MUX 222/224 (labeled in the figure as BUFG 222/224) refers to BUFG_MUX 222 and BUFG_MUX 224 in FIG. 11A (except 222 and 224 are vertically stacked in FIG. 2B rather than side by side as shown in FIG. 11).

Figure 3:
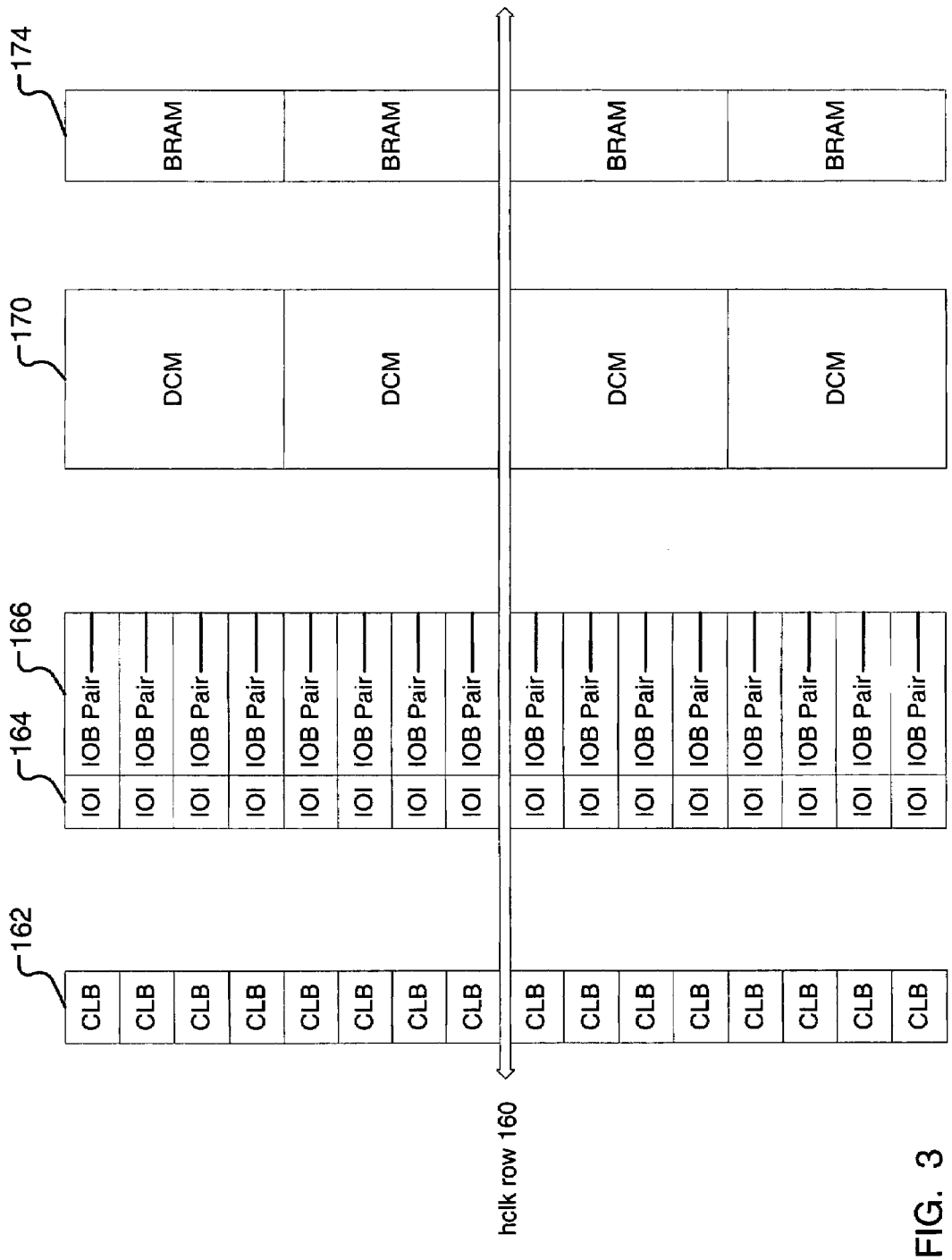
FIG. 3 shows the relationships between a HCLK row and selected FPGA circuit blocks of an embodiment of the present invention.

FIG. 3 shows the relationships between a HCLK row and selected FPGA circuit blocks of an embodiment of the present invention. The HCLK row 160 substantially divides in half the column of CLBs 162, the column of IOI blocks 164, the column of IOB pairs 166, the column of IOI blocks 168, the column of DCM blocks 170, the column of IOI Blocks 172, and the column of block RAMs (BRAMS) 174. The HCLK row 160 supplies the clock signals from the differential clock tree backbone to the circuit blocks or elements in the top and bottom half of each of the columns 162–174. In FIG. 3 each IOI block in column 164 is one CLB tall. Each IOI block in column 164 has associated with it two IOBs in column 166, i.e., an IOB pair. A DCM in column 170 is 4 CLBs high and a BRAM in column 174 is 4 CLBs high.

Figure 4A:
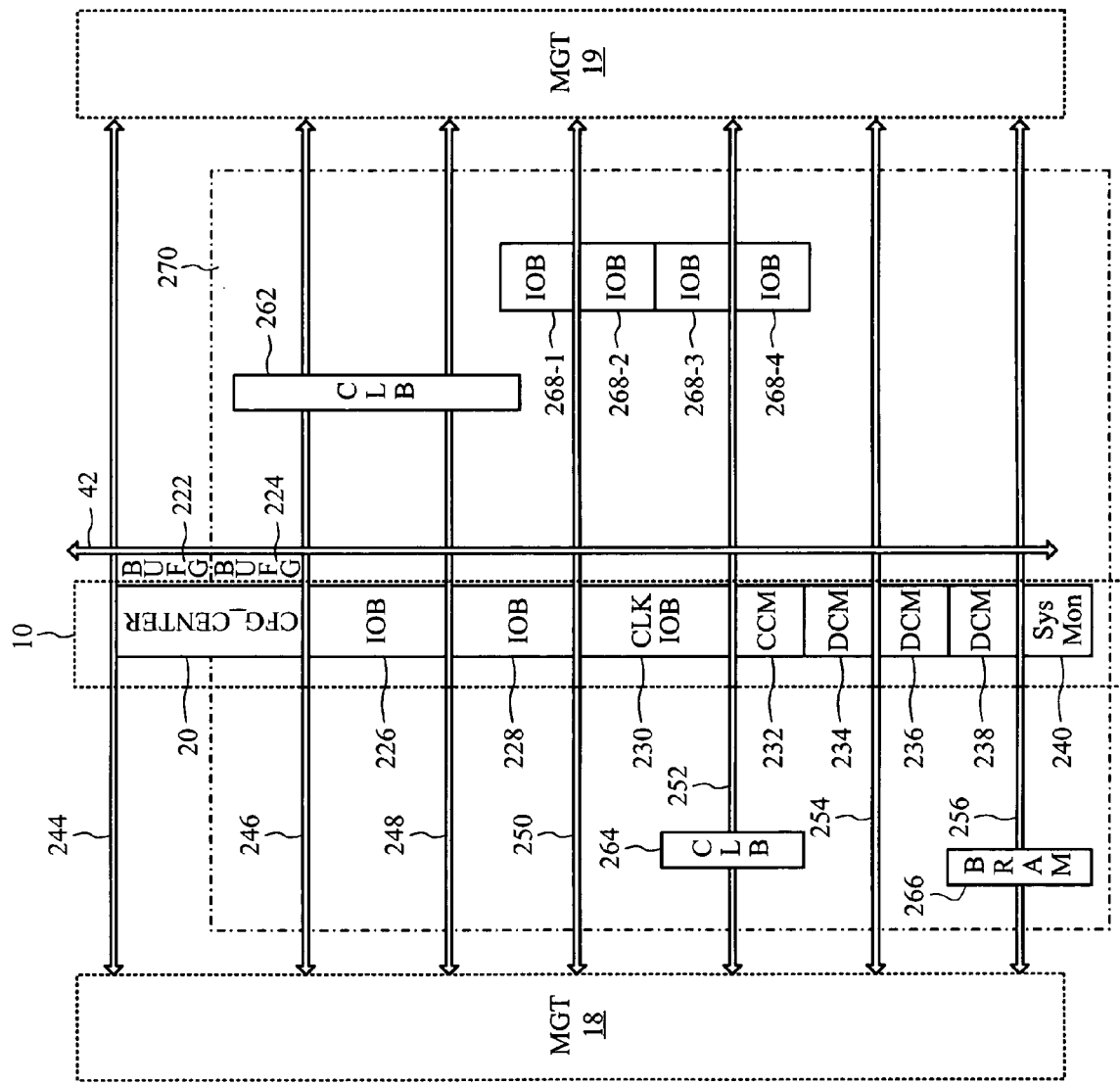
FIG. 4A is a simplified diagram of the a clock tree and the center column on the bottom half of the die of an embodiment of the present invention.

FIG. 4A is a simplified diagram of the clock tree and the center column on the bottom half of the die of an embodiment of the present invention. For ease of illustration FIG. 4A only shows the bottom half of the FPGA. The top half is similar to the bottom half (minus the CFG_CENTER 20 and BUFGs 222 and 224). The Clock tree has a main trunk or backbone 42 and main horizontal branches, i.e., HCLK rows 244, 246, 248, 250, 252, 254, and 256. Both the main trunk 42 and main horizontal branches 244–256 provide global differential clocks signals to circuits in, for example, the center column 10 and MGT blocks 18 and 19. For CLBs 262 and 264, IOBs 268-1 to 268-4, and BRAMs 266 the differential clock signal is converted into a single ended clock signal. Some circuit blocks such as the DCMs 234–238, CCM 232, and System Monitor (SysMon) 240 may receive both differential and single ended clock signals.

The center column 10 has heterogeneous circuit elements or blocks such as the configuration logic (CFG_CENTER 20), IOBs 226 and 228, specialized clock IOBs (CLK 10B

230) for receiving one or more external single ended or differential clock signals, CCM 232, DCMs 234–238, and System Monitor 240.

Adjacent to CFG_CENTER 20 there are two circuits BUFG_MUXs (labeled as BUFG) 222 and 224 having multiplexer circuitry, that provide differential clock signals from the specialized clock IOBs, e.g., CLK IOB 230 and/or the DCMs, e.g., DCMs 234–238, and optionally, the MGTs 18–19 to the clock tree backbone 42. BUFG_MUX 222 includes 16 identical circuits, i.e., bufg_mux[16:31], and receives the differential clock signals from the specialized clock IOBs, DCMs, and optionally, the MGTs 18–19 on the top half of the FPGA (not shown). BUFG_MUX 224 includes 16 identical circuits, i.e., bufg_mux[0:15], and receives the differential clock signals from the specialized clock IOBs, e.g., CLK IOB 230, the DCMs, e.g., DCMs 234–238, and optionally, the MGTs 18–19 on the bottom half of the FPGA. In one embodiment BUFG_MUX 224 is located on top of BUFG_MUX 222 and there is effectively only one BUFG_MUX block with 32 identical circuits, bufg_mux[0:31].

Figure 4B:
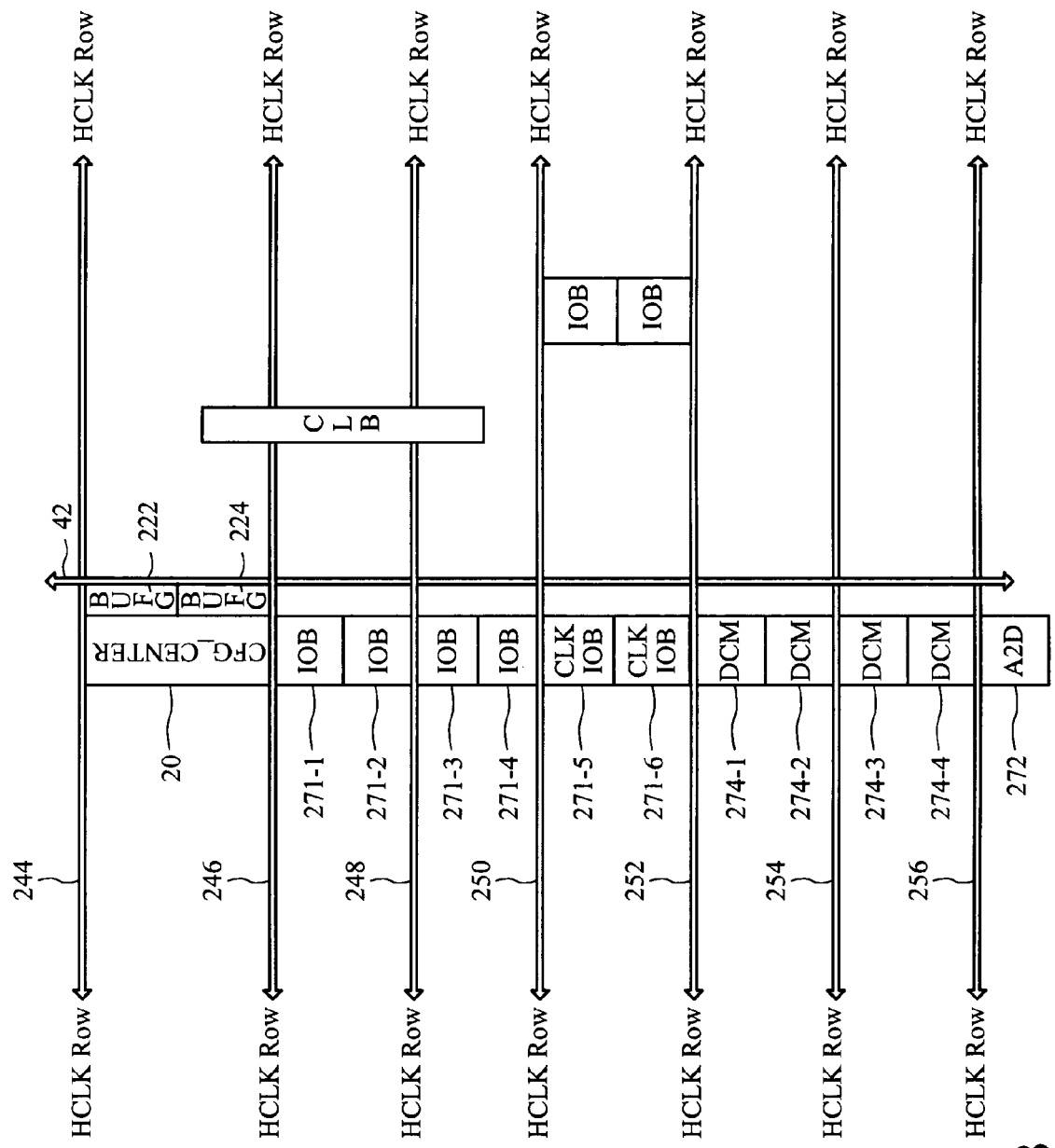
FIG. 4B is a simplified diagram of the clock tree and the center column on the bottom half of the die of another embodiment of the present invention.

FIG. 4B is a simplified diagram of the clock tree and the center column 10 on the bottom half of the die of another embodiment of the present invention. The CFG_CENTER block 20 is located in the middle of the central vertical spine of the chip. Above and below CFG_CENTER block 20 are 6 IOB groups 271-1 to 271-6, each group having 16 IOBs (8 IOB pairs) with a height of 8 CLBs (see FIG. 3). For example, with reference to FIG. 3, HCLK row 248 provides the clocks for the 8 IOB pairs in IOB group 271-2 and the 8 IOB pairs in IOB group 271-3. In both halves of the chip the 6 IOB groups may be followed by one or more DCMs, e.g., 274-1 to 274-4 and sometimes CCMs or A2Ds, e.g., 272. Each DCM is the height of 4 CLBs (Each of the DCM groups 274-1 to 274-4 have two DCM circuits, see FIG. 3). For example, with reference to FIG. 3, HCLK row 254 provides the clocks for the two DCMs in DCM group 274-2 and the two DCMs in DCM group 274-3. In an embodiment, the DCMS, A2Ds (analog-to-digital converters), and CCMs are substantially interchangeable and one may be substituted for another as needed.

The CCM includes a digital performance monitor where further details are disclosed in co-pending U.S. patent application Ser. No. 10/351,033 filed Jan. 24, 2003, entitled "Method and Apparatus for Clock Signal Performance Measurement," by Shawn K. Morrison, et. al., which is herein incorporated by reference. The CCM further includes a phase matched clock divider for dividing a clock by 2/4/8, in effect, a simplified version of the clock divider provided by the DCM.

Clock Tree

In one embodiment of the present invention a 1.2 volt small signal differential clock tree backbone (e.g., column 42 of FIGS. 1 and 2) provides one or more clocks signals to one or more homogeneous columns such as that shown in FIGS. 1–4A/B. A small signal differential signal has a voltage differential that is less than a rail-to-rail voltage differential. A set of 16 IOBs in each half of the FPGA are used as clock input IOBs. The input clock signals are sent via a plurality of cascaded two phase full CMOS (i.e., rail to rail) multiplexers implemented in full cross bar fashion to 32 BUFG_MUX circuits located in the center of the FPGA (e.g., 16 BUFG_MUX circuits in BUFG_MUX block 222 and 16 BUFG_MUX circuits in BUFG_MUX block 224 of FIGS. 4A and 4B). The 32 BUFG_MUX circuits provide upto 32 global clock signals (gclk) to the backbone of the differential clock tree 42. A clock distribution network having horizontal clock rows is provided, where each clock row has 8 small signal differential clock signals. These 8 differential clock signals can be used to provide 8 single ended clock signals at some leaf nodes of the balanced clock tree.

More specifically, the specialized clock input IOBs (herein referred to as Clock IOBs) are located near the DCMs in the center column, and allow differential clock sources as inputs into the IC at the board level. The clocks from the clock IOBs can either be directly routed to the 32 centrally located BUFG_MUX circuits in BUFG_MUX blocks 222/224, or they can be routed to the DCMs, e.g., 274-1 to 274-4 (FIG. 4B), on the same half of the chip. From the DCMs the differential clock signals can be sent to the BUFG_MUXs 222/224. Clocks from the MGTs can also reach both the DCMs and the 32 BUFG_MUX circuits. The 16 BUFG_MUX circuits, e.g., BUFG_MUX block 224 for the bottom half of the chip, are driven by IOBs/DCMs/MGTs in the bottom half of the chip, and the 16 BUFG_MUX circuits, e.g., BUFG_MUX block 222, in the top half of the chip are driven by IOBs/DCMs/MGTs in the top half of the chip. The 32 global clocks (gclks) outputs of the 32 BUFG_MUX circuits in BUFG_MUX blocks 222/224 are routed up and down the entire backbone or main trunk to both the top and bottom halves of the chip.

These 32 vertical gclk signals feed horizontal row drivers that send 8 differential horizontal global clocks (hclks) along each HCLK row. This HCLK row supports, for example, 4 BRAM blocks, 16 CLBs, 16 IOIs, 16 IOB pairs, and 4 DCM blocks (see FIG. 3). The hclks are tapped in every column and converted to 8 single ended signals and sent up and down, for example, the top and bottom groups of 8 CLBs (see FIG. 3). In one embodiment the DCM has a differential clock multiplexer in order to receive a low skew differential clock signal. In another embodiment the DCM also has an additional single ended clock multiplexer in order to get differential clock inputs, as well as single ended clock inputs.

Figure 5A:
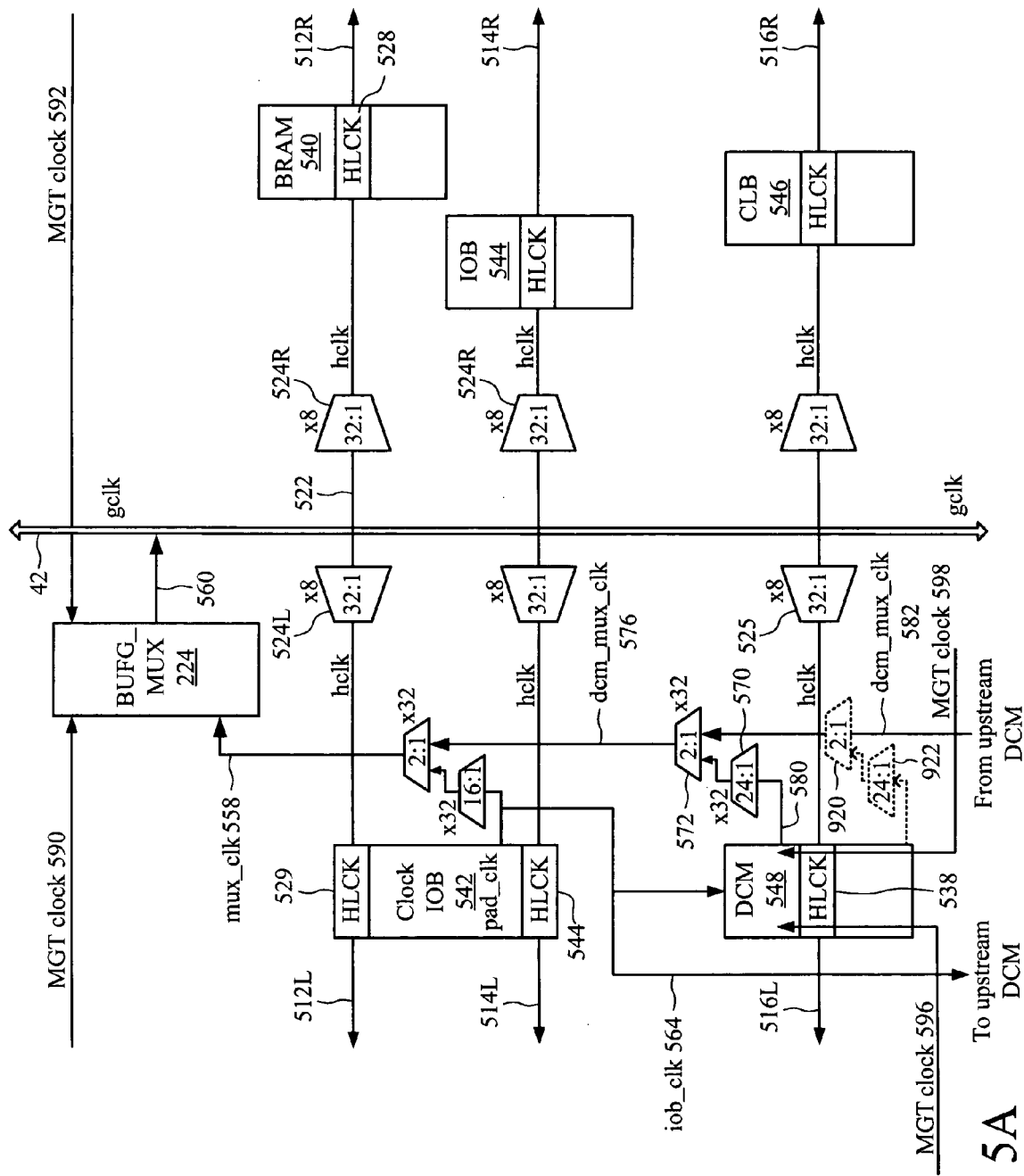
FIG. 5A is a simplified schematic of a differential clock tree for part of the bottom half of an FPGA of one embodiment of the present invention.

Because, in one embodiment, all the multiplexers have been implemented like a fully connected crossbar switch, any input signal can independently be routed to any desired output i.e., one route does not block another route. In one embodiment, one input can be connected to multiple outputs. Differential 2:1 multiplexers are provided to bypass larger differential multiplexers (e.g., 16:1 and 24:1 multiplexers) as is shown in FIG. 5A. This gives preferential treatment to those clock lines that are especially important or those that need to travel long distances while at the same time maintaining flexibility in the clock tree.

A disadvantage of using differential signaling is that the differential part of the clock tree burns static power. This static power dissipation is typically constant across frequency due to the nature of the drivers. Thus many, if not all, the drivers in the differential clock tree have a programmable power-down bit (e.g., pwr_down), and so entire branches of the clock tree can be substantially shut down when unused.

The total power dissipation of the clock tree also has a dynamic frequency dependent component ($f*C*VDD^2$). This is mainly from the differential to single ended clock converters and the inverters that drive the leaf global clock into each CLB and IOB. This frequency dependent component can also be reduced because the differential to single-ended converters can also be powered down when not used (see FIG. 17). When these differential to single-ended converters are powered down, the downstream leaf clocks do not toggle, and hence the corresponding inverters do not dissipate dynamic power.

FIG. 5A is a simplified schematic of a differential clock tree for part of the bottom half of an FPGA of one embodiment of the present invention. The backbone 42 of the clock tree has 32 global signal lines. These 32 global signal lines are distributed to the horizontal clock (hclk) rows 512L/R, 514L/R and 516L/R via a plurality of 32 to 1 (32:1) differential multiplexers. There are 8 clock signal lines per horizontal row. For example, the 32 global signal lines in the backbone 42 are sent to eight 32:1 differential multiplexers 524R. Thus any of the 8 clock signal lines in hclk row 512R can be independently connected to any one of the 32 global signal lines (gclk) in the backbone 42. The 8 clock signal lines in hclk row 512R are connected to an HLCK block in a group of elements, e.g., HLCK block 528 of BRAM 540, which distributes the clocks to the elements in the group (as shown in FIG. 3 BRAM 540 includes four BRAM elements in column 174). Similarly, hclk row 514R distributes one or more differential clocks to IOB 544, hclk row 516R distributes one or more differential clocks to CLB 546, hclk rows 512L and 514L distributes one or more differential clocks to Clock IOB 542, and hclk row 516L distributes one or more differential clocks to DCM 548.

In one embodiment of the present invention there are several sources for gclk. With reference to FIG. 4B, a first source is from one or more external clocks (single-ended or differential) supplied via one or more clock IOBs, e.g., CLK IOBs 271-5 and 271-6. A second source is from one or more DCMs, e.g., DCMs 274-1 to 274-4. Through a plurality of multiplexers (not shown in FIG. 4B) either the first source or second source of clocks is selected and sent to BUFG_MUX 224 for the clock IOBs and DCMs on the bottom half of the IC. Similarly, BUFG_MUX 222 receives the selection of the sources of clocks for the clock IOBs and DCMs on the top half of the IC. BUFG_MUX 222 supplies 16 of the 32 global clock signal lines in the backbone 42 and BUFG_MUX 224 supplies the other 16 global clock signal lines in the backbone 42.

With reference to FIG. 5A, clock IOB 542 may output via pad_clk up to 16 differential clock signals to 32 16:1 differential multiplexers 552. The 32 outputs of the 16:1 differential multiplexers 552 are the first inputs into 32 2:1 differential multiplexers 554. The second inputs into the 32 2:1 differential multiplexers 554 are from the outputs of the 32 2:1 differential multiplexers 572, i.e., dcm_mux_clk 576. The 32 16:1 multiplexers 552 allow any one of the 32 clock lines in mux_clk 558 to be independently connected to one or more of the 16 differential clock signals supplied by clock IOB 542. The 32 2:1 differential multiplexers 554 allow dcm_mux_clk 576 to be directly connected to mux_clk 558 thus bypassing the 16:1 multiplexers 552.

With further reference to FIG. 5A, two of the DCM circuits in DCM 548 may output up to 24 differential clock signals via signal lines 580 to 32 24:1 differential multiplexers 570. The 32 outputs of the 24:1 differential multiplexers 570 are the first inputs into the 32 2:1 differential multiplexers 572. The second inputs into the 32 2:1 differential multiplexers 572 are from dcm_mux_clk 582 which is produced by another DCM (not shown). The 32 24:1 multiplexers 570 allow any one of the 32 clock lines in dcm_mux_clk 576 to be independently connected to one or more of the 24 differential clock signals supplied by DCM 548. The 32 2:1 differential multiplexers 572 allow dcm_mux_clk 582 to be directly connected to dcm_mux_clk 582 thus bypassing the 24:1 multiplexers 570. In addition when 2:1 multiplexers 554 is set to select dcm_mux_clk 576, 2:1 multiplexers 572 allow dcm_mux_clk 582 to be connected to mux_clk 558. This allows a differential clock signal to pass through substantially less multiplexer circuitry via the bypass 2:1 multiplexers then if the differential clock signal had to pass through the larger multiplexers, e.g., the 24:1 multiplexers 570 or 16:1 multiplexers 552, implemented like fully connected crossbar switches.

As will be shown later in FIG. 9A, DCM 548 has 4 DCM circuits in one embodiment of the present invention, where each DCM circuit produces 12 differential clock signals. Thus DCM 548 in FIG. 5A has a second set of two DCM circuits sending a second set of 24 differential clock signals to 32 24:1 differential multiplexers 922 which are connected to 32 2:1 differential multiplexers 920. The 24:1 multiplexers 922 and 2:1 differential multiplexers 920 are shown in dotted lines and are not discussed further until FIG. 9, so as not to obscure the invention.

The 32 differential clock signals on mux_clk 588 are input into BUFG_MUX 224, which in turn outputs 16 differential clock signals to the gclk clock tree backbone. 8 differential clock signals on hclk row 516L are selected from the 32 gclk signals via the fully connected eight 32:1 differential multiplexers 525. The DCM 548 which also receives the upto 16 differential clock signals from clock IOB 542, i.e., $iob_{13}$ clk 564, can compare these iob_clk 564 clock signals with the 8 differential clock signals from differential multiplexers 525 in order to determine how much the external clock has skewed after propagating through the clock tree.

With reference to FIGS. 4A and 5A, multi-gigabit transceivers, e.g., MGT 18 and 19, may be on both ends of the clock tree. The MGTs operate in the gigahertz and above range and thus have a fast differential clock. This MGT clock(s) may be input into the clock tree backbone via MGT clocks 590 and 592 input into BUFG_MUX 224. Also MGT clocks 596 and 598 may be input into DCM 548.

Figure 5B:
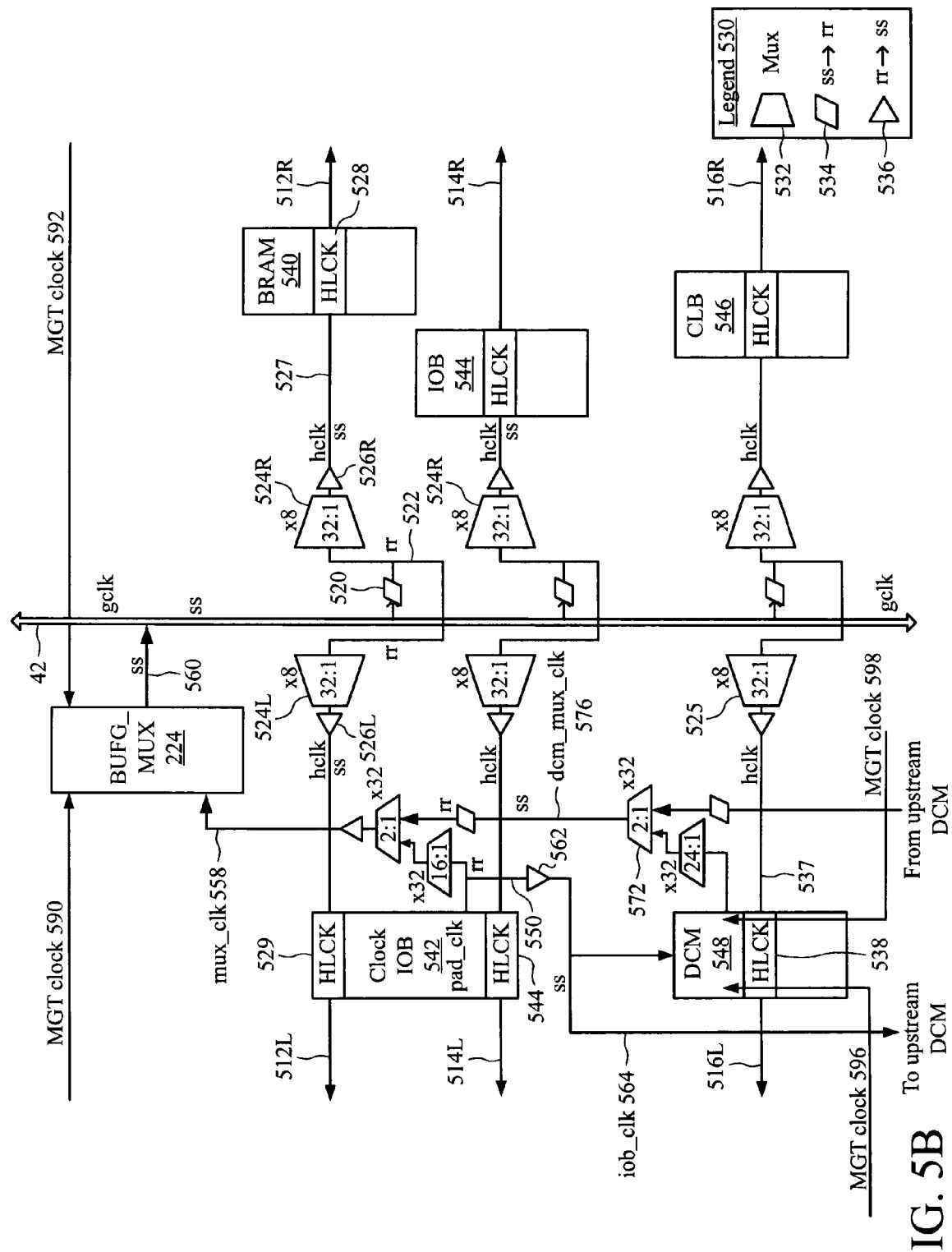
FIG. 5B is a simplified schematic of a differential clock tree for part of the bottom half of an FPGA of another embodiment of the present invention.

FIG. 5B is a simplified schematic of a differential clock tree for part of the bottom half of an FPGA of another embodiment of the present invention. FIG. 5B is similar to FIG. 5A with the addition of designating which differential clock lines are small signal differential, i.e. "ss", and which are two phase full CMOS (rail-to-rail), i.e. "rr", and also showing the appropriate conversion circuitry. From the legend 530, symbol 532 is one or more differential multiplexers, parallelogram symbol 534 is a differential small signal to a differential rail-to-rail converter, and, triangle symbol 536 is a driver converting a differential rail-to-rail signal to a differential small signal.

First, examining the distribution of the clocks from the backbone 42 of the clock tree to the FPGA components, the backbone 42 clock signals, i.e., gclk, and horizontal clock row signals, i.e., hclk, are differential small signals. However, the differential 32:1 multiplexers, e.g., 524L, 524R, connecting gclk to hclk use two phase full CMOS (i.e., rail-to-rail) signals. Thus there needs to be converters from small signal to rail-to-rail and vice versa.

In one alternative embodiment no converters for the differential signals are needed as either both the clock tree and multiplexers use rail-to-rail differential signaling or both the clock tree and the multiplexers use small signal differential signals. In this alternative embodiment differential to single ended converters are still needed. In yet another alternative embodiment, the clock tree is differential (small signal or rail-to-rail), but the multiplexers are single-ended and single ended to differential and differential to single ended converters are needed.

For example, for hclk 512R, the 32 global clock differential small signals (ss) of backbone 42 are converted to 32 rail-to-rail signals (rr) via 32 small signal to rail-to-rail (ss→rr) converters 520. The 32 rail-to-rail signals 522 are input to 8 32:1 differential multiplexers 524R. The selected 8 rail-to-rail signals from the 32 rail-to-rail signals 522 are input to 8 differential drivers 526R which also convert the 8 rail-to-rail signals to 8 differential small signals 527 (rr→ss). The 8 differential small signals 527 are input into an HCLK circuit 528 that has 8 differential small signal to single ended converters (ss→se) that covert the differential small signal clock signals to single-ended rail-to-rail clock signals for use by the 4 BRAMs (see FIG. 3) in BRAM 540.

Figure 6A:
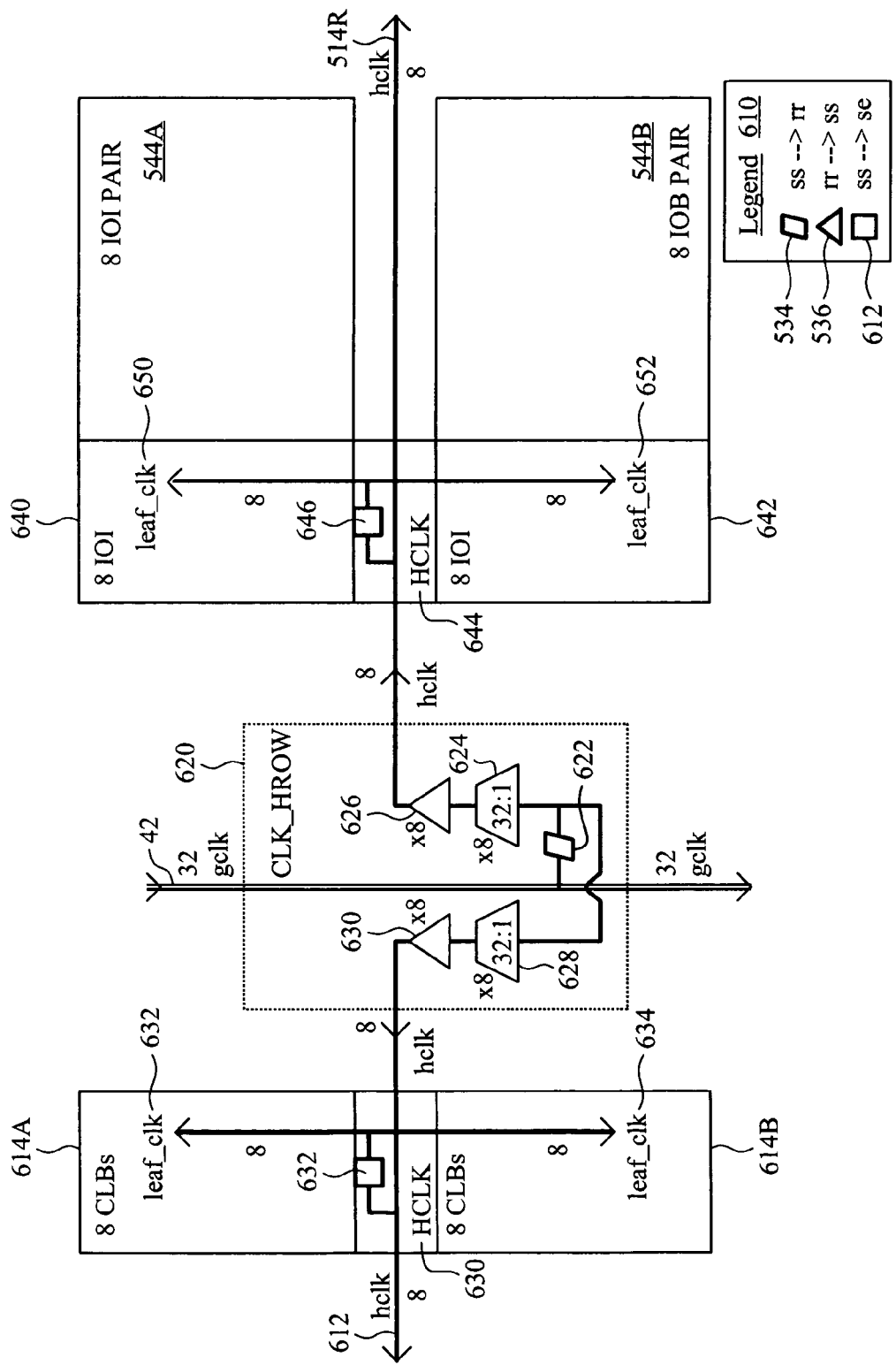
FIG. 6A is a schematic of one horizontal clock row of the clock tree supplying clocks to 16 CLBs and 16 IOB pairs of an aspect of the present invention.

Similarly for hclk 514R the 16 IOB pairs in IOB 544 are supplied 8 to single-ended rail-to-rail clock signals and similarly for hclk 516R the 16 CLBs in CLB 546 are supplied 8 to single-ended rail-to-rail clock signals (see FIG. 6A).

For hclk 516L the 4 DCMs in DCM 548 are supplied 8 single-ended rail-to-rail clock signals and in addition, 8 differential rail-to-rail clock signals via HLCK circuit 538 (see FIG. 9). The 8 differential rail-to-rail clock signals are generated from the 8 differential small signal clock signals 537 via 8 small signal to rail-to-rail (ss→rr) converters (not shown). Hence, in one embodiment the signal lines of the clock tree distributing the clock to the programmable function elements of the PLD, such as BRAM 540, 10B 544, CLB 546, clock 10B 542, and DCM 548 use small signal differential signals. Because the programmable function elements and the differential multiplexers, such as the 32:1 differential multiplexers, need rail-to-rail signals (differential or single-ended or both), there are three converters: ss→rr, rr→ss, and ss→se, where the rr→ss converters are also line drivers.

Figure 5C:
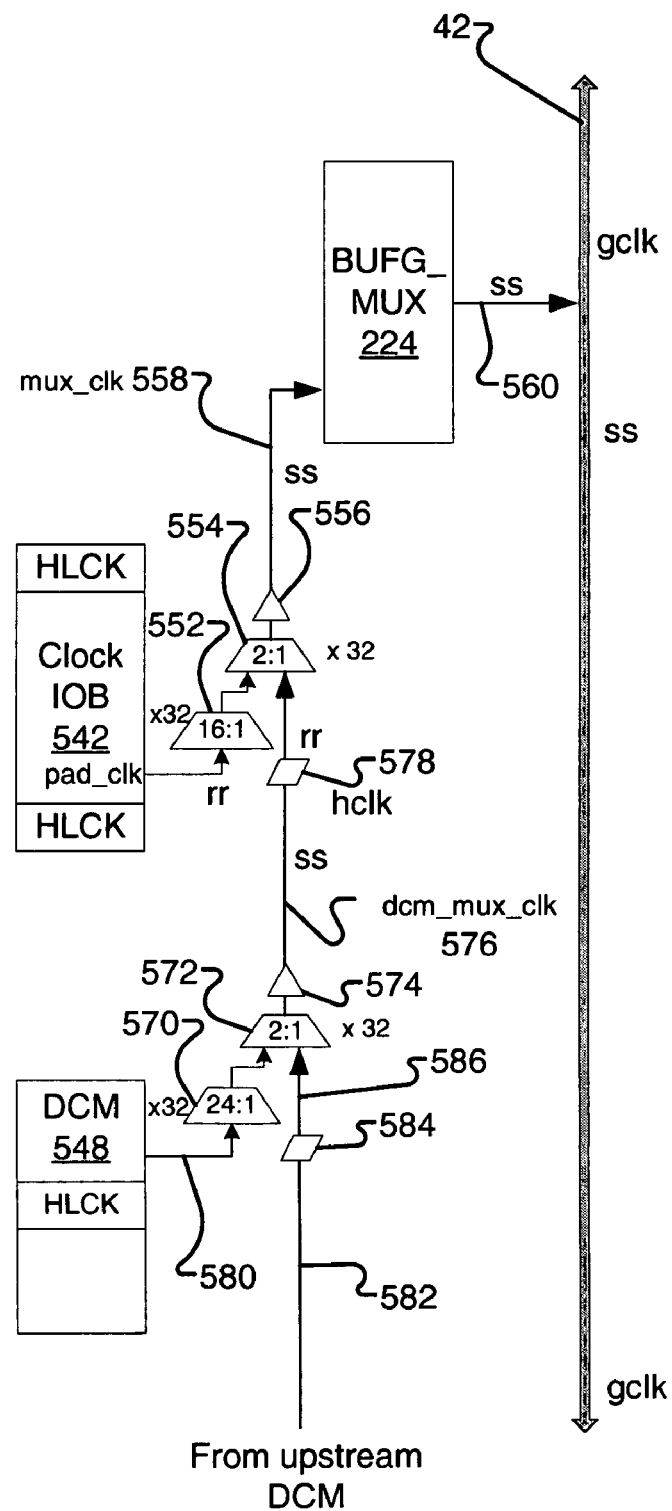
FIG. 5C shows the part of FIG. 5B that supplies one or more differential clocks to the clock tree backbone of an embodiment of the present invention.

FIG. 5C shows the part of FIG. 5B that supplies one or more differential clocks to the clock tree backbone 42 of an embodiment of the present invention. The programmable function elements such as Clock IOB 542 and DCM 548 supply rail-to-rail differential clock signals and the differential multiplexers, such as the 2:1 differential multiplexers 554/572 and the 16:1 differential multiplexers 552, and the 24:1 differential multiplexers 570, input and output rail-to-rail differential signals. BUFG_MUX 224 inputs 32 small signal differential clock signals, e.g., mux_clk 558, and outputs 16 small signal differential clock signals 560 to the main trunk or backbone 42. The 32 signal lines connecting the 32 2:1 differential multiplexers 554 and BUFG_MUX 224, i.e., mux_clk 558, the 32 signal lines connecting the 32 2:1 differential multiplexers 554 and 32 2:1 differential multiplexers 572, i.e., dcm_mux_clk 576, and the 32 signal lines connecting the 32 2:1 differential multiplexers 572 and upstream 32 2:1 differential multiplexers (not shown), i.e., dcm_mux_clk 582, carry small signal differential clock signals.

Thus there are ss→rr converters 584 and 578 to convert the 32 small signal differential clock signals of dcm_mux_clk 582 to the rail-to-rail differential signals needed by the 32 2:1 differential multiplexers 572 and to convert the 32 small signal differential clock signals of dcm_mux_clk 576 to the rail-to-rail differential signals needed by the 32 2:1 differential multiplexers 554, respectively. Also there are rr→ss drivers 574 and 556 to convert the 32 rail-to-rail differential signals needed by the 32 2:1 differential multiplexers 572 to the small signal differential clock signals of dcm_mux_clk 576 and to convert the rail-to-rail differential signals needed by the 32 2:1 differential multiplexers 554 to the 32 small signal differential clock signals of mux_clk 558, respectively.

Clock IOB 542 has 16 IOB pairs (master/slave pairs) that can supply 1 to 16 rail-to-rail differential external clock signals via pad_clk to each of the 32 16:1 differential multiplexers 552. DCM 548 has 4 DCMs which can supply 1 to 24 rail-to-rail differential clock signals to each of the 32 24:1 differential multiplexers 570.

Figure 5D:
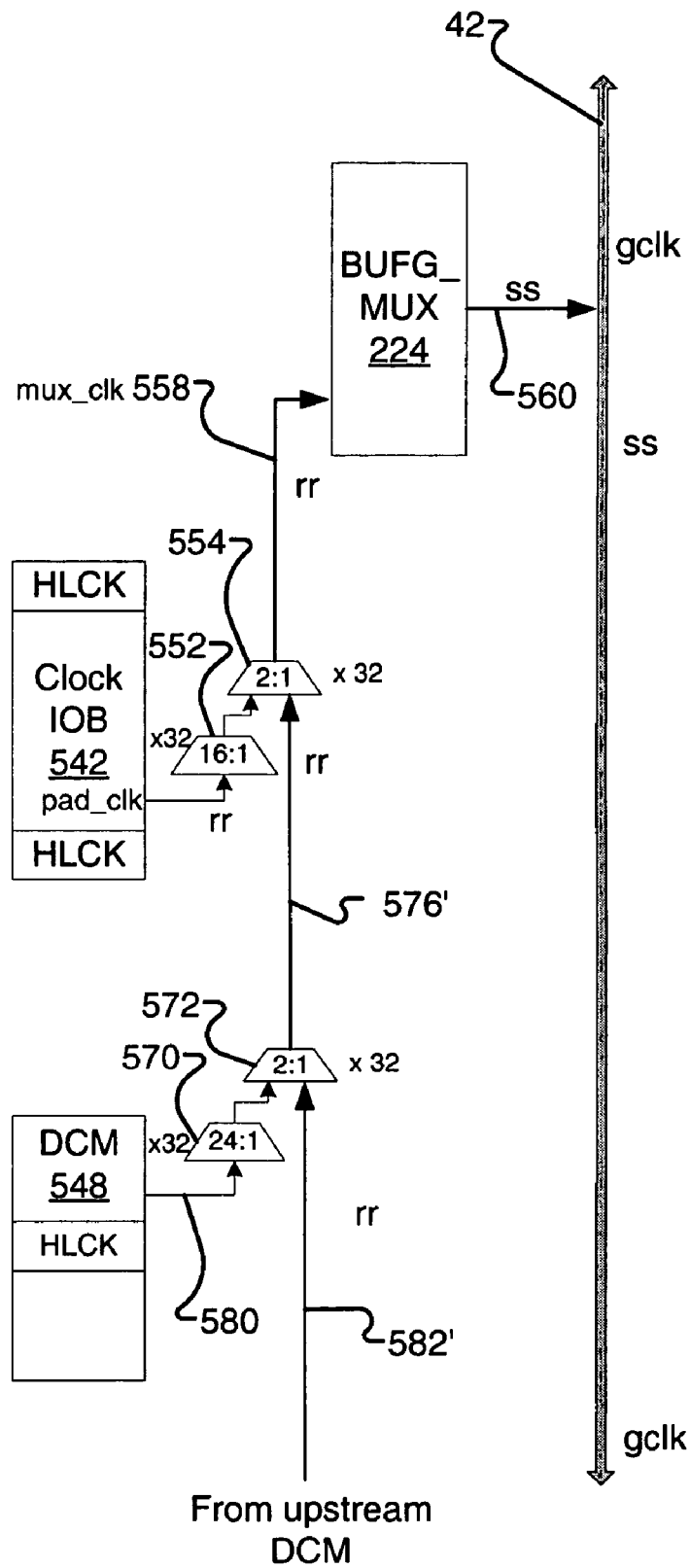
FIG. 5D shows a modification of the part of FIG. 5B that supplies one or more differential clocks to the clock tree backbone of another embodiment of the present invention.
Figure 11A:
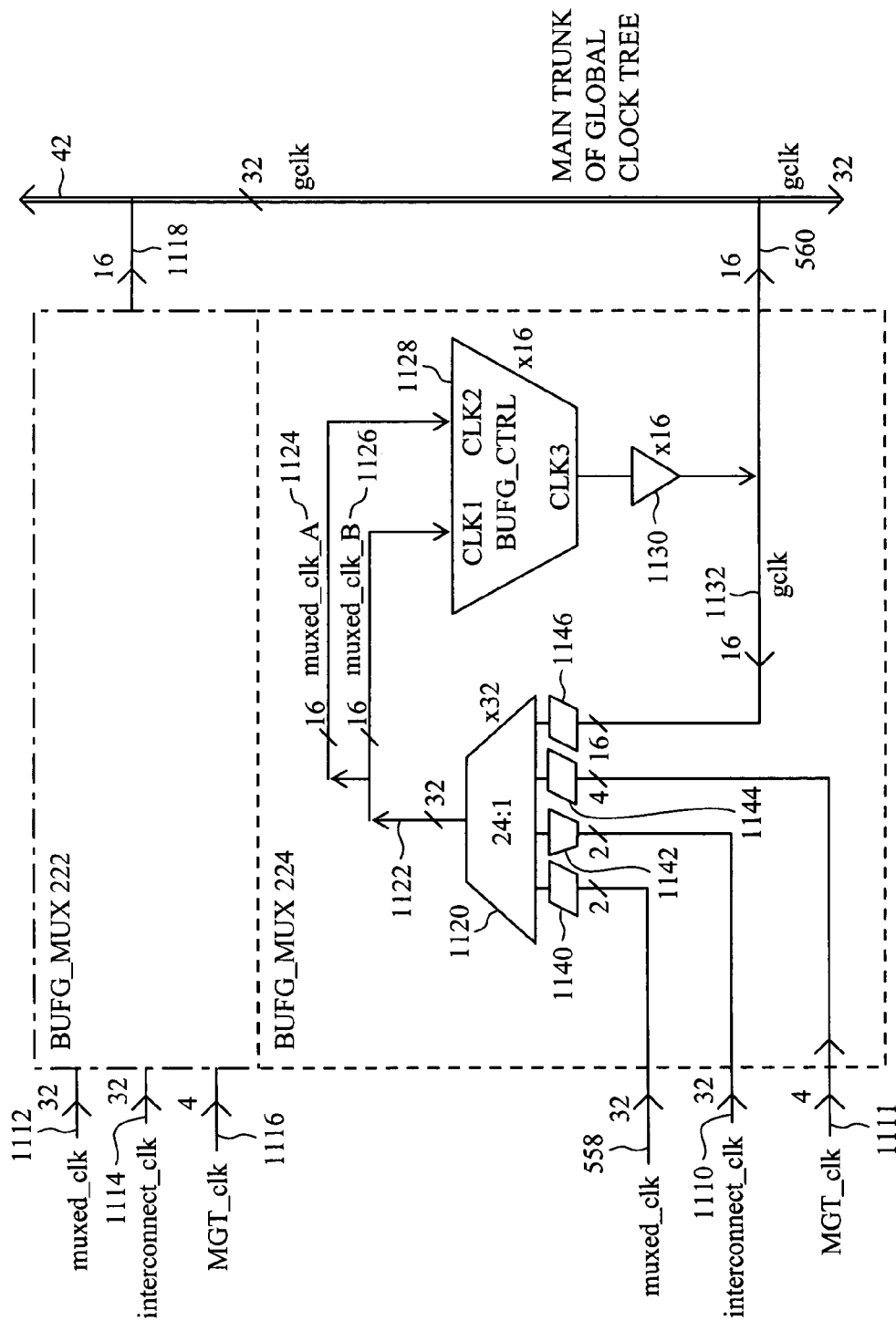
FIG. 11A is a simplified schematic of the BUFG_MUX circuit of an embodiment of the present invention.

FIG. 5D shows a modification of the part of FIG. 5B that supplies one or more differential clocks to the clock tree backbone 42 of another embodiment of the present invention. FIG. 5D is similar to FIG. 5C except that the differential signals between the 2:1 multiplexers, e.g., 572 and 554, and between 2:1 multiplexer 554 and BUF_MUX 224 are rail-to-rail differential signals and no conversions to small signal differential signals are done between the 2:1 multiplexers and between 2:1 multiplexer 554 and 24:1 multiplexer 1120 in BUF_MUX 224 (see FIG. 11A). Hence the converters/drivers 584, 574, and 578 (and for the other upstream DCMs) in FIG. 5C are missing in FIG. 5D (Also as converters/driver 556 is absent ss→rr converter 1140 in FIG. 11A is also absent). In an alternative embodiment, converters 556 (and 1140), 574 and 578 are still present, but converters 584 and the other rr→ss and ss→rr converters/drivers for the other upstream DCMs are absent.

FIG. 6A is a schematic of one horizontal clock row of the clock tree supplying clocks to 16 CLBs 614A/614B and 16 IOB pairs 544A/544B of an aspect of the present invention. The symbols in the legend 610 are similar to that described in legend 530 of FIG. 5B with the addition of a square symbol 612 representing differential small signal to single ended converters (ss→se) that covert the differential small signal clock signals to single-ended rail-to-rail clock signals.

With reference to FIGS. 3 and 6A, hclk 612 supplies 8 differential clock signals to 8 CLBs 614A and 8 CLBs 614B. The 8 differential clock signals of hclk 612 are converted via ss→se 632 to supply 8 single ended leaf clocks 632 to the 8 CLBs 614A and 8 single ended leaf clocks 634 to the 8 CLBs 614B. With reference to FIGS. 3, 5B and 6A hclk 514R supplies 8 differential clock signals to 8 IOB pairs 544A and 8 IOB pairs 544B of IOB 544. The 8 differential clock signals of hclk 514R are converted via ss se 646 to supply 8 single ended leaf clocks 650 to the 8 IOB pairs 544A via 8 Interconnect interfaces (IOIs) 640 and 8 single ended leaf clocks 652 to the 8 IOB pairs 544B via 8 IOIs 642.

At the intersection of the hclk rows with the global clock tree backbone 42 is CLK_HROW 620 that is the height of 4 CLBs plus the additional height of the HCLK block 630 or 644. CLK_HROW 620 includes 8 ss→rr converters 622 to convert the differential small signals of backbone 42 to differential rail-to-rail signals, 8 32:1 differential multiplexers 624 with the associated 8 rr→ss drivers 626, and 8 32:1 differential multiplexers 628 with the associated 8 rr→ss drivers 630. The function of the CLK_HROW block 620 is to drive 8 horizontal clocks left and 8 horizontal clocks right down the entire span of the IC. The CLK_HROW 16 sets of full crossbar 32:1 muxes, i.e., differential multiplexers 624 and 628, allow any of the 32 gclks to reach any of the 8 hclks that go left, e.g., hclk 612, or any of the 8 hclks that go to the right, e.g., hclk 514R.

The HCLK blocks 630 for the 16 CLBs and 644 for the 16 IOB pairs, each include 8 differential to single ended converters (ss→se) that provide single ended leaf_clks to the CLBs, BRAMs, IOIS, DCMs etc. Up to 8 different clocks can potentially be supplied to each CLB, BRAM, IOI etc.

However, in one embodiment each half of the 16 CLBs, i.e., 614A and 614B, and each half of the 16 IOB pairs, i.e., 544A and 544B, is limited to having the same 8 clocks being routed to all the cells in it. The 8 differential to single ended converters in each HCLK block are shared by the 8 elements above and below. In one embodiment each of these 8 ss→se converters, e.g., 632 and 646, in a HCLK such as 630 and 644, respectively, includes the logical equivalent of a NAND gate that gates the clock with a powerdown bit. This allows for entire branches of the clock tree to be shut down to save power. In another embodiment of the present invention each clock in the HCLK block, such as 630 and 644, will also respond to a configuration memory cell having the memory cell powerdown bit and to a programmable clock enable. The default clock enable state is 1 or enabled, but the clock enable can also come from the programmable interconnect of the PLD.

Figure 6B:
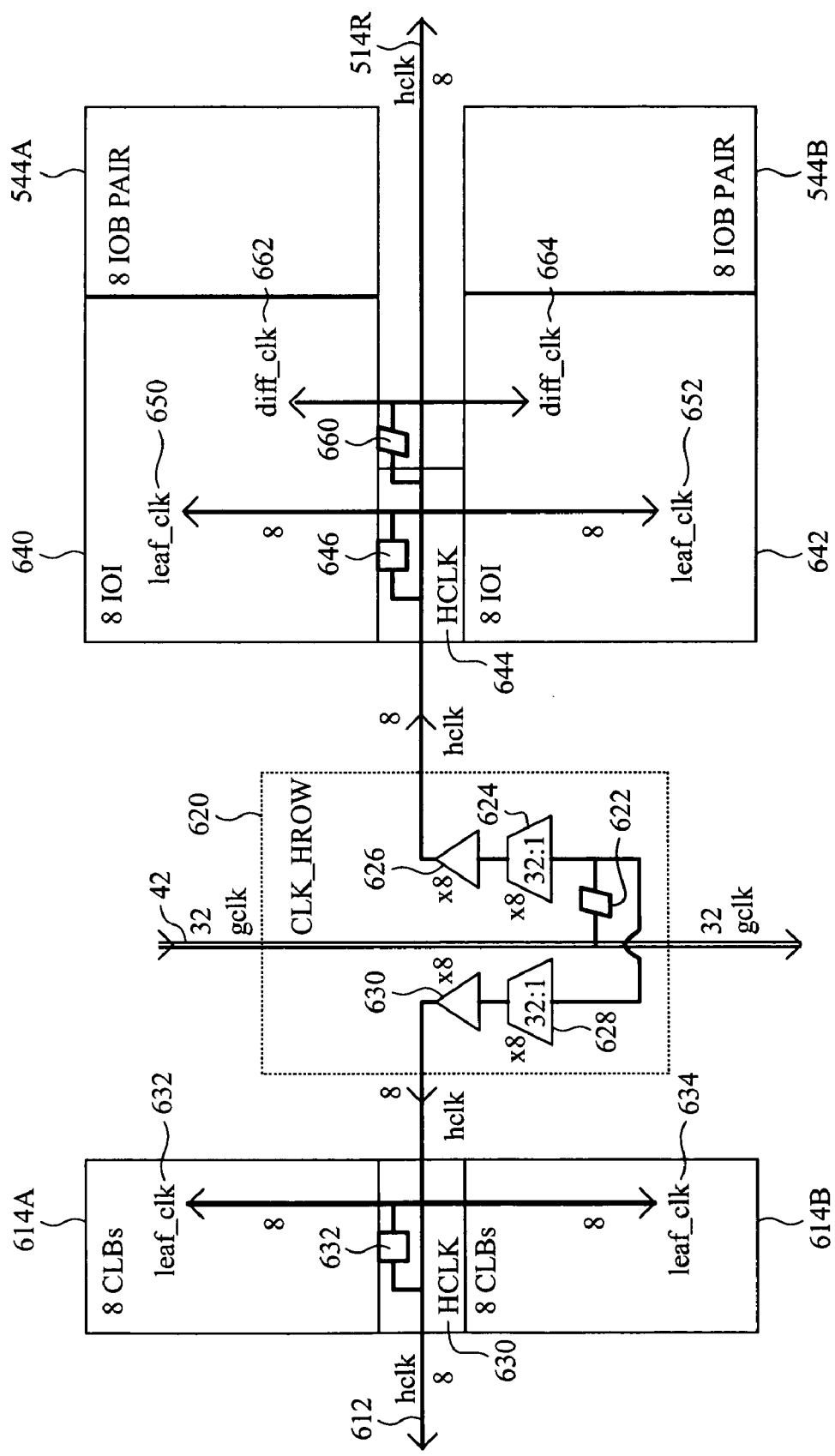
FIG. 6B is a schematic of one horizontal clock row of the clock tree supplying clocks to 16 CLBs and 16 IOB pairs of an alternative aspect of the present invention.

FIG. 6B is a schematic of one horizontal clock row of the clock tree supplying clocks to 16 CLBs 614A/614B and 16 IOB pairs 544A/544B of an alternative aspect of the present invention. FIG. 6B is similar to FIG. 6A with the addition of 8 rail-to-rail differential leaf clocks 662 feeding 8 IOB pairs 544A and 8 rail-to-rail differential leaf clocks 664 feeding 8 IOB pairs 544B via IOI 640 and IOI 642 respectively. There are also in HCLK 644 8 ss→rr converters 660 to convert the small signal differential of hclk 514R to rail-to-rail differential signals diff_clk 662 and 664. The to rail-to-rail differential clock signals are provided to those circuit elements in the IOBs that need a high quality clock and the single ended clocks are provided to the remainder of the circuit elements in the IOBs for cost and static power reasons. Other circuits such as the DCM, CCM, SYSMON, and MGT circuits may get small signal differential clocks. Hence in various embodiments each circuit element on an IC may receive a rail-to-rail single-ended clock, a small signal single-ended clock, a rail-to-rail differential clock, a small signal differential clock or any combination thereof.

Figure 6C:
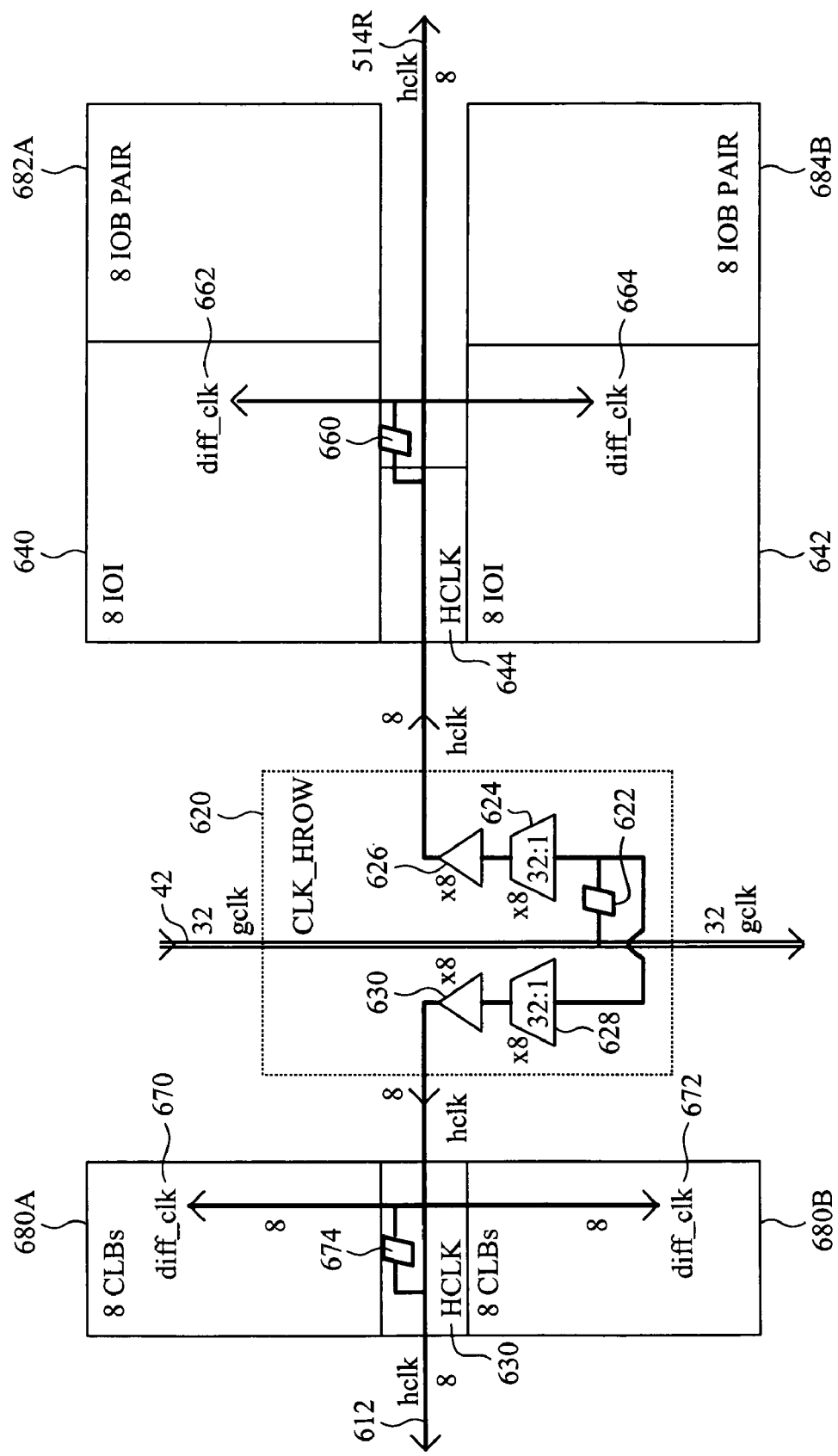
FIG. 6C is a schematic of one horizontal clock row of the clock tree supplying clocks to 16 CLBs and 16 IOB pairs of another embodiment of the present invention.

FIG. 6C is a schematic of one horizontal clock row of the clock tree supplying clocks to 16 CLBs 680A/680B and 16 IOB pairs 682A/682B of another embodiment of the present invention. In this embodiment the CLBs and IOBs are differential circuits that use only differential clocks. The 8 IOB pairs 682A receive diff_clk 662 and the 8 IOB pairs 682B receive diff_clk 664 via IOI 640 and IOI 642, respectively. For the CLBs 680A/680B 8 ss→rr converters 674 to convert the small signal differential of hclk 612 to rail-to-rail differential signals diff_clk 670 and 672 for the 8 CLB of 680A and 8CLBs of 680B, respectively.

Figure 7A:
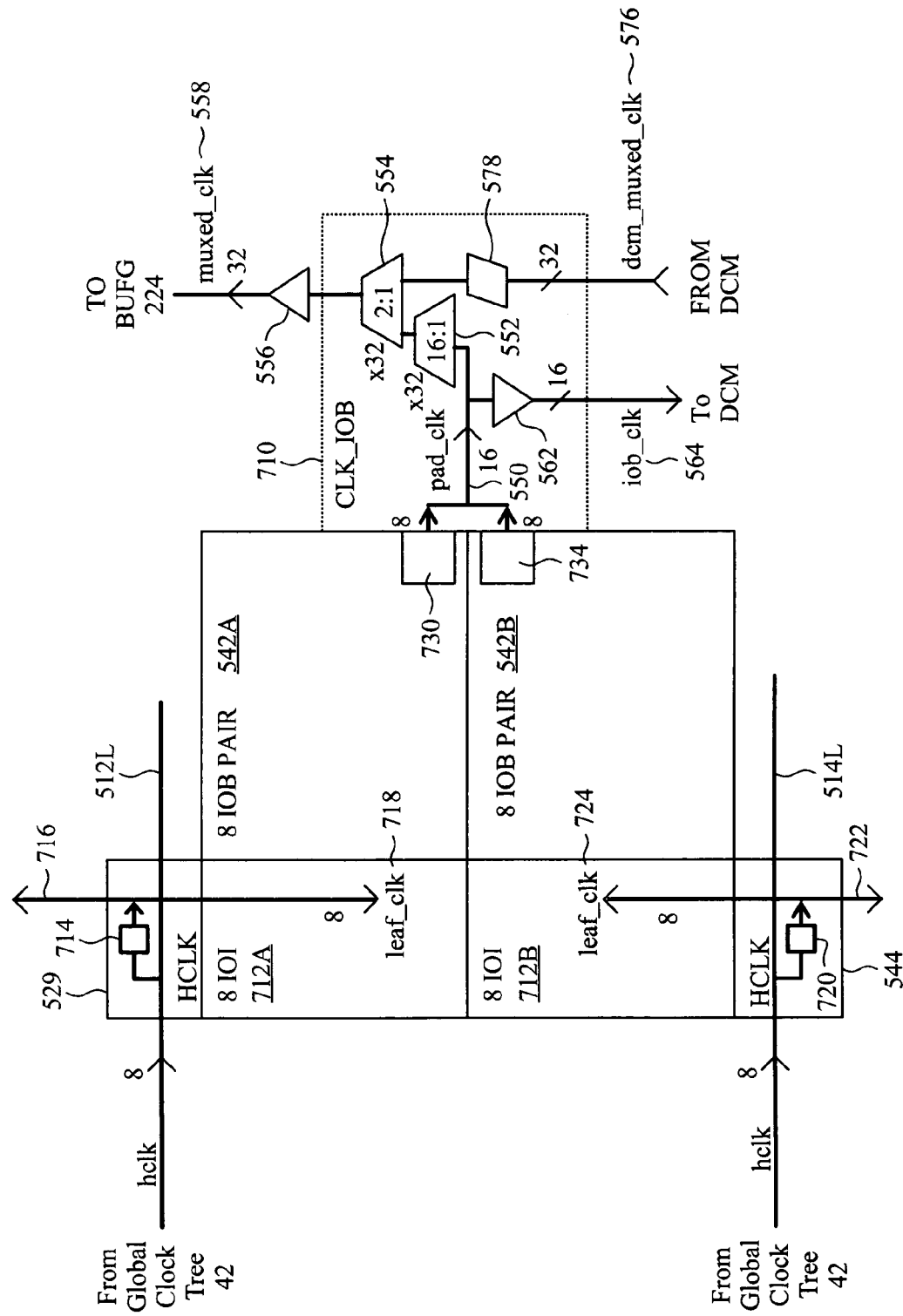
FIG. 7A is a more detailed schematic of specialized clock IOB of FIG. 5B of aspect of the present invention.

FIG. 7A is a more detailed schematic of specialized clock IOB 542 of FIG. 5B of aspect of the present invention. Specialized clock IOB 542 includes 8 IOB pairs 542A with its associated 8 IOIs 712A and 8 IOB pairs 542B with its associated 8 IOIs 712B. The 8 IOB pairs 542A via IOI 712A receive 8 rail-to-rail single ended clocks 718 from hclk 512L via 8 ss→se converters 714. The 8 IOB pairs 542B via IOI 712B receive 8 rail-to-rail single ended clocks 724 from hclk 514L via 8 ss→se converters 720. The 8 IOB pairs 542A have 8 I/O master/slave pad pairs (see FIG. 8) 730 to supply 8 external rail-to-rail differential clocks. The 8 IOB pairs 542B have another 8 I/O master/slave pad pairs (see FIG. 8) 732 to supply another 8 external rail-to-rail differential clocks. Thus there are upto 16 differential clocks, i.e., pad_clk 550, that may be sent to the clock tree backbone 42 via CLK_IOB block 710. CLK_IOB block 710 is 6 CLBs in height and includes 32 16:1 differential multiplexers 552 connected to 32 2:1 differential multiplexers 554. The 32 16:1 differential multiplexers 552 are a fully connected crossbar switch that lets any of the 16 pad_clks connect to any of the 32 wires going to BUFG_MUX 224 via 32 muxed_clk 558 signal lines.

Each of the 32 16:1 multiplexers is connected to 32 2:1 multiplexers 554 followed by 32 drivers 556, that also include rr→ss converters. The 32 dcm_muxed_clk wires 576 coming from the DCMs get preferential treatment and serve as one of the 2 inputs to each of the 32 2:1 multiplexers 554, via 32 ss→rr converters 578. These 2:1 multiplexers are implemented with CMOS passgates (see FIG. 12). The 2:1 multiplexers 554 followed by the drivers 556 can thus amplify and transmit the output of the 16:1 multiplexers 552 or it can let the signal on the dcm_muxed_clk 576 wires coming from the one or more DCMs to pass through with minimum loading and delay. The inputs to the 32 16:1 multiplexers 552 are the 16 differential signals from the 32 IOB pads in the clock specialized IOB 542, and the 32 16:1 multiplexers 552 form a full crossbar switch, i.e., any input can independently drive any output. In an embodiment, the 16:1 multiplexer includes two 4:1 stages with CMOS pass-gates.

CLK_IOB 710 further includes driver 562, whose function is to drive the clock inputs from the Clock Specialized IOBs, e.g., clock IOB 542A/B, to the DCMs, e.g., 548, CCMS, System Monitor (A2D), and/or MGTs. At most 16 differential clocks from 32 pads of the clock specialized IOBs can be driven towards the DCMs in each half (top or bottom) of the chip.

In one embodiment of the present invention in each specialized clock 10B, at least 2 IOB pairs out of the 16 IOB pairs are modified to be input buffers only, i.e., clock IBUF pairs. By removing a lot of the output standards these 2 IBUFS pairs in each half of the chip have significantly less capacitance on them.

Figure 7B:
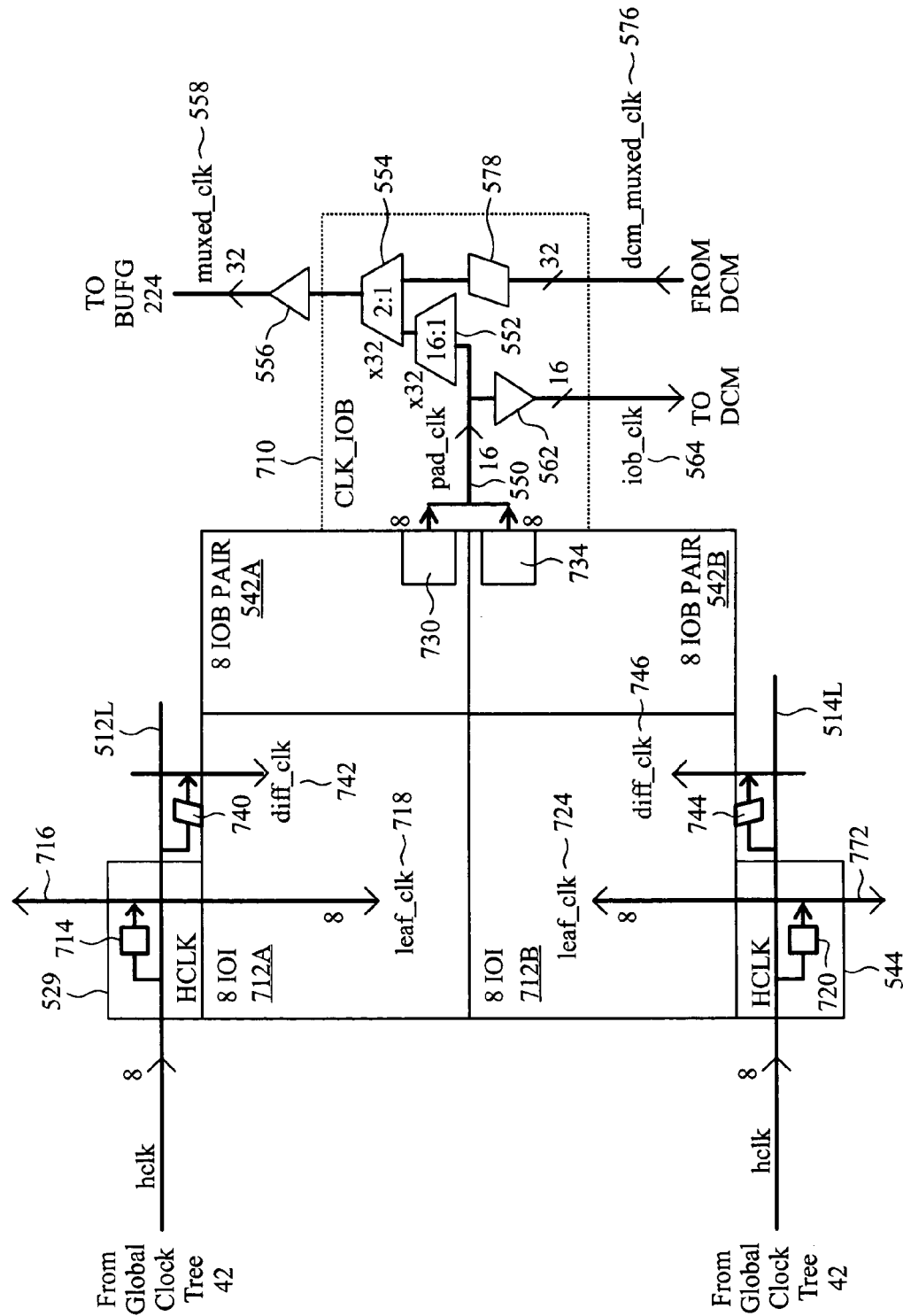
FIG. 7B is another more detailed schematic of specialized clock IOB of FIG. 5B of another aspect of the present invention.

FIG. 7B is another more detailed schematic of specialized clock IOB 542 of FIG. 5B of another aspect of the present invention. FIG. 7B is similar to FIG. 7A with the addition of 8 rail-to-rail differential leaf clocks 742 feeding 8 IOB pairs 542A via IOI 712A and 8 rail-to-rail differential leaf clocks 746 feeding 8 IOB pairs 542B via IOI 712A. There is also in HCLK 529 8 ss→rr converters 740 to convert the small signal differential of hclk 512L to rail-to-rail differential signals diff_clk 742, and there is also in HCLK 544 8 ss→rr converters 744 to convert the small signal differential of hclk 514L to rail-to-rail differential signals diff_clk 746.

Figure 8:
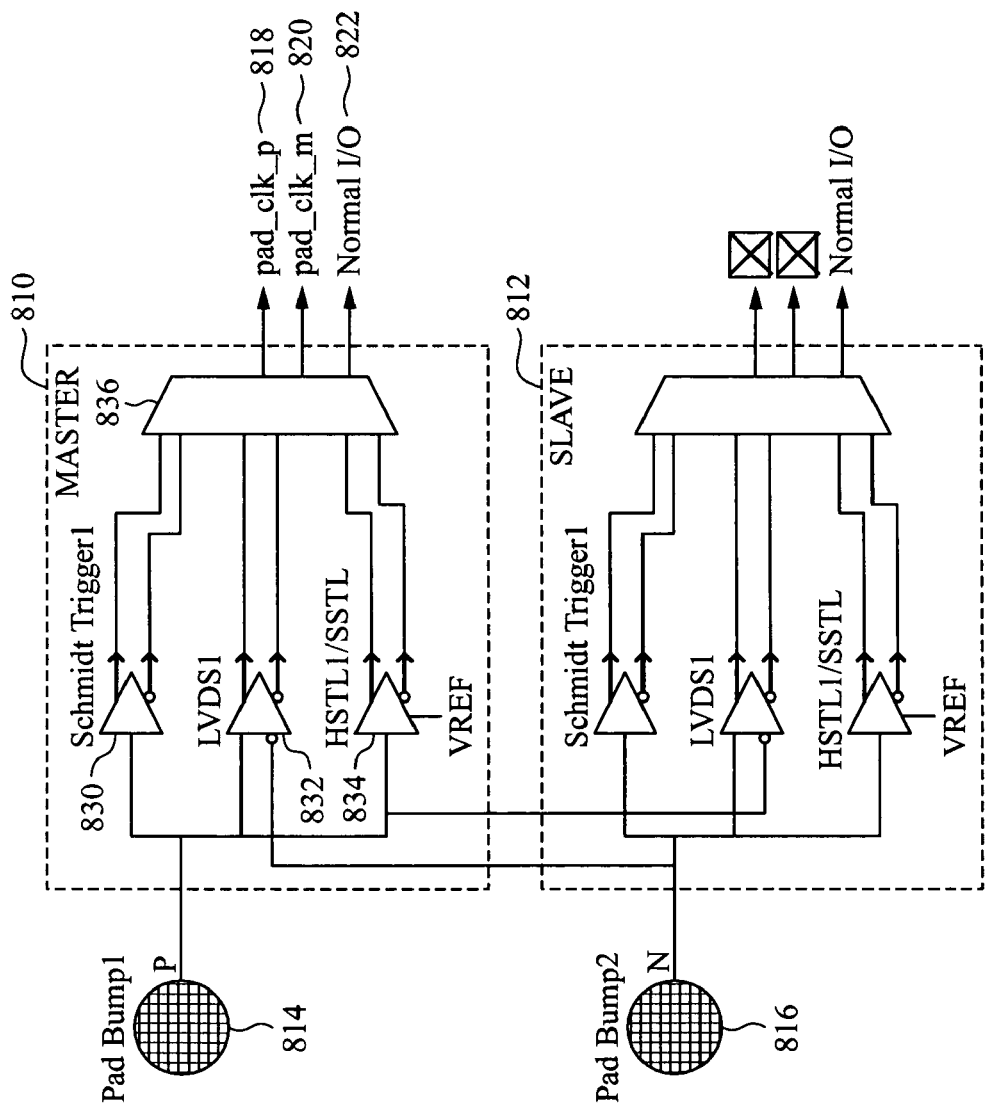
FIG. 8 shows the pair of pad bumps 814/816 and corresponding master/slave circuits for each IOB pair.

FIG. 8 shows the pair of pad bumps 814/816 and corresponding master 810/slave 812 circuits for each IOB pair. The master circuit 810 receives either a differential clock via pads 816 and 814 or a single-ended clock via pad 814 and produces a rail-to-rail differential clock with output signals pad_clk_p 818 and pad_clk_n 820 (where "P" and "p" indicate the plus portion of the differential clock and, "N" and "n" indicate the negative portion of the differential clock). A multiplexer 836 which may be set by the configuration memory selects the outputs from a Schmidt trigger 830, a Low voltage Differential Signaling (LVDS) circuit 832, or a High Speed Transistor Logic/Stub-Series Terminated Logic (HSTL/SSTL) circuit 834. Only pad 816 of slave circuit 812 is used.

Figure 9A:
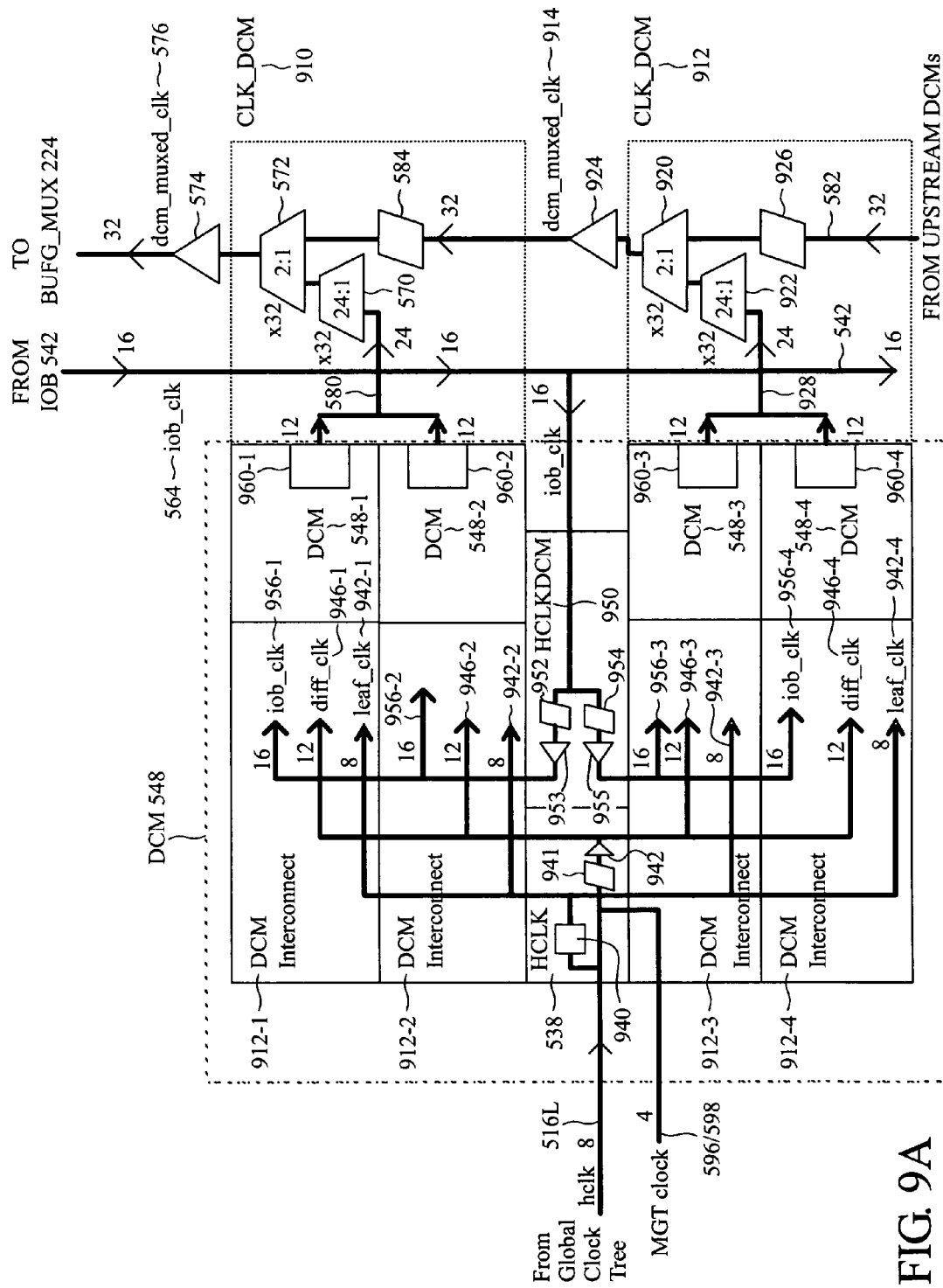
FIG. 9A is a more detailed view of DCM of FIGS. 5A/B of an aspect of the present invention.

FIG. 9A is a more detailed view of DCM 548 of FIGS. 5A/B of an aspect of the present invention. DCM 548 includes 4 DCM circuits 548-1, 548-2, 548-3, and 548-4 (collectively referred to as 548) with the corresponding DCM interconnect circuits 548-1 to 548-4, respectively. DCM circuits 548-1 and 548-2 supply upto 12 rail-to-rail differential clock signals from sub-blocks 960-1 and upto 12 rail-to-rail differential clock signals from sub-blocks 960-2, respectively (i.e., a total of 24 clock signals 580), to circuit block CLK_DCM 910. DCM circuits 548-3 and 548-4 supply upto 12 rail-to-rail differential clock signals from sub-blocks 960-3 and upto 12 rail-to-rail differential clock signals from sub-blocks 960-4, respectively (i.e., a total of 24 clock signals 928), to circuit block CLK_DCM 912.

The CLK_DCM 910 extends for the height of 4 CLB and is next to the pair of DCMs 548-1 and 548-2. The CLK_DCM 910 includes 32 sets of 24:1 differential multiplexers 570. The 32 24:1 differential multiplexers 570 receive the upto 24 differential clock signals 580 and the 32 differential outputs are first inputs to each of the 32 2:1 differential multiplexers 572. The second inputs to each of the 32 2:1 multiplexers 572 come from the 32 2:1 differential multiplexers 920 via 32 rr→ss drivers 924 and 32 ss→rr converters 584. The 32 signal lines for dcm_muxed_clk 914 are small signal differential.

The CLK_DCM 912 extends for the height of 4 CLB and is next to the pair of DCMs 548-3 and 548-4. The CLK_DCM 912 includes 32 sets of 24:1 differential multiplexers 922. The 32 24:1 differential multiplexers 922 receive the upto 24 differential clock signals 928 and the 32 differential outputs are first inputs to each of the 32 2:1 differential multiplexers 920. The second inputs come from the 32 upstream 2:1 differential multiplexers via 32 rr→ss drivers (not shown) and 32 ss→rr converters 926. The 32 signal lines for dcm_muxed_clk 582 that go to the 32 ss→rr converters 926 are small signal differential.

DCM 548 receives 8 small signal differential clock signals from hclk 516L and 4 differential MGT clock signals 596/598 from MGT lines 596 and 598. Since the 4 DCMs 548-1 to 548-4 are located next to HCLK row 516L, all 4 DCMs in such a HCLK row 516L can only be reached by 8 hclks. Since the DCMS, e.g., 548-1 to 548-4, and the DCM interconnects, e.g., 912-1 to 912-4, are located to the left of the clock tree backbone 42 (see FIGS. 4A and 4B), the DCM can only be fed by the same 8 hclk signals that go to the left half of the chip. If in one example IC there are a total of 16 DCM circuits, then each of the 4 sets of 4 DCMs can get a different and unique set of 8 hclks in their HCLK row because there are 32 gclks.

In circuit block HCLK 538 the 8 small signal differential clocks from hclk 516L are converted to 8 single ended rail-to-rail clocks via 8 ss→se converters 940 to give leaf clocks 942-1 to 942-4 for DCM circuits 548-1 to 548-4, via DCM interconnects 912-1 to 912-4, respectively. Also in HLCK 538 the 8 hclks 516L and 4 MGT clocks 596/598 are converted via 12 ss→rr converters 941 connected to 12 rr→ss drivers 942 to give four sets of 12 differential small signal clocks, i.e., diff_clks 946-1 to 946-4, for DCM circuits 548-1 to 548-4, via DCM interconnects 912-1 to 912-4, respectively.

The circuit block HCLKDCM 950 receives 16 small signal clocks, i.e., iob_clk 564, from IOB 542. HCLKDCM 950 provides 16 differential small signal clocks (iob_clk 956-1) to DCM circuit 548-1 via 16 ss→rr converters 952 connected to 16 rr→ss drivers 953 and DCM interconnect 912-1 and 16 differential rail-to-rail clocks (iob_clk 956-2) to DCM circuit 548-2 via 16 ss→rr converters 952 connected to 16 rr→ss drivers 953 and via DCM interconnect 912-2. HCLKDCM 950 also provides 16 differential small signal clocks (iob_clk 956-3) to DCM circuit 548-3 and 16 differential small signal clocks (iob_clk 956-4) to DCM circuit 548-4 via 16 ss→rr converters 954 connected to 16 rr→ss drivers 955 and via DCM interconnects 912-3 and 912-4, respectively.

The above description for the single-ended and differential clocks for the DCM, similarly apply to the CCM, System Monitor and MGT (although only a subset of the DCM clocks may reach the System Monitor and MGT). For example, in one embodiment the MGT may get only 8 small signal differential clocks and the System Monitor may only get the 16 iob_clks.

In one or more of the DCM circuits 548-1 to 548-4 in an embodiment of the present invention one or more of the 8 diff_clk 946-1/-2/-3/-4 clock signals is compared with one or more of the 8 iob_clk 956-1/-2/-3/-4 clock signals, respectively. The purpose of this comparison is to reduce the skew of a leaf clock (leaf_clk) reaching an IOB or CLB. The feedback clock(s), i.e., hclk, comes from a BUFG_MUX (e.g., 224), down a vertical gclk wire (42), then through a horizontal hclk wire (516L) to a vertical leaf clock wire (942) that is similar to the clock wire that reaches the CLBs and IOBs. Because the DCMs are vertically located relatively far out from the center (see, e.g., DCMs 274-1 to 274-4 in FIG. 4B), they will see a similar vertical skew that the farthest IOB will see. However, because they are located in the central vertical spine, they will not see much of the horizontal skew. This is okay because the DCM tunable delay element can be tuned to adjust the skew on the DCM output clock as per the user's desires.

In one embodiment a DCM block, e.g., 548-1, includes one or more multiplexers that receive the 16 iob_clk, 12 diff_clk (8 hclks+4 MGT clocks), and 8 leaf_clk signals and produce one or more differential output signals, e.g., 580 or 928.

Figure 9B:
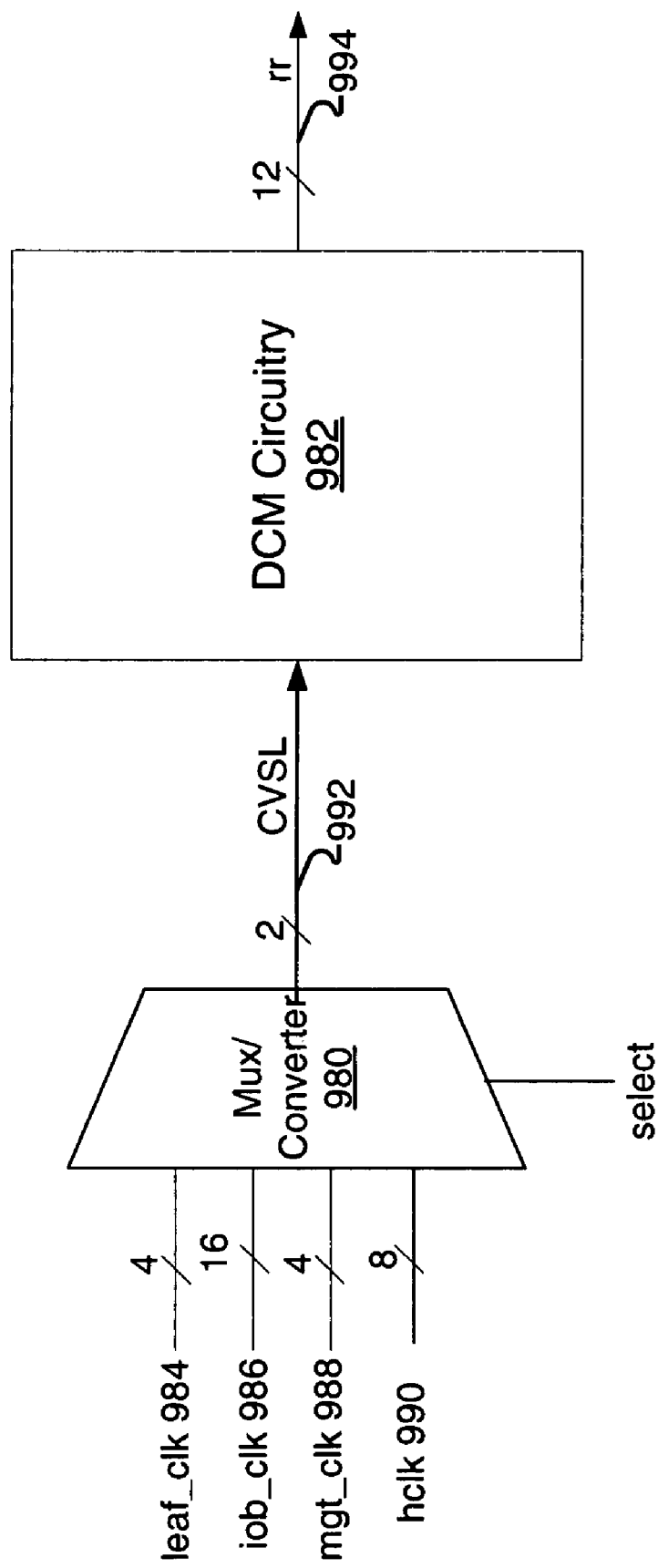
FIG. 9B is a more detailed block diagram of the DCM blocks of FIG. 9A.

FIG. 9B is a more detailed block diagram of the DCM blocks 548 of FIG. 9A. The DCM block, e.g., 548-1, includes a multiplexer/converter circuit 980 and the DCM circuitry 982. The multiplexer/converter circuit 980 receives four single ended leaf clocks leaf_clk 984, 16 differential small signal iob_clk 986, 8 differential small signal hclks 990, 4 differential small signal mgt_clk 988, selects from these inputs and uses a converter to produce two differential Cascode Voltage Switch Logic (CVSL) clock signal outputs 992. The two differential CVSL clock signal outputs 992 are input into the DCM circuitry 982. DCM circuitry 982 outputs up to 12 rail-to-rail differential clock signals 994. In another embodiment of the present invention the Mux/converter 980 produces rail-to-rail differential clock signals like those produced from the IOB pairs in FIG. 7A and the DCM circuitry 982 has typical CMOS logic circuitry not CSVL circuitry.

The DCM circuitry 982 has a delayed lock loop (DLL) that compares and deskewes the diff_clk signal with respect to a reference iob_clk signal. U.S. Pat. No. 6,289,068 B1 entitled "Delay Lock Loop with Clock Phase Shifter," by Joseph H. Hassoun, et. al, filed Jun. 22, 1998 discloses the details of how the deskewing is done and is herein incorporated by reference. Further details on the DLL may be found in co-pending U.S. patent application Ser. No. 10/792,055 filed Mar. 2, 2004 titled "Digital High Speed Programmable Delayed Locked Loop," by Guang Lu Wei, and is herein incorporated by reference. The DCM circuitry 982 also includes a frequency synthesizer component where further details are disclosed in co-pending U.S. patent application Ser. No. 10/769,205 filed Jan. 29, 2004 titled "Low Jitter Digital Frequency Synthesizer and Control Thereof," by John D. Logue, et. al. and is herein incorporated by reference. In addition, in one embodiment the DCM circuitry 982 is a differential circuit that uses Cascode Voltage Switch Logic (CVSL).

Figure 10:
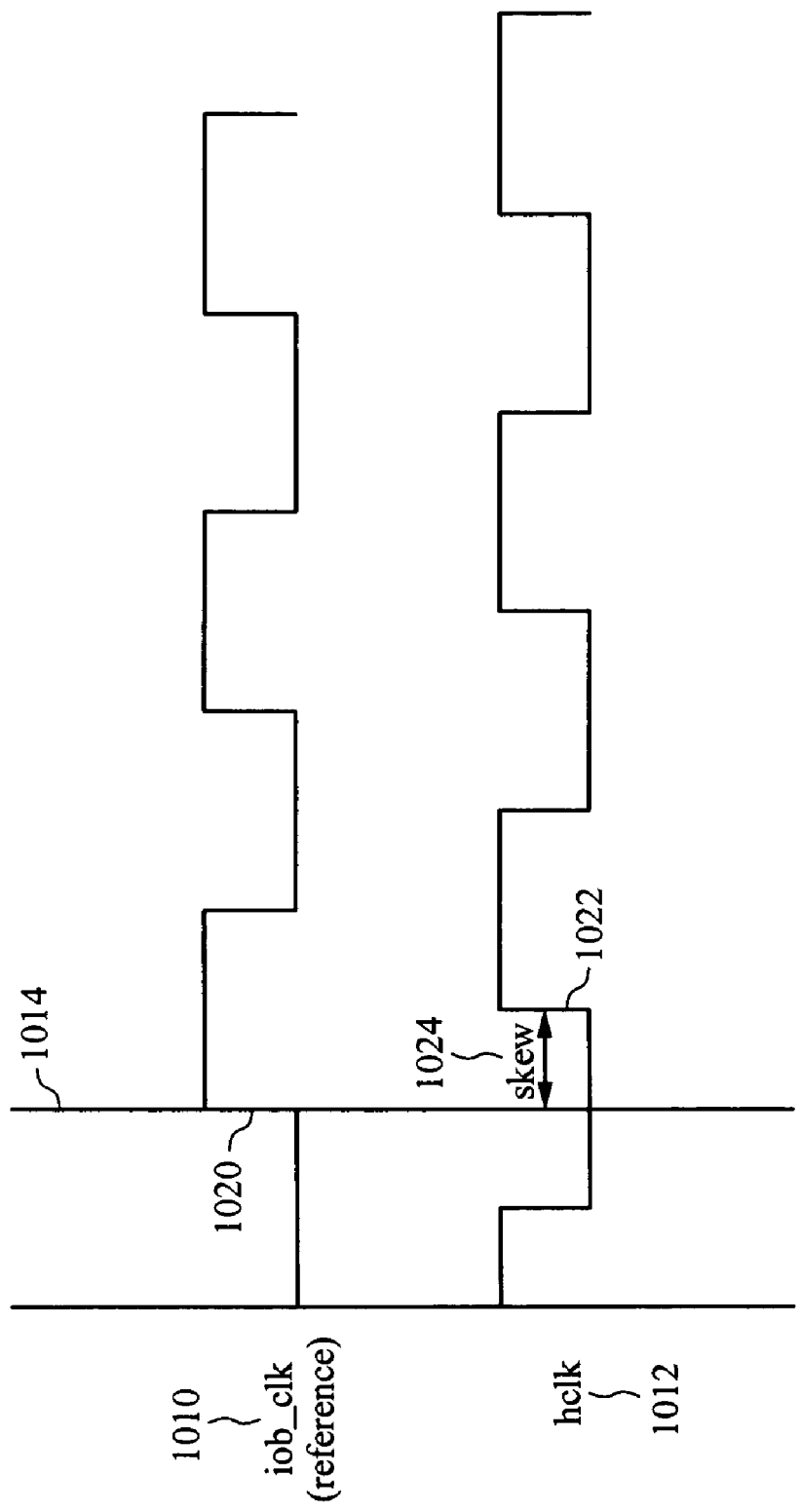
FIG. 10 is an example of skew between the differential iob_clk and the differential diff_clk.

FIG. 10 is an example of skew between the differential iob_clk 1010 and the differential diff_clk 1012. The iob_clk 1010 serves as the reference. A rising edge 1020 of iob_clk 1010 is compared to a rising edge 1022 of diff_clk 1012 to give a skew of 1024. The clocks are not drawn to scale and are for illustrative purposes only. The goal is to use the tunable delay of the DCM to minimize the skew 1024.

FIG. 11A is a simplified schematic of the BUFG_MUX circuit 224 of an embodiment of the present invention. With reference also to FIGS. 4A/B and 5A/B/C, global buffer/multiplexer BUFG_MUX 224 receives 32 small signal differential clock signals mux_clk 558 and 4 MGT clock signals (2 from MGT clock 590 and 2 from MGT clock 592), i.e., MGT_clk 1111. BUFG_MUX 224 outputs a first set of 16 small signal differential clock signals 560 to the main trunk or backbone 42 of the global clock tree. Since BUFG_MUX 224 is for the bottom half of the FPGA, BUFG_MUX 222 is for the top half. In one embodiment BUFG_MUX 222 is located on top (or alternatively, on the bottom) of BUFG_MUX 224 and hence there is only one BUFG_MUX block rather than the two (BUFG_MUX 222 and 224) shown. BUFG_MUX 222 receives 32 small signal differential clock signals mux_clk 1112 from the top half of the IC and 4 MGT clock signals, i.e., MGT_clk 1116. BUFG_MUX 222 outputs a second set of 16 small signal differential clock signals 1118 to the main trunk or backbone 42 of the global clock tree. Hence the 16 global clock signals 1118 from BUFG_MUX 222 and the 16 global clock signals 560 from BUFG_MUX 224 make feed the 32 gclk small signal differential clock signals of backbone 42.

In FIG. 11A BUFG_MUX 224 includes three groups of ss→rr converters: converters 1140 receiving the 32 mux_clk 558 signal lines, converters 1144 receiving the four MGT_clk 1111, and converters 1146 receiving 16 gclk 1132 (the same 16 gclk 560 output from BUFG_MUX 224). Also there are single ended to differential converters 1142 receiving 32 interconnect_clk 1110 signals lines from the FPGA programmable interconnect structure. BUFG_MUX 224 further includes 32 24:1 (PREMUX) differential multiplexers 1120 receiving 24 rail-to-rail differential signals from the three groups of ss→rr converters and the converters 1142. The 24:1 differential multiplexers 1120 output 32 selected rail-to-rail differential signals which are divided into two groups of 16 signals apiece, i.e., muxed_clk_A 1124 and muxed_clk_B 1126. BUFG_MUX 224 further includes 16 2:1 differential multiplexers, i.e., global buffer control BUFG_CTRL 1128, and 16 rr→ss drivers 1130 which receives the output of 16 BUFG_CTRL 1128 and drives a feedback gclk 1132 (16 small signal differential lines) to 16 ss→rr converters 1146 and a gclk 560 (16 small signal differential lines) to the backbone 42.

Figure 11B:
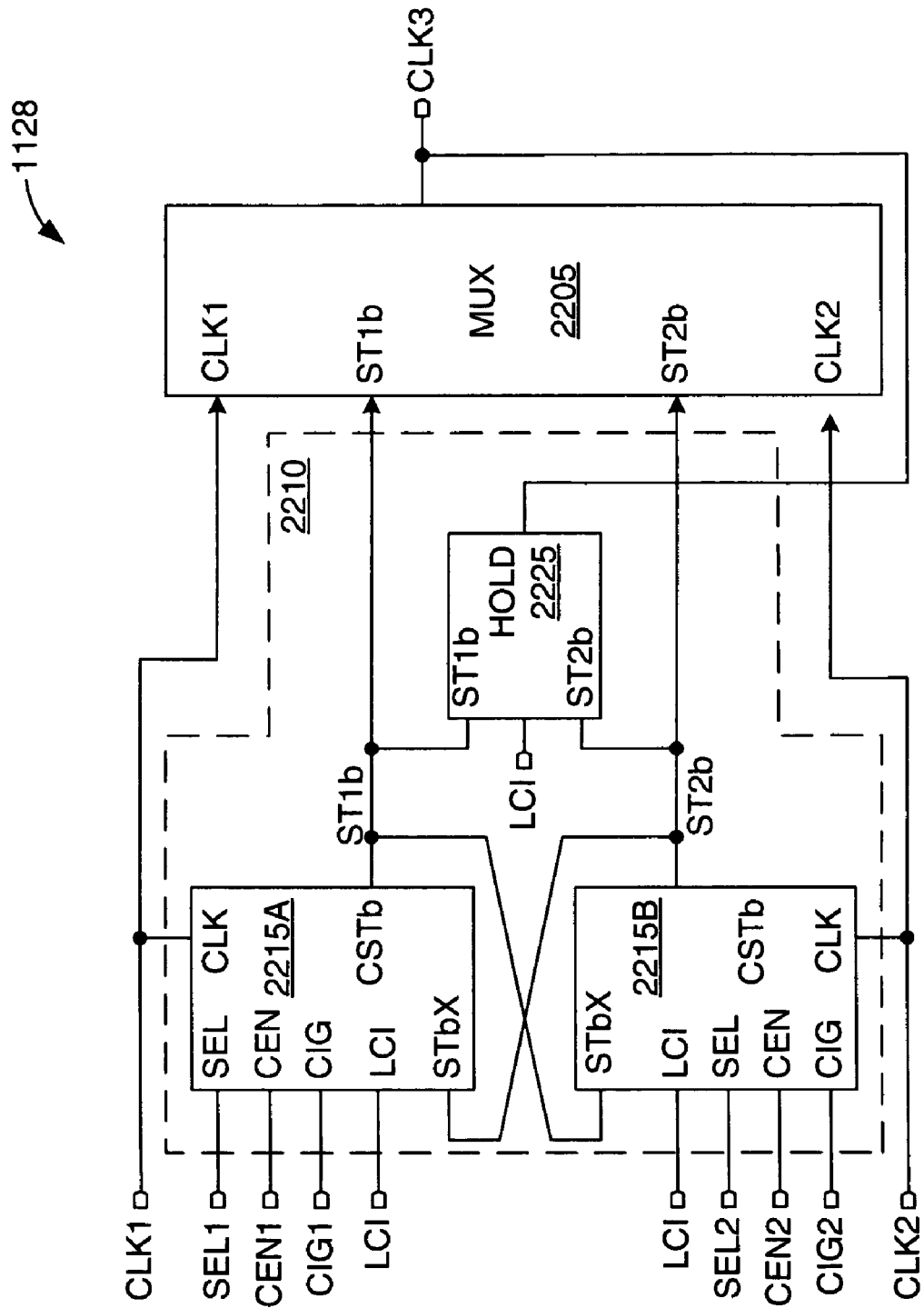
FIG. 11B depicts a simplified schematic of the BUFG_CTRL circuit in accordance with one embodiment of the invention.

FIG. 11B depicts a simplified schematic of the BUFG_CTRL circuit 1128 in accordance with one embodiment of the invention. Like the previous figures, the normal differential clock inputs of CLK1p and CLK1m for the first clock input (CLK1) and CLK2p and CLK2m for the second clock input (CLK2), and for the differential clock output of CLK3p and CLK3m have been simplified to CLK1, CLK2, and CLK3 so as not to obscure the invention. Control circuit 1128 includes a multiplexer 2205 that passes one or neither of a pair of clock signals CLK1 and CLK2 in response to a pair of state signals ST1b and ST2b from some control logic 2210. Clock-control circuit 1128 switches between clock signals CLK1 and CLK2 without introducing glitches in output signal CLK3, includes clock-ignore capability that facilitates switching away from failed clocks, and supports independent clock-enable functionality for clock signals CLK1 and CLK2.

Clock-control circuit 1128 supports three basic functions: clock select, clock enable, and clock ignore. The clock-select function provides a selected one of clock signals CLK1 and CLK2 on clock-distribution node CLK3 in response to select signals SEL1 and SEL2. The clock-enable function allows control circuit 1128 to synchronously block or pass a selected clock signal. If clock-signal CLK1 is selected, for example, clock-enable signal CEN1 can be used to synchronously switch on and off the clock signal provided on clock-distribution node CLK3. Finally, the clock-ignore function allows control logic 2210 to ignore either of clock signals CLK1 and CLK2 if necessary, for example, to switch away from a failed clock.

Control logic 2210 includes the same or similar first and second clock-state generators 2215A and 2215B (collectively 2215) and a hold circuit 2225. State generators 2215A and 2215B generate state signals ST1b and ST2b in response to the externally provided select, clock-enable, and clock-ignore signals introduced above, while hold circuit 2225 holds clock-distribution node CLK3 at a predefined logic level during switching and when neither clock signal is selected. An additional control signal, latch-clock-invert LCI, determines the predefined logic level of hold circuit 2225.

Asserting select signal SEL1 with signal SEL2 de-asserted connects clock signal CLK1 to clock-distribution node CLK3; asserting select signal SEL2 with signal SEL1 de-asserted connects clock signal CLK2 to clock-distribution node CLK3; and de-asserting both select signals holds clock-distribution node CLK3 in a given state (simultaneously holding both signals SEL1 and SEL2 to logic one is not allowed). The following describes how control circuit 200 switches from clock signal CLK1 to clock signal CLK2. The process of switching back from clock signal CLK2 to clock signal CLK1 is identical, so a description of that process is omitted for brevity.

Select signal SEL1 is asserted and SEL2 de-asserted to select clock signal CLK1. Control circuit 2210 delivers clock signal CLK1 via node CLK3 as long as the control signals remain unchanged. This example assumes clock-enable signals CEN1 and CEN2 are asserted, clock-ignore signals CIG1 and CIG2 are de-asserted, and latch-clock-invert signal LCI is de-asserted. Table 1, below, summarizes the select function as control circuit 200 switches between clock signal CLK1 and CLK2:

TABLE 1

| SEL1 | SEL2 | CLK1 | CLK2 | ST1b | ST2b | CLK3 |
|------|------|------|------|------|------|------|
| 1 | 0 | — | — | 0 | 1 | CLK1 |
| 0 | 0 | F | — | 1 | 1 | Hold |
| 0 | 1 | — | F | 1 | 0 | CLK2 |
| 0 | 0 | — | F | 1 | 1 | Hold |
| 1 | 0 | F | — | 0 | 1 | CLK1 |

The first row of Table 1 shows that with select signals SEL1 and SEL2 respectively asserted (high) and de-asserted (low), active-low state signals ST1b and ST2b are likewise respectively asserted (low) and de-asserted (high). Multiplexer 2205 therefore provides input clock signal CLK1 on output node CLK3.

The switch from clock signal CLK1 to clock signal CLK2 begins when select signal SEL1 is de-asserted (Table 1, second row). Control logic 2210 synchronizes the de-assertion of select signal SEL1 with clock signal CLK1 by de-asserting state signal ST1b in response to the next falling edge F of clock signal CLK1. Multiplexer 2205 responds by disconnecting terminal CLK1 from clock node CLK3, which leaves clock node CLK3 floating. Hold circuit 2225 responds to the two de-asserted state signals ST1b and ST2b by holding the floating node CLK3 to a predetermined logic level. Given that signal LCI is assumed to be logic zero in this example, control logic 2210 switches multiplexer 2205 away from clock signal CLK1 when clock signal CLK1 transitions to a logic zero. Hold circuit 2225 then maintains this level, and thus prevents a glitch on node CLK3. If signal LCI is a logic one, control logic 2210 switches multiplexer 2205 away from a selected clock signal on the next rising edge of the selected clock signal, and hold circuit 2225 holds node CLK3 to a logic one during transitions between clock signals.

Control logic 2210 remains in state 11 (ST1b=1; ST2B=1) until select signal SEL2 is asserted (Table 1, third row). Control logic 2210 synchronizes the assertion of select signal SEL2 with clock signal CLK2, asserting state signal ST2b (low) in response to the next falling edge F of clock signal CLK2 (clock signal CLK1 is a "don't care"). Hold circuit 2225 disconnects its output from clock node CLK3 as multiplexer 2205 conveys clock signal CLK2 to node CLK3. (Control logic 2210 switches from the logic zero of hold circuit 2225 to clock signal CLK2 when clock signal CLK2 is a logic zero, preventing a glitch on node CLK3.)

In the foregoing example, both select signals SEL1 and SEL2 are de-asserted (i.e., 00) when switching between clock CLK1 and clock CLK2. In practice, select signals SEL1 and SEL2 can be complementary signals, in which case only one of them can be de-asserted at a time. Control logic 2210 still enters hold state 11, when switching between states 01 (select clock CLK1) and 10 (select clock CLK2).

Whichever of clock signals CLK1 and CLK2 is selected, the respective one of clock-enable signals CEN1 and CEN2 can be used to synchronously start and stop the output clock signal on node CLK3. Each clock-enable signal CEN1 and CEN2 is synchronous with respect to the associated clock signal, and is thus timed to meet the set-up and hold time requirements of respective clock-state generators 2215A and 2215B.

Control logic 2210 synchronizes select signals SEL1 and SEL2 with corresponding clock signals CLK1 and CLK2. When switching away from clock signal CLK1, for example, control logic 2210 awaits the arrival of a clock edge on clock terminal CLK1 before de-asserting (high) state signal ST1b to switch away from clock signal CLK1. Because control logic 2210 awaits a clock edge before switching away from clock signal CLK1, control logic 2210 cannot switch away from a failed (non-transitioning) clock by simply de-asserting the corresponding select signal.

Each of clock-state generators 2215A and 2215B receives a corresponding clock-ignore signal CIG1 and CIG2. Asserting a clock-ignore signal renders the associated sub-block transparent, so select signals propagate directly through the sub-block in the absence of a clock. When clock-ignore signal CIG1 is asserted, for example, de-asserting select signal SEL1 causes state signal ST1b to transition to a logic one regardless of whether clock signal CLK1 transitions. Clock ignore terminal CIG1 thus enables clock-control circuit 2210 to transition away from a failed clock. The assertion of a clock-ignore signal does not alter the logical operation of select signals SEL1 and SEL2, which still function as summarized above in connection with Table 1.

Figure 11C:
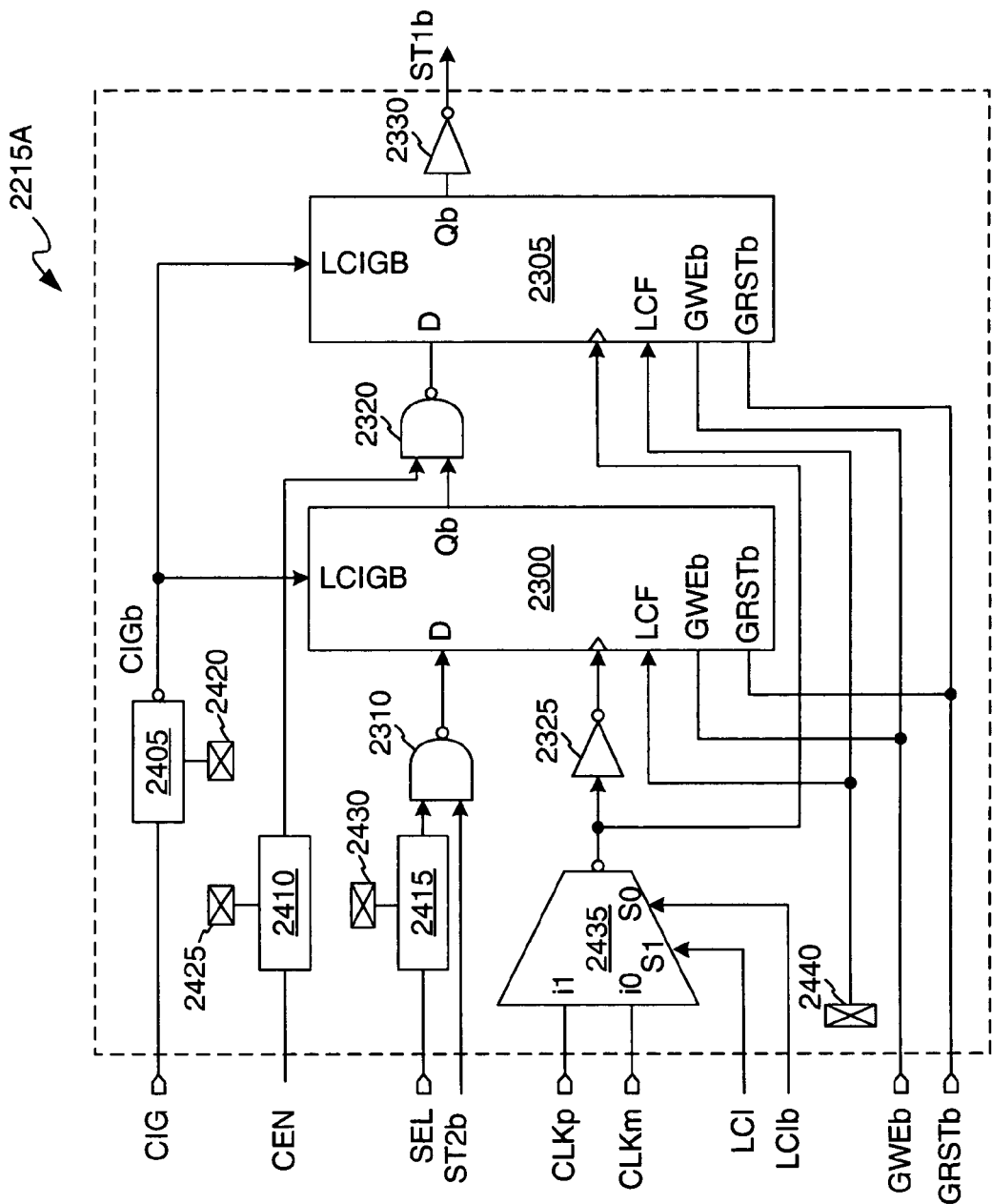
FIG. 11C details a clock-state generator of an embodiment of the present invention.

FIG. 11C details a clock-state generator 2215A of an embodiment of the present invention. Clock-state generator 2215A uses differential clock signals (e.g., clock signal CLK1 is made up of differential half signals CLKp and CLKm). Clock-state generator 2215B has the same or similar circuit as clock-state generator 2215A.

Three configurable inverters 2405, 2410, and 2415 provide flexibility by allowing the user to optionally invert the sense of each of control signals CIG, CEN, and SEL. These inverters are controlled by respective memory cells 2420, 2425, 2430, each an SRAM cell in one embodiment.

A multiplexer 2435 receives differential clock signals CLKp and CLKm, providing one or the other in response to complementary signals LCI and LCIb, and consequently determining which one of differential-clock signals CLKm and CLKp triggers latches 2300 and 2305. Circuit 2215 is negative-edge triggered when signal LCI is a logic zero. Latch 2300 transmits a signal Qb complementary to the signal on its data terminal D when the output of multiplexer 2435 transitions to a logic one, and latch 2305 transmits a respective signal Qb complementary to the signal on its respective data terminal D when the output of multiplexer 2435 transitions to a logic zero.

A latch-configure terminal LCF connects to a latch-configure-memory cell 2440, a global-write-enable terminal GWEb receives a global-write-enable signal GWEb, and a global-reset terminal GRSTb receives a global reset signal GRSTb. Latch-configure memory cell 2440 can be configured to pre-select one of clock signals CLK1 or CLK2 for transmission when global-reset signal GRSTb is asserted (low). When signal GRSTb is de-asserted (high), the control of circuit 1128 reverts back to the select and clock-enable signals.

Clock-state generator 2215A is adapted for use in a programmable logic device in which a global-write-enable signal GWEb is de-asserted (high) during configuration or reconfiguration. Signal GWEb, being high, renders latches 2300 and 2305 insensitive to respective control signals, holding latches 2300 and 2305 in their current states when asserted. If signal LCF is logic zero, global-reset signal GRSTb sets latches 2300 and 2305 to transmit logic zeroes on their respective Qb output terminals.

Figure 11D:
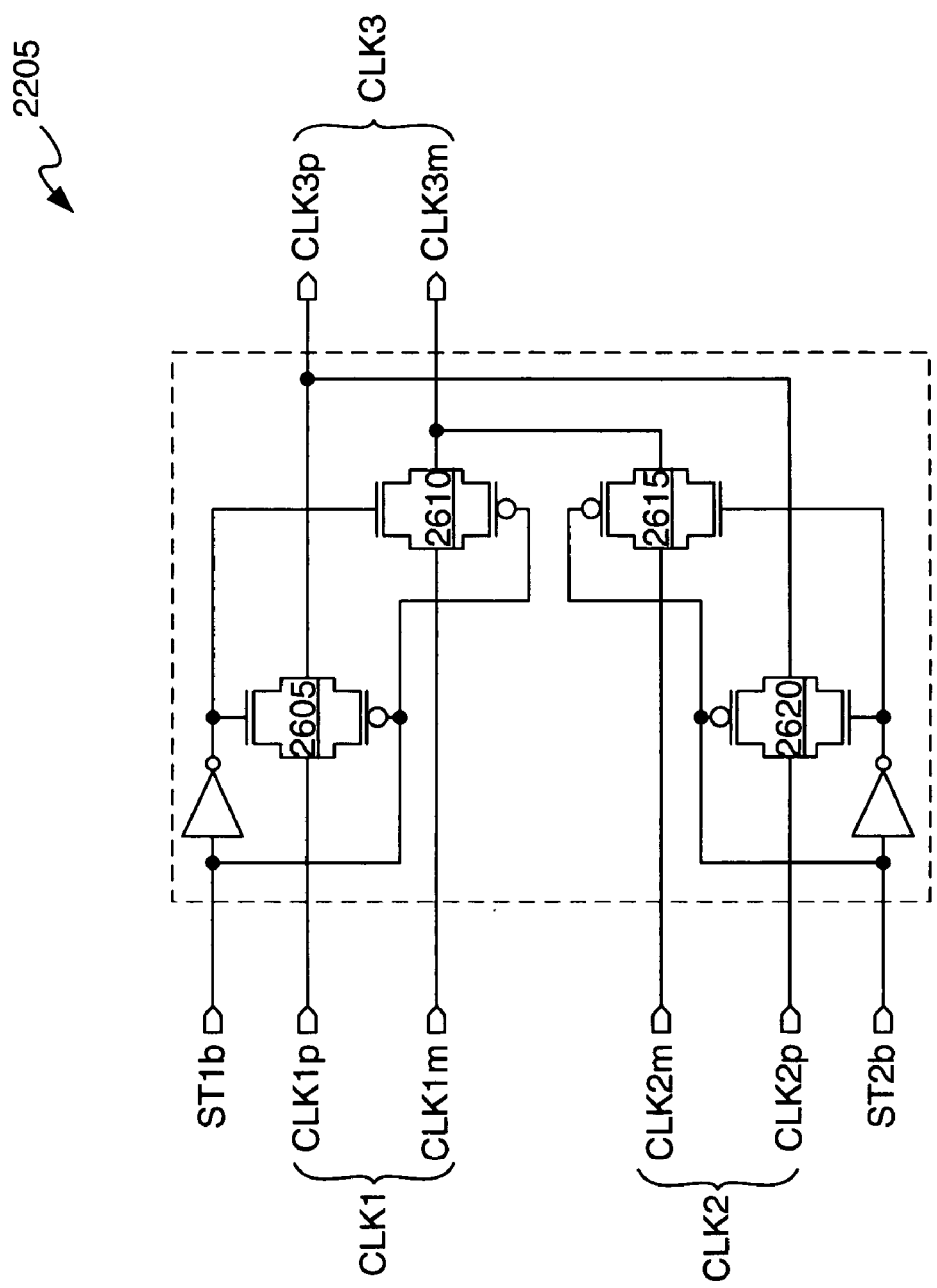
FIG. 11D details a multiplexer in the embodiment in which clock-control circuit is adapted for use with differential clock signals.

FIG. 11D details a multiplexer 2205 in the embodiment in which clock-control circuit 200 is adapted for use with differential clock signals (e.g., CLK1 CLK1p/CLK1m and CLK2=CLK2p/CLK2m).

State transition signals ST1b and ST2b control whether nodes CLK3p/CLK3m are connected to first clock signal CLK1p/CLK1m, second clock signals CLK2p/CLK2m, or neither. Transmission gates 2605 and 2610 turn on when state signal ST1b is a logic zero, connecting first differential clock signal CLK1p/CLK1m to corresponding nodes CLK3p/CLK3m. Transmission gates 2615 and 2620 turn on when state signal ST2b is a logic zero, connecting second differential clock signal CLK2p/CLK2m to corresponding nodes CLK3p/CLK3m. As discussed earlier with respect to FIG. 11B, state signals ST1b and ST2b may both be logic one, in which case both input clock signals are disconnected from nodes CLK3p and CLK3m. State signals ST1b and ST2b may not simultaneously transition to logic zero, in this embodiment, as this condition would short the two input clock signals.

Figure 11E:
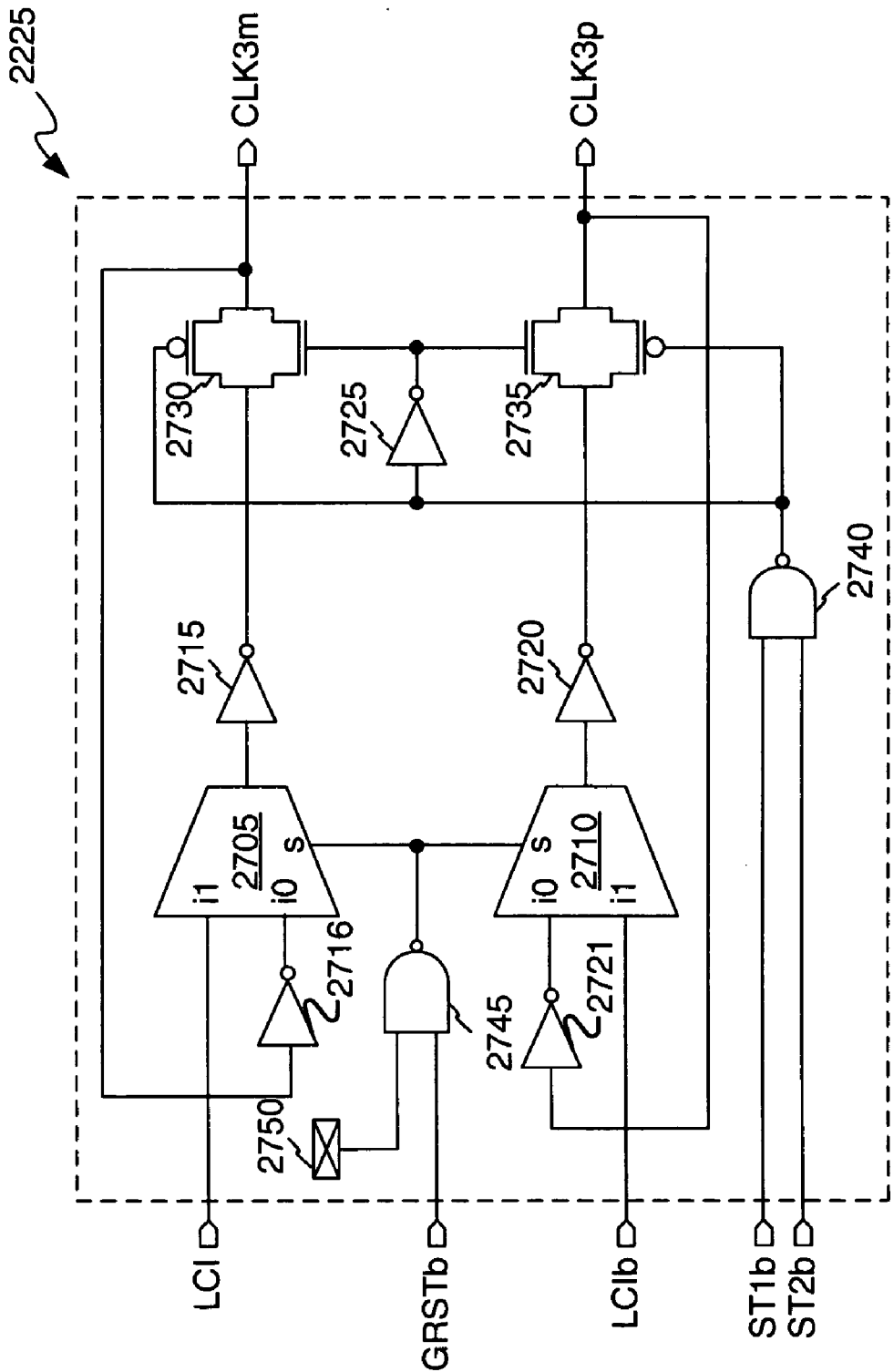
FIG. 11E details a hold circuit in the embodiment in which clock-control circuit is adapted for use with differential clock signals.

FIG. 11E details a hold circuit 2225 in the embodiment in which clock-control circuit 1128 is adapted for use with differential clock signals (e.g., CLK1=CLK1p/CLK1m and CLK2=CLK2p/CLK2m). Circuit 2225 includes multiplexers 2705 and 2710, inverters 2715, 2716, 2720, 2721, and 2725, transmission gates 2730 and 2735, and NAND gates 2740 and 2745. A logic bit stored in a memory cell 2750 determines whether circuit 2225 forces the values of signals LCI and LCIb on respective nodes CLK3*m* and CLK3*p* or simply maintains the output nodes in their current logic state when state signals ST1*b* and ST2*b* are logic one.

When memory cell 2750 and global-reset signal GRSTb both provide logic ones, hold circuit 2225 has two keeper circuits (the first keeper circuit for CLK3*m* having inverters 2715 and 2716 and the second keeper circuit for CLK3*p* having inverters 2720 and 2721) that maintain the current logic state of nodes CLK3*m* and CLK3*p*. When memory cell 2750 is a logic zero or global-reset signal GRSTb is asserted (logic 0), NAND gate 2745 causes multiplexers 2705 and 2710 to convey complements of signals LCI and LCIb to respective transmission gates 2730 and 2735 via inverters 2715 and 2720. Then, when state signals ST1*b* and ST2*b* both transition to logic one, signals LCI and LCIb drive respective nodes CLK3*m*/CLK3*p* to logic states that are complementary to respective signals LCI and LCIb. Recall that latch-clock-invert signals LCI/LCIb determine whether clock control circuit 1128 is positive- or negative-edge triggered. If positive-edge triggered, then hold circuit 2225 should hold output terminals CLK3*m*/CLK3*p* at a logic zero during transitions. To this end, hold circuit 2225 maintains output nodes CLK3*m* and CLK3*p* at the inverse of signals LCI and LCIb when state signals ST1*b* and ST2*b* are both one.

Maintaining output nodes CLK3*m* and CLK3*p* at the inverse of signals LCI and LCIb when in state 11 (i.e., ST1*b*=1 and ST2*b*=1) is important for two reasons. First, when clock-control circuit 1128 is positive-edge triggered, asserting (de-asserting) a select signal connects (disconnects) the selected clock when the clock is in a logic zero state. Hold circuit 2225 therefore holds the output terminals in a logic zero state when neither input clock is selected to avoid introducing a glitch on the output. Second, if a selected clock fails in the wrong state, e.g., stops in a logic one state when signal LCI is a logic one, hold circuit 2225 brings output nodes CLK3*m*/CLK3*p* to levels representative of a logic zero to provide a glitch-free transition from the hold-state to the next clock signal.

Further details on the BUFG_CTRL 1128 are disclosed in U.S. application Ser. No. 10/453,235, titled, Glitchless Dynamic Multiplexer with Synchronous and Asynchronous Controls, by Vasisht M. Vadi, et. al., filed Jun. 2, 2003, which is herein incorporated by reference.

As shown in FIG. 11A BUFG_MUX 224 is for the bottom half of the PLD, while BUFG_MUX 222 is for the top half of the PLD. The BUFG_MUX 222 circuitry is similar to BUFG_MUX 224. BUFG_MUX 222 receives 32 mux_clk 1112 signals from IOBs and DCMs on the top part of the PLD, 32 interconnect_clk 1114 signals from the programmable fabric on the top part of the PLD, and 4 MGT_clk 1116 signals from the MGTs on the top part of the PLD. BUFG_MUX 222 outputs 16 gclk 1118 to the clock tree backbone 42.

More specifically, BUFG_MUX 224 is the height of 12 CLBs and has BUFG_CTRL 1128 with associated drivers 1130 which drive the global clock (gclk) signals up and down the entire vertical spine of the chip. In one embodiment, the input muxed_clk_A 1124 and muxed_clk_B 1126 differential clock signals to the 2:1 BUFG_CTRL 1128, in the default state, come from a CLK_IOB or a CLK_DCM block. The muxed_clk_A and B wires each have a specific relationship with a particular differential multiplexer in BUFG_CTRL 1128, (called bufg_ctrl[0] to bufg_ctrl[15] for the 16 2:1 multiplexers in BUFG_CTRL 1128). Thus muxed_clk_A[0] and muxed_clk_B[0] feed bufg_ctrl[0] which generates gclk[0] as its output.

Since bufg_mux[0:15] of BUFG_MUX 224 are fed by the DCM/IOB from the bottom half of the chip and bufg_mux[16:31] of BUFG 222 are fed by the DCM/IOB from the top half of the chip, there are a total of 32 BUFG_MUXs, 32 gclk output signals, and 64 muxed_clk_A/B signals. Though 16 of these clocks originate in the top half of the IC and 16 from the bottom of the IC, all 32 of the gclk outputs span the entire vertical spine of the IC and can thus be routed to any part of the IC.

With reference to FIG. 11A and FIG. 5A, each muxed_clk wire (e.g., dcm_mux_clk 582, dcm_mux_clk 576, and mux_clk 558 in FIG. 5A) passes through a 2:1 bypass multiplexer (e.g., 2:1 multiplexers 572 and 554) before reaching the BUFG_MUX 224. In one embodiment, the default setting of the 24:1 multiplexer 1120 is to let the muxed_clk signals 558 from the DCMs or IOBs feed straight through into the BUFG_CTRL 1128.

The other inputs to the 32 24:1 multiplexers 1120 are from: 1) any of 2 signals from the PLD programmable interconnect structure, i.e., from the 32 interconnect_clk 1110 lines, 2) any of 16 gclk 1132 lines looped back from BUFG_CTRL 1128, 3) any of 2 signals from the 32 muxed_clk 558 lines, or 4) any of the 4 MGT_clk 1111 lines. The interconnect_clk 1110 comes from the left side of the CFG_CENTER 20 (see FIGS. 4A/B) and is then routed to the BUFG_MUX 224, where single-ended to differential converters 1142 converts the upto 32 interconnect signals from the programmable fabric of the FPGA to a rail-to-rail differential signal before it reaches the 24:1 multiplexers 1120.

One reason for looping back the 16 gclk signals 1132 to BUFG_CTRL 1128 is to support users who may wish to dynamically switch between more than 2 clocks. Hence the output of one 2:1 multiplexer of BUFG_CTRL 1128 can be sent to another 2:1 multiplexer of BUFG_CTRL 1128. By chaining several 2:1 multiplexers in this manner the user can dynamically switch between more than 2 clocks. This cascading of 2:1 multiplexers in effect builds larger clock multiplexers. For example, a 4:1 multiplexer can be built up from 3 2:1 multiplexers (see FIG. 12).

The two muxed_clk signals from muxed_clk 558 that feed each 24:1 multiplexer 1120 have a specific relationship, in one embodiment of the present invention. Both muxed_clk[0] and muxed_clk[16] feed into the pair of multiplexers that generate muxed_clk_A[O] and muxed_clk_B[0]. The default setting of each pair of the 24:1 multiplexers is such that muxed_clk_A[0] defaults to muxed_clk[0] and muxed_clk_B[0] defaults to muxed_clk[16].

Figure 12:
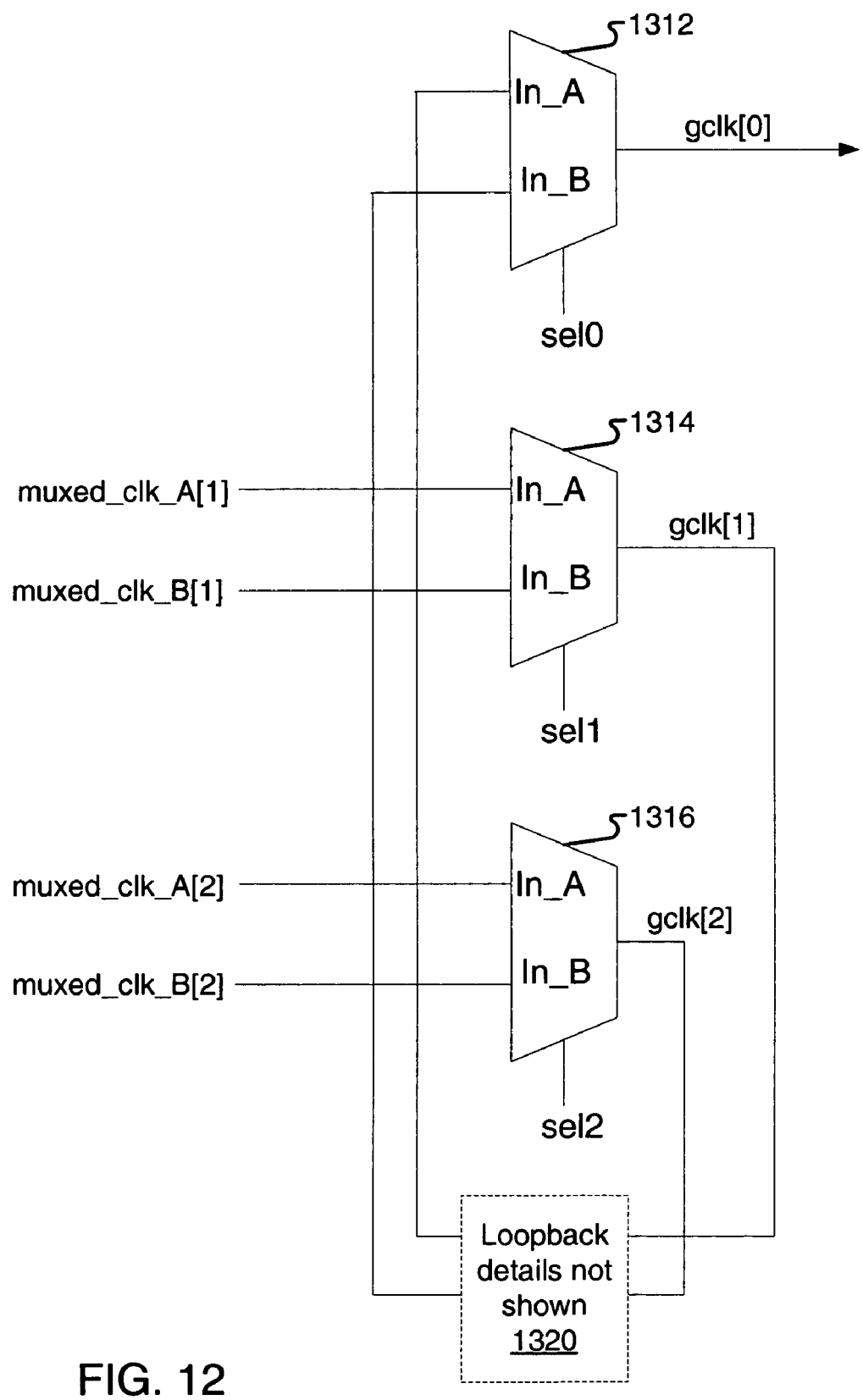
FIG. 12 is an example of using 3 BUFG_CTRL 2:1 multiplexers to create a 4:1 multiplexer.

FIG. 12 is an example of using 3 BUFG_CTRL 2:1 multiplexers to create a 4:1 multiplexer. The 3 2:1 multiplexers 1312, 1314, 1316 are part of the 16 differential multiplexers of BUFG_CTRL 1128 in FIG. 11. Like the figures previously, multiplexers 1312, 1314, 1316 are shown as single ended to simplify explanation. The loop back details 1320 include gclk 1132, ss→rr converters 1146, and 24:1 multiplexers 1120 and are not shown. One of the 4 inputs into the created 4:1 multiplexer, i.e., muxed_clk_A[1], muxed_clk_B[1], muxed_clk_A[2], or muxed_clk_B[2], are selected by sel0, sel1, and sel2 and sent to output gclk[0]. The created 4:1 multiplexer is formed from cascading the outputs of 2:1 multiplexers 1314 and 1316 into 2:1 multiplexer 1312 by looping back the outputs via 1320.

Figure 13:
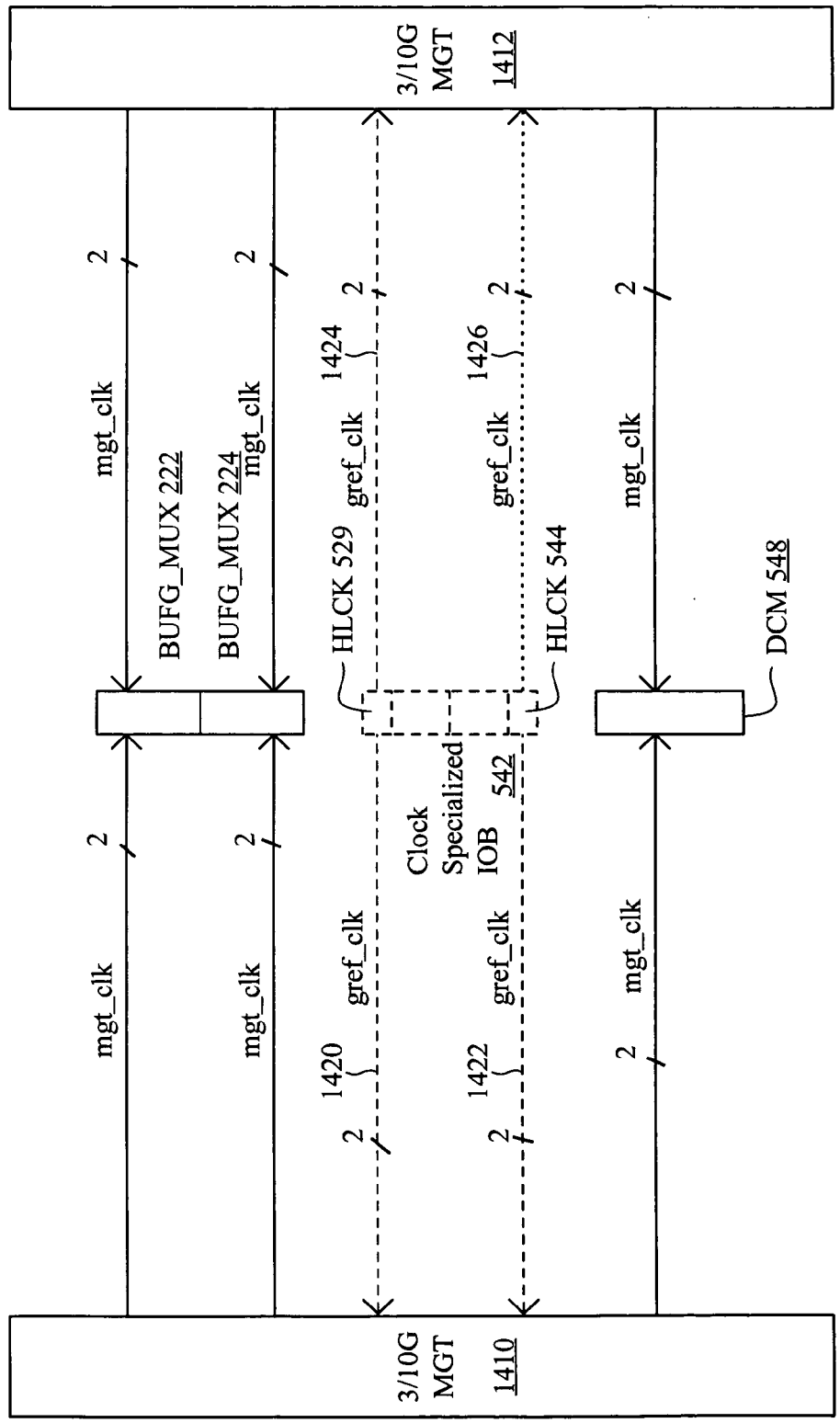
FIG. 13 is a schematic of the MGT clocks supplied to the clock tree backbone of an embodiment of the present invention.

FIG. 13 is a schematic of the MGT clocks supplied to the clock tree backbone of an embodiment of the present invention. In one embodiment there are two columns of 10 Gigahertz MGT circuitry, one on each end of the PLD. In another embodiment there is a column of 3 Gigahertz MGT circuitry on each end of the PLD. In yet another embodiment there is a column of 10 Gigahertz MGT circuitry on only one end of the PLD. In a further embodiment there are one or more columns of MGTs in the middle or interior of the PLD. Other embodiments may have various combinations of 3 Gigahertz, 10 Gigahertz, or no MGT columns on the PLD. MGT 1410 supplies 2 mgt_clk differential clock signals to BUFG_MUX 222 and 2 mgt_clk differential clock signals to BUFG_MUX 224. MGT 1412 supplies 2 mgt_clk differential clock signals to BUFG_MUX 222 and 2 mgt_clk differential clock signals to BUFG_MUX 224. MGT 1410 supplies 2 mgt_clk differential clock signals to a DCM, e.g., DCM 548, and MGT 1412 supplies 2 more mgt_clk differential clock signals to, e.g., DCM 548.

Hence in total 4 differential clocks from the left MGTs 1410 and 4 differential clocks from the right MGTs 1412 can feed directly into the BUFG_MUXs 222/224 in the center of the chip, and 2 differential clocks from each MGT column can be fed into each group of four DCM circuits. From a DCM the MGT clocks can reach the BUFG_MUXs and the entire global clock tree.

In another embodiment of the present invention in either the CLK_IOBs, or 2 of the Clock IBUF pairs, or both, there are buffers that can drive these clock signals from the Clock IBUFs all the way across the chip to act as reference clocks for the MGTs. These buffers drive a differential shielded signal called gref_clk (1420/1422 and 1426/1426) down each HCLK row to the MGTs (1410 and 1412). The 10G and the 3G MGTs also have separate dedicated Refclk pins. The 10G MGTs can use their dedicated Refclk pins because of minimum-jitter considerations or the 10G MGTs can use gref clock to allow the reference clock of the MGT to come from one or more IOBs or DCMs.

In an alternative embodiment a clock specialized IOB, e.g., clock IOB 542, supplies upto 4 external differential clocks (gref_clk 1420 and gref_clk 1422) to MGTs 1410 and upto 4 external differential clocks (gref_clk 1424 and gref_clk 1426) to MGTs 1412.

FIGS. 14–17 discusses more specifically the driver rr→ss (see FIG. 15), differential converter ss→rr (see FIG. 16), and single ended converter ss→se (see FIG. 17) circuitry of embodiments of the present invention. With reference to FIG. 5B, the main trunk 42 (gclk) of the global clock tree is small signal differential and connected to small signal differential rows (hclk) via pass gate multiplexers such as that shown in FIGS. 14A/B. Because the pass gate multiplexers are rail-to-rail differential, there are one or more small signal to rail-to-rail differential converters (ss→rr) at the input of the pass gate multiplexers and one or more rail-to-rail to small signal differential drivers (rr→ss) at the output of the pass gate multiplexers, where the rr→ss drivers, include both rail-to-rail to small signal converters and line drivers. For example, in FIG. 5B small signal differential gclk 42 is converted via ss→rr 520 to the rail-to-rail differential inputs of 8 32:1 multiplexer 524R. The rail-to-rail differential outputs of 8 32:1 multiplexer 524R are converted to small signal differential lines 527 of hclk by rr→ss drivers 526R. The small signal differential lines 527 feed the HCLK block 528.

With reference to FIG. 6A if the HCLK block is part of a CLB, e.g., HCLK 630, the small signal differential lines 612 of hclk are converted to rail-to-rail single ended clocks for use by the CLBs 614 A/B by ss→se converters (see FIG. 17) 632.

Figure 14A:
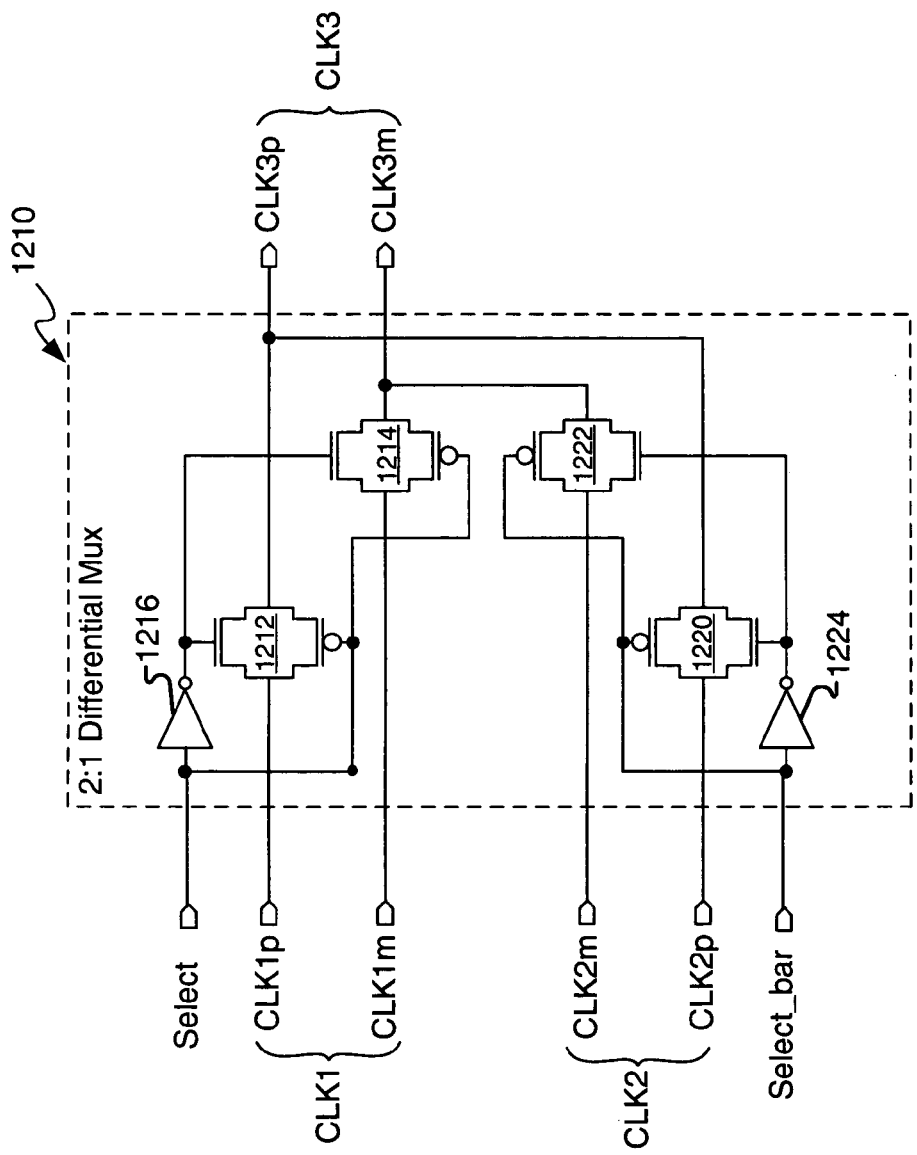
FIG. 14A is an example of a 2:1 pass gate differential multiplexer used in some embodiments of the present invention.

FIG. 14A is an example of a 2:1 pass gate differential multiplexer 1210 used in some embodiments of the present invention. Differential multiplexer 1210 includes transmission gates (or pass gates) 1212, 1214, 1220, and 1222, and inverters 1216 and 1224. Differential multiplexer 1210 receives two rail-to-rail differential clock signals, CLK1 (CLK1*p* and CLK1*m*) and CLK2 (CLK2*p* and CLK2*m*). Differential multiplexer 1210 selects one of these two differential clocks, depending upon the value of select and select_bar (the inverse of select) and outputs rail-to-rail differential clock signals CLK3*p* and CLK3*m*. As this CMOS differential multiplexer 1210 is well known to one of ordinary skill in the art, further description is omitted. In another embodiment the 2:1 differential multiplexer 1210 can be implemented as a well-known analog multiplexer.

Figure 14B:
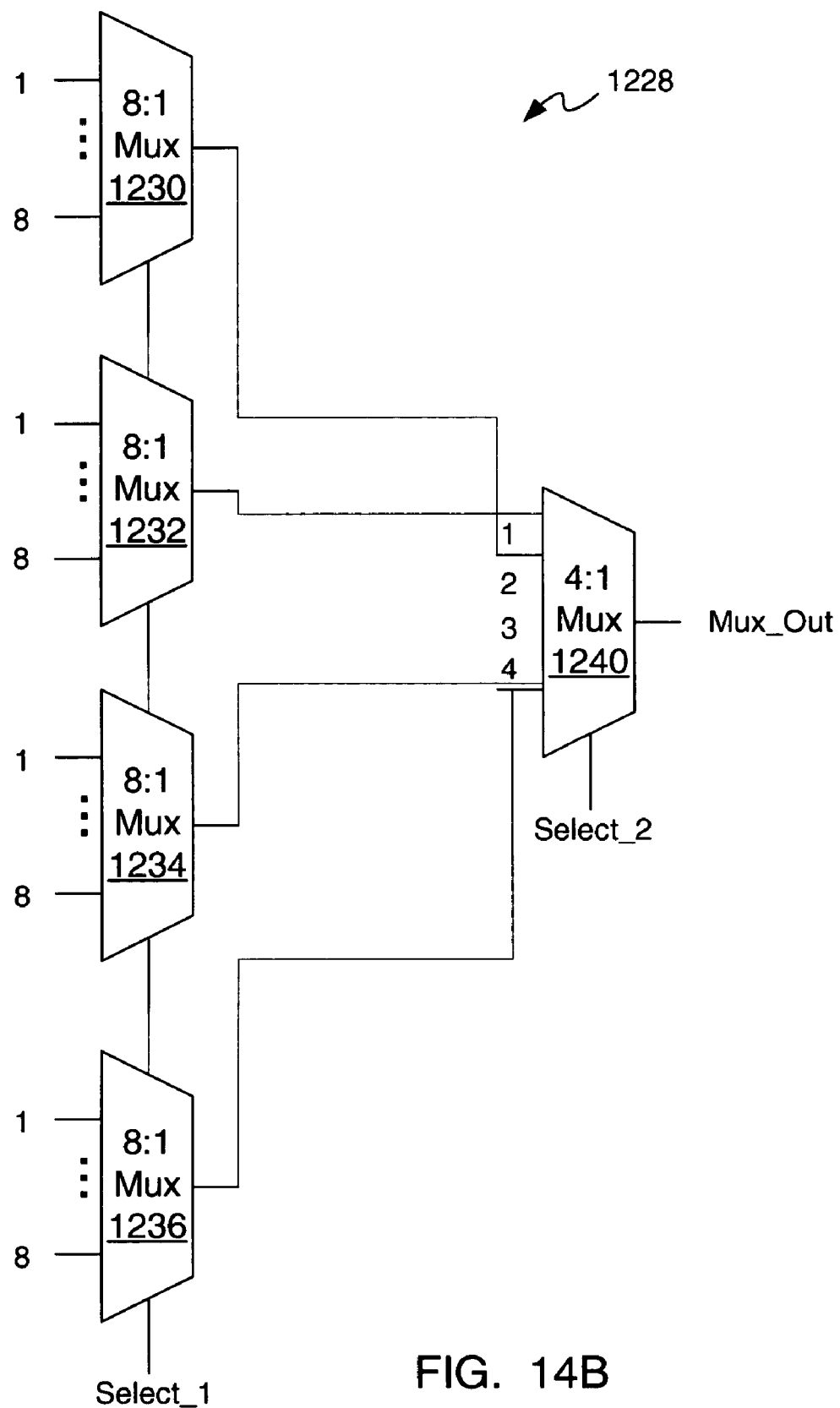
FIG. 14B is an example of a 32:1 pass gate differential multiplexer used in some embodiments of the present invention.

FIG. 14B is an example of a 32:1 pass gate differential multiplexer 1228 used in some embodiments of the present invention. Examples of use of the 32:1 differential multiplexer 1228 include multiplexers 524L, 524R, and 525 in FIGS. 5A and 5B. 32:1 differential multiplexer 1228 includes four 8:1 differential multiplexers 1230, 1232, 1234, and 1236, that are connected to a 4:1 differential multiplexer 1240. The 32 input signals are divided into four groups of 8 signals each, where each group goes to one of the four 8:1 differential multiplexers. The four 8:1 differential multiplexers 1230, 1232, 1234, and 1236 all have the same select lines select_1 such that when input signal line n of multiplexer 1230 is selected by select_1, then input signal line n of multiplexer 1232, input signal line n of multiplexer 1234, and input signal line n of multiplexer 1230 are also selected, where n is a number from 1 to 8. The outputs of each of the 8:1 multiplexers are input into the 4:1 multiplexer 1240. Select lines select_2 select one of the four input lines to be sent to output mux_out.

Figure 15:
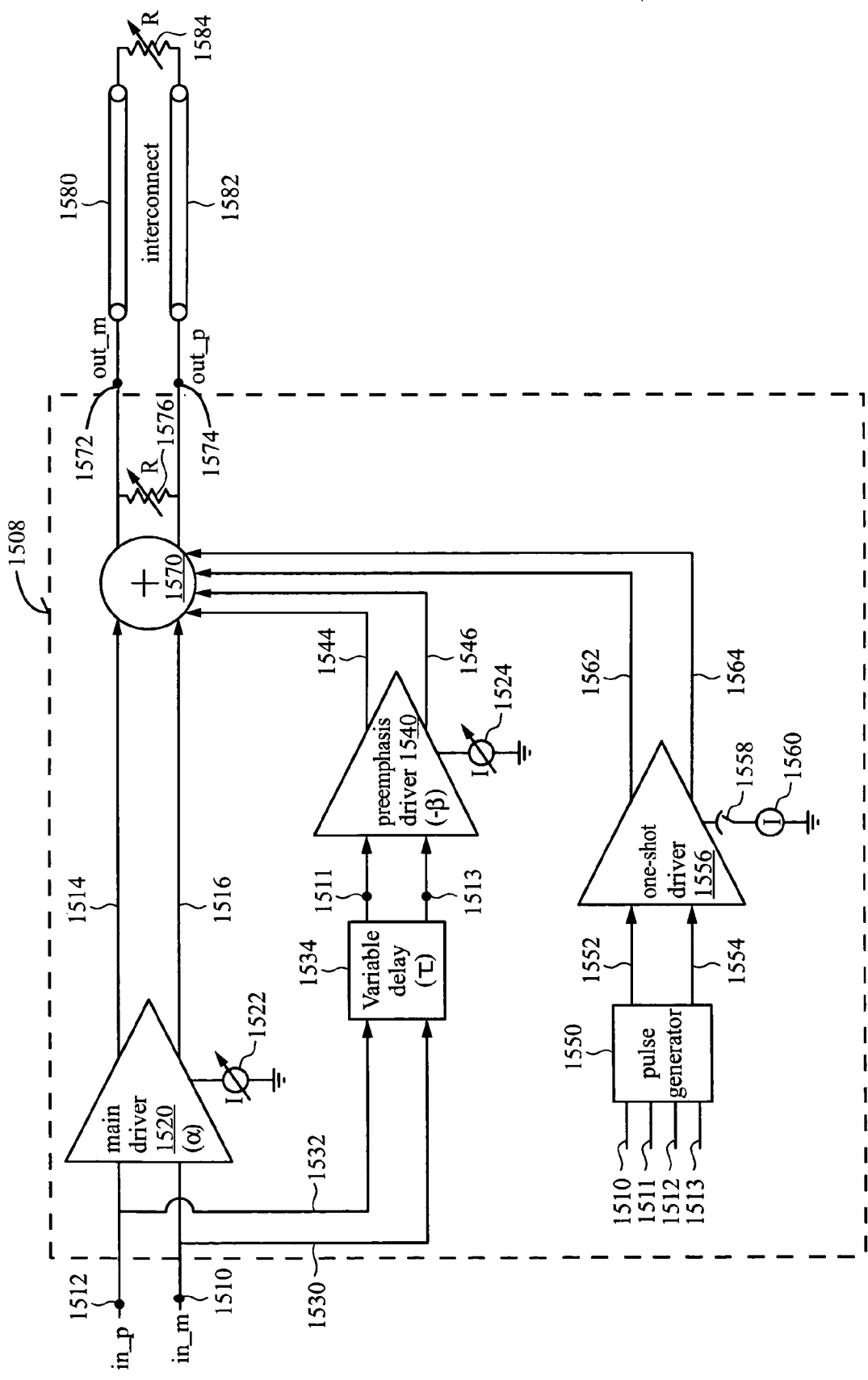
FIG. 15 is a block diagram of a rail-to-rail to small signal differential driver (rr→ss) of an embodiment of the present invention.

FIG. 15 is a block diagram of a rail-to-rail to small signal differential driver (rr→ss) 1508 of an embodiment of the present invention. Driver 1508 converts rail-to-rail differential inputs (e.g., Vdd ~1.2 volts and ~0 volts) in_p (plus input) 1512 and in_m (minus input) 1510 to small signal differential outputs (e.g., ~800 mv and ~500 mv) out$_{13}$ p (plus output) 1574 and out_m (minus output) 1572. Differential driver 1508 has inputs in_m 1510 and in$_{13}$ p 1512 connected to main driver 1520 with gain α, programmable delay (τ) 1534, and pulse generator 1550. The outputs 1511 and 1513 of variable delay 1534 are connected to pre-emphasis driver 1540 with gain (–β) and to pulse generator 1550. Pulse generator 1550 produces pulses of duration τ on its output lines 1552 and 1554. The output lines 1552 and 1554 are connected to one-shot driver 1556. An adder circuit 1570 receives outputs 1514/1516 of main driver 1520, outputs 1544/1546 of pre-emphasis driver 1540, and outputs 1562/1564 of one-shot driver 1556. Programmable resistance R 1576 which is connected across adder's 1570 differential outputs out_m 1572 and out_p 1574. Programmable impedance or programmable resistance R 1576 assists in controlling the differential output voltage swings. Outputs out_m 1572 and out_p 1574 are connected to interconnect lines 1580 and 1582 respectively. There is a programmable termination impedance or programmable termination resistance R 1584 (similar in structure to programmable resistance R 1576) at the end of interconnect lines 1580/1582, e.g. at an edge of the IC, for reducing reflections. With reference to FIG. 5B, an example of a driver is 526R with an example interconnect line hclk 512R. The termination resistor R 1584 would be located at the end of hclk 512R, i.e., near the edge of the IC.

The two push-pull current drivers, i.e., main driver 1520 (α gain) and pre-emphasis driver (−β gain) 1540, supply the bulk of the line driver current to the interconnect lines 1580/1582. These two drivers have programmable current sources, e.g., 11522 and 11524 for main driver 1520 and secondary driver 1540, respectively, that allow for increasing or decreasing the static power. In one embodiment the current in current source 1524 is proportional to the current in current source 1522. The pre-emphasis driver 1540 has a gain (β) that is different from the gain (α) of the main driver 1520. In one embodiment |β|<|α|, i.e., the pre-emphasis driver 1540 has a gain that is less than that of the main driver 1520. The pre-emphasis driver 1540 in function amplifies by β a delayed (by τ) differential input signal in_p/in_m 1512/1510 and inverts the output (hence the −β gain). The effect of the pre-emphasis driver 1540 is to boost the output current of driver 1508 at the high frequencies to compensate for the high frequency loss on interconnect 1580/1582.

A self-timed one-shot driver 1556 is active only during switching to improve the slew rate of the differential output 1572/1574. The pulse generator 1550 produces a rail-to-rail pulse of time duration τ, which turns on one-shot driver 1556 for a time period τ. The rest of the time one-shot driver 1556 is off and uses substantially no static power. The one-shot driver 1556 gives a further, but smaller boost, to the output current of driver 1508 in addition to the boost given by pre-emphasis driver 1540 at high frequencies (e.g., at the transition edges of the signal). The one-shot driver 1556 is connected to a switch 1558, which is in turn connected to a constant current source 1560. The switch allows for the one-shot driver 1556 to be programmably disabled if the one-shot driver 1556 is not needed, for example, in parts of relatively small size.

In one embodiment of the present invention the programmable current sources 11522 and 11524, the switch 1558, programmable delay element 1534, programmable swing control R 1576, and programmable termination R 1584 are programmed by setting the values in the configuration memory of the PLD, for example an FPGA. In other embodiments the programming is done by setting one or more random access memory cells or one or more directly addressable memory cells one or more non-volatile memory cells or one or more configuration memory cells or any combination thereof.

Further details of the rail-to-rail to small signal differential driver (rr→ss) 1508 in FIG. 15 are disclosed in concurrently filed US patent application entitled "A Small Signal Differential Driver Circuit," by Atul V. Ghia and Adebabay M. Bekele, which is herein incorporated by reference.

Figure 16:
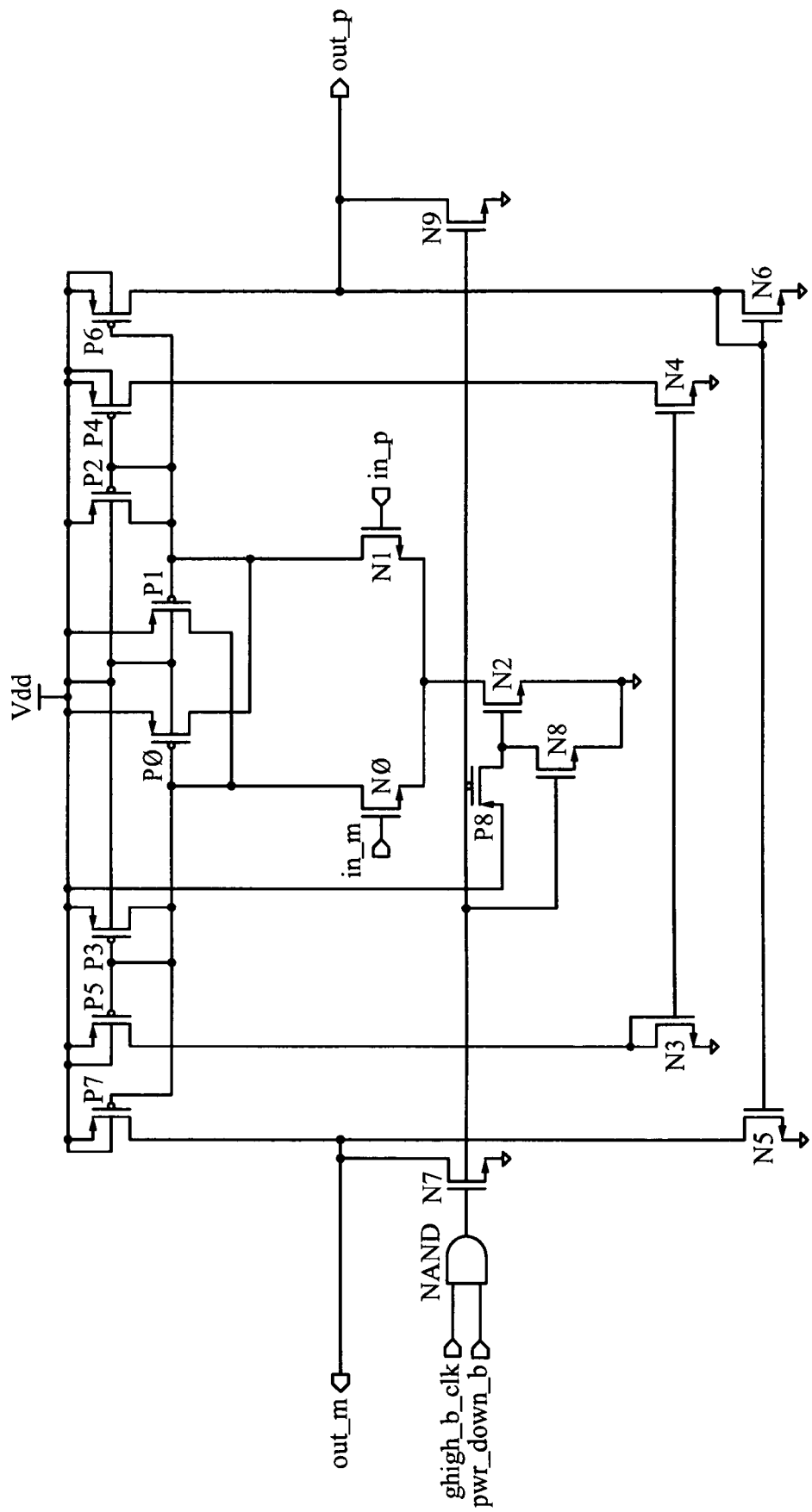
FIG. 16 is a circuit schematic of a small signal to rail-to-rail differential converter (ss→rr) of an embodiment of the present invention.

FIG. 16 is a circuit schematic of a small signal to rail-to-rail differential converter (ss→rr) 1610 of an embodiment of the present invention. As an illustrative example, let in_p be 800 mv and in_m be 500 mv for a logical 1 and in_p be 500 mv and in_m be 800 mv for a logical 0.

For a logical 1, in_p is 800 mv, NMOS transistor N1 starts to pull node 1612 to ground. PMOS transistor p1 is turned on pulling node 1614 toward Vdd. PMOS transistor p1 pulls node 1614 up more than NMOS transistor N0, which has in_m at 300 mv, pulls node 1614 down. PMOS transistors p2, p4, and p6 are substantially on, while PMOS transistors p3, p5 and p7 are substantially off. The current mirrors formed by transistors p2, p4, and p6, means that out_p is pulled toward Vdd by transistor p4. NMOS transistor n4 has substantially no current flowing through it as its current mirror NMOS transistor N3 has substantially no current as PMOS transistor p5 is substantially off. Hence out_p has current supplied by transistor p4. The current through transistor p6 flows through NMOS transistor N6 and its current mirror NMOS transistor N5. Thus out_m is pulled toward ground as transistor p7 is substantially off. Therefore for a logical 1 with small signal differential in_p at 800 mv and in_m at 300 mv the rail-to-rail output is out_p at Vdd and out_m at ground.

For a logical 0, since the differential converter 1610 is symmetrical, for small signal differential in_p at 300 mv and in_m at 800 mv the rail-to-rail output is out_p at ground and out_m at Vdd.

FIG. 16 shows a power down circuit including a NAND gate connected to the gate of NMOS transistor N7. When either a power down signal is asserted (pwr_down_b=0, where b stands for bar or inverse) or a ghigh clock signal is asserted (ghigh_b_clk=0), then the output of NAND is 1 turning on NMOS transistors n7 and n9 and grounding out_p and out_m. In addition NMOS transistors n8 is turned on, thus turning off NMOS transistor N2 and shutting off the differential input circuit receiving in_p and in_m. When both pwr_down_b and ghigh_b_clk are 1 then NMOS transistors n7, n8, and n9 are off. PMOS transistor p8 is on, turning on NMOS transistor n2 and the differential input circuit receiving in_p and in_m.

In one aspect of the present invention the converter 1610 is substantially turned off and the differential outputs (out_p and out_m) grounded, when a power down bit is set to 1 in a configuration memory cell of a PLD or a configuration flag (ghigh) is 1, i.e., after power is turned on to the PLD and during initial configuration of a PLD, ghigh_b_clk is set to 0. Thus static power from differential driver 1610 is reduced via either power down when the driver 1610 is not in use or during the initial configuration of the PLD.

Figure 17:
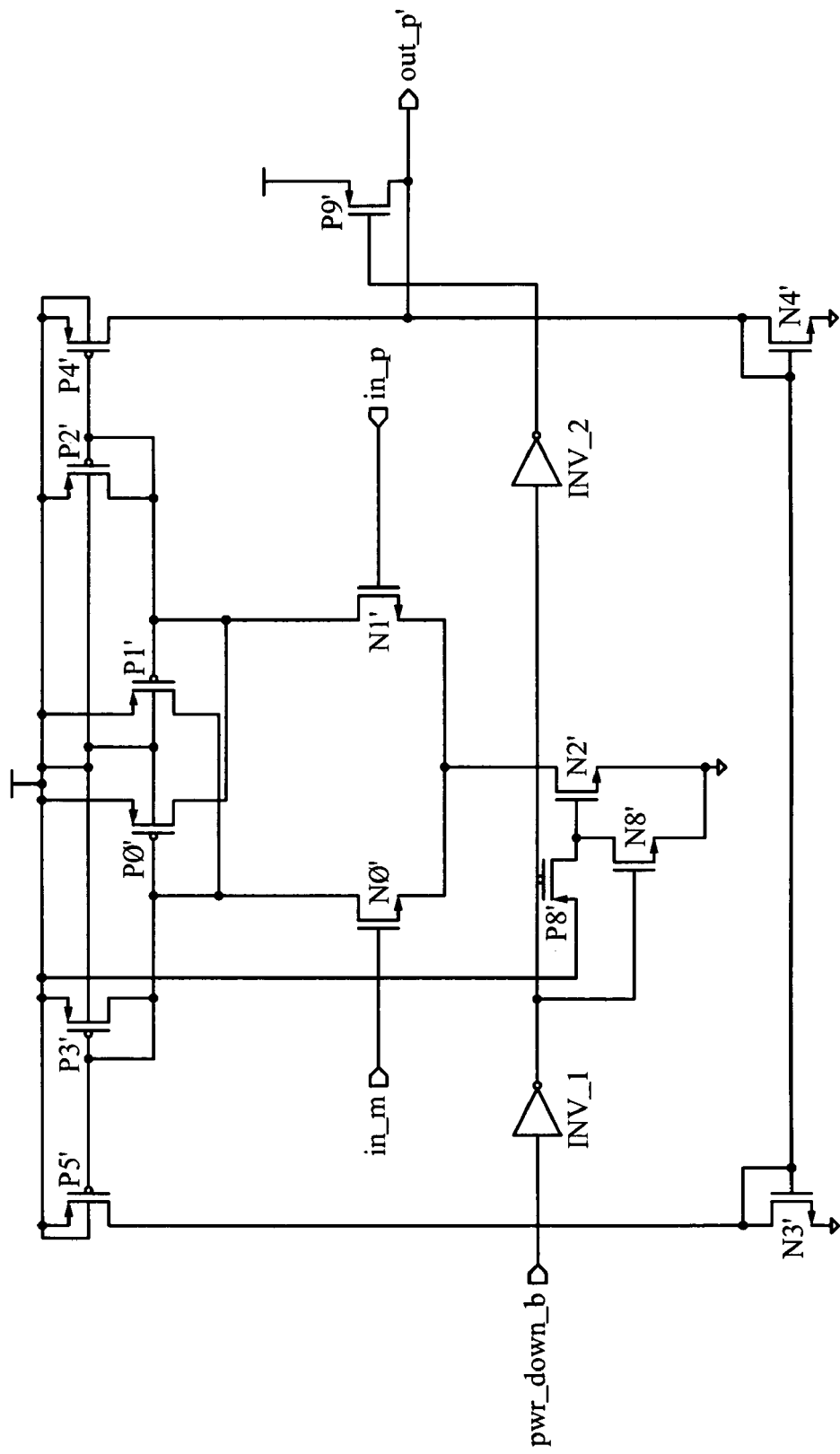
FIG. 17 is a circuit schematic of a small signal to rail-to-rail single ended converter (ss→se) of an embodiment of the present invention.

FIG. 17 is a circuit schematic of a small signal to rail-to-rail single ended converter (ss→se) 1710 of an embodiment of the present invention. FIG. 17 is similar to FIG. 16, except for the power down circuitry and FIG. 17 is missing the out_m leg with the associated PMOS p6, p7 and NMOS n5, n6 transistors. To show the similarity the PMOS and NMOS transistors labels in FIG. 17 have the same label as FIG. 16 but with a prime, for example n0 in FIG. 16 and n0' in FIG. 17. The function of converter 1710 is similar to converter 1610, except only the plus output out_p is used.

In FIG. 17 the power down bit is stored in a configuration memory cell in one embodiment and its inverse pwr_down_b' is sent to inverter INV_1. When pwr_down_b'=0 (the power down bit=1), then the output of INV_1 is 1, which turns PMOS transistor p8' off, turns NMOS transistor n8' on, and hence NMOS transistor n2' is turned off. INV_2 connected to INV_1 inverts the signal again to 0, which turns PMOS transistor p9' on and pulls out_p' to 1 or Vdd. Thus powering down turns off the converter circuit 1710 and freezes the output clock high.

An exemplary embodiment of the present invention has been described which includes an FPGA with a clock tree to supply global clock signals to the FPGA. The clock tree includes a vertical backbone and a plurality of horizontal rows, carrying one or more global differential signals to the programmable elements of the FPGA, where at least some of the programmable elements use a single ended clock. The vertical backbone is connected to the plurality of horizontal rows via fully connected crossbar switches. Differential are sent to the backbone via clock specialized 10B circuits (clock IOBs receive external clocks), DCM circuits, MGT circuits, or from the FPGA's programmable fabric. The clock signals coming from the clock 10B and DCM circuits travel a path parallel to the backbone via a series of cascaded fully connected crossbar switches to a BUFG_MUX circuit.

The BUFG_MUX circuit has a plurality of multiplexers that allow global clock signals to be feed to the backbone as well as being looped backed.

Although the invention has been described in connection with several embodiments, it is understood that this invention is not limited to the embodiments disclosed, but is capable of various modifications, which would be apparent to one of ordinary skill in the art. For example, although an clock tree is described, it should be understood that this is for illustration purposes and other embodiments may include other balanced or unbalanced clock tree geometries. In addition, although an embodiment for a hybrid clock tree on a PLD or more specifically an FPGA is given, other embodiments include a hybrid clock tree on any integrated circuit. Further, the terms horizontal and vertical are interchangeable and similarly, the term rows and columns are also interchangeable. Thus, the invention is limited only by the following claims.

What is claimed is:

1. A system in an integrated circuit (IC) for distributing a small signal differential signal to a circuit element via a differential multiplexer that uses a two phase full complementary metal oxide semiconductor (CMOS) differential signal, the system comprising:
    a first converter configured to convert a first small signal differential signal to a first two phase full CMOS differential signal for input into the differential multiplexer; and
    a programmable driver circuit configured to boost an output current of the programmable driver circuit at selected frequencies and to convert a two phase full CMOS differential signal output of the differential multiplexer to a second small signal differential signal.

2. The system of claim 1 further comprising a second converter configured to convert the second small signal differential signal to a two phase full CMOS single ended signal for use by the circuit element.

3. The system of claim 2 wherein the second converter has a power down circuit for substantially turning off the second converter.

4. The system of claim 3 wherein the power down circuit sets the two phase full CMOS single ended signal high.

5. The system of claim 1 wherein the first converter has a power down circuit for substantially turning off the first converter.

6. The system of claim 5 wherein the power down circuit sets outputs of the first two phase full CMOS differential signal low.

7. The system of claim 1 wherein the programmable driver circuit comprises:
    a rail-to-rail differential input of the programmable driver circuit coupled to a first driver, having a first programmable current source, and to a variable delay circuit;
    a second driver, having a second programmable current source, coupled to the variable delay circuit; and
    a small signal differential output of the programmable driver circuit produced by adding a differential output of the first driver to a differential output of the second driver.

8. The system of claim 7 wherein the programmable driver further comprises:
    a pulse generator receiving the rail-to-rail differential input of the programmable driver circuit and a differential output of the variable delay circuit; and
    a third driver coupled to the pulse generator wherein the small signal differential output of the programmable driver circuit is further produced by further adding the differential output of the third driver to the adding of the differential output of the first driver to the differential output of the second driver.

9. The system of claim 7 wherein the programmable driver further comprises a variable resistive element coupled across the small signal differential output of the programmable driver circuit.

10. A clock distribution network in a program logic device (PLD) comprising:
    a first clock signal line having a first small signal differential clock signal;
    a converter circuit configured to convert the first small signal differential clock signal to a first rail-to-rail differential clock signal;
    a differential multiplexer inputting the first rail-to-rail differential clock signal and outputting a second rail-to-rail differential clock signal; and
    a programmable driver configured to convert the second rail-to-rail differential clock signal to a second small signal differential clock signal.

11. The clock distribution network of claim 10 further comprising a second converter circuit configured to convert the second small signal differential clock signal to a third rail-to-rail differential clock signal for use by a circuit element of the PLD.

12. The clock distribution network of claim 10 further comprising a second converter circuit configured to convert the second small signal differential clock signal to a rail-to-rail single ended clock signal for use by a circuit element of the PLD.

13. The clock distribution network of claim 10 wherein the programmable driver is further configured to boost an output current of the programmable driver at predetermined frequencies.

14. A clock distribution network in an integrated circuit, the clock distribution network comprising:
    a backbone signal line configured to provide a small signal differential clock signal;
    a plurality of branch signal lines coupled to the backbone signal line for distributing the small signal differential clock signal to a plurality of circuit elements on the integrated circuit;
    a digital multiplexer coupling the backbone signal line to a branch signal line of the plurality of branch signal lines;
    a converter circuit configured to convert the small signal differential clock signal to a rail-to-rail differential clock signal for input to the digital multiplexer; and
    a driver circuit configured to convert a rail-to-rail differential clock signal output of the digital multiplexer to the small signal differential clock signal for distribution to the plurality of circuit elements.

15. The clock distribution network of claim 14, further comprising:
    a first leaf node coupled to a second branch signal line of the plurality of branch signal lines, the first leaf node configured to provide a rail-to-rail single ended clock based on the small signal differential clock signal to a first circuit element of the plurality of circuit elements; and
    a second leaf node coupled to a third branch signal line of the plurality of branch signal lines, the second leaf node configured to provide the small signal differential clock signal to a second element of the plurality of programmable function elements.

16. The clock distribution network of claim 15 further comprising, a third leaf node coupled to the third branch, the third leaf node configured to provide the small signal differential clock signal to the second element.

17. The clock distribution network of claim 14 further comprising:
 a clock input block configured to produce an external rail-to-rail differential clock signal;
 a first multiplexer connected to the clock input block;
 a second multiplexer connected to the first multiplexer for selecting the external rail-to-rail differential clock signal or another rail-to-rail differential clock signal; and
 a second driver configured to convert a rail-to-rail differential clock signal output of the second multiplexer to an input small signal differential clock signal for use by the backbone signal line.

18. The clock distribution network of claim 17 wherein the another rail-to-rail differential clock signal is provided by a Digital Clock Manager (DCM) circuit.

19. A clock distribution network in an integrated circuit (IC) comprising:
 means for sending a small signal differential global clock signal down at least part of a vertical spine of the IC;
 one or more multiplexers having rail-to-rail differential signal inputs and outputs coupling the means for sending to a plurality of horizontal small signal differential clock lines;
 means for converting the small signal differential global clock signal for input into the one or more multiplexers;
 means for converting the output of the one or more multiplexers to another small signal differential global clock signal; and
 means for transferring the another small signal differential global clock signal to a circuit of the IC having a programmable function and using a rail-to-rail differential clock signal.

20. The clock distribution network of claim 19 further comprising means for receiving the small signal differential global clock signal from an external source.

* * * * *